(12) United States Patent
Wang et al.

(10) Patent No.: US 11,968,838 B2
(45) Date of Patent: Apr. 23, 2024

(54) AIR GAPS IN MEMORY ARRAY STRUCTURES

(71) Applicant: Taiwan Semiconductor Manufacturing Co., Ltd., Hsinchu (TW)

(72) Inventors: Sheng-Chen Wang, Hsinchu (TW); Kai-Hsuan Lee, Hsinchu (TW); Sai-Hooi Yeong, Zhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 256 days.

(21) Appl. No.: 17/460,569

(22) Filed: Aug. 30, 2021

(65) Prior Publication Data

US 2023/0067455 A1  Mar. 2, 2023

(51) Int. Cl.
*H10B 51/20* (2023.01)
*H01L 29/06* (2006.01)
*H01L 29/78* (2006.01)
*H10B 51/10* (2023.01)

(52) U.S. Cl.
CPC ......... *H10B 51/20* (2023.02); *H01L 29/0649* (2013.01); *H01L 29/78391* (2014.09); *H10B 51/10* (2023.02)

(58) Field of Classification Search
CPC ........ H10B 51/00; H10B 51/10; H10B 51/20; H01L 29/0649; H01L 29/78391
See application file for complete search history.

(56) References Cited

U.S. PATENT DOCUMENTS

| | | | |
|---|---|---|---|
| 9,401,371 B1* | 7/2016 | Lee ................. | H10B 43/27 |
| 2013/0032873 A1* | 2/2013 | Kiyotoshi .......... | H10B 43/27 |
| | | | 257/E21.21 |
| 2022/0285385 A1* | 9/2022 | Lai .................. | H01L 21/764 |
| 2023/0014998 A1* | 1/2023 | Ju .................... | H01L 29/66742 |

FOREIGN PATENT DOCUMENTS

| | | | | |
|---|---|---|---|---|
| CN | 111769116 A | * | 10/2020 | ........ H01L 27/11568 |
| TW | 1706548 B | * | 10/2020 | ............. H01L 43/27 |
| WO | WO-2012052298 A1 | * | 4/2012 | ........... H01L 21/764 |

* cited by examiner

*Primary Examiner* — Matthew E Warren
(74) *Attorney, Agent, or Firm* — Slater Matsil, LLP

(57) ABSTRACT

A device includes a semiconductor substrate; a word line extending over the semiconductor substrate; a memory film extending along the word line, wherein the memory film contacts the word line; a channel layer extending along the memory film, wherein the memory film is between the channel layer and the word line; source lines extending along the memory film, wherein the memory film is between the source lines and the word line; bit lines extending along the memory film, wherein the memory film is between the bit lines and the word line; and isolation regions, wherein each isolation region is between a source line and a bit line, wherein each of the isolation regions includes an air gap and a seal extending over the air gap.

20 Claims, 53 Drawing Sheets

11,968,838 B2

AIR GAPS IN MEMORY ARRAY STRUCTURES

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
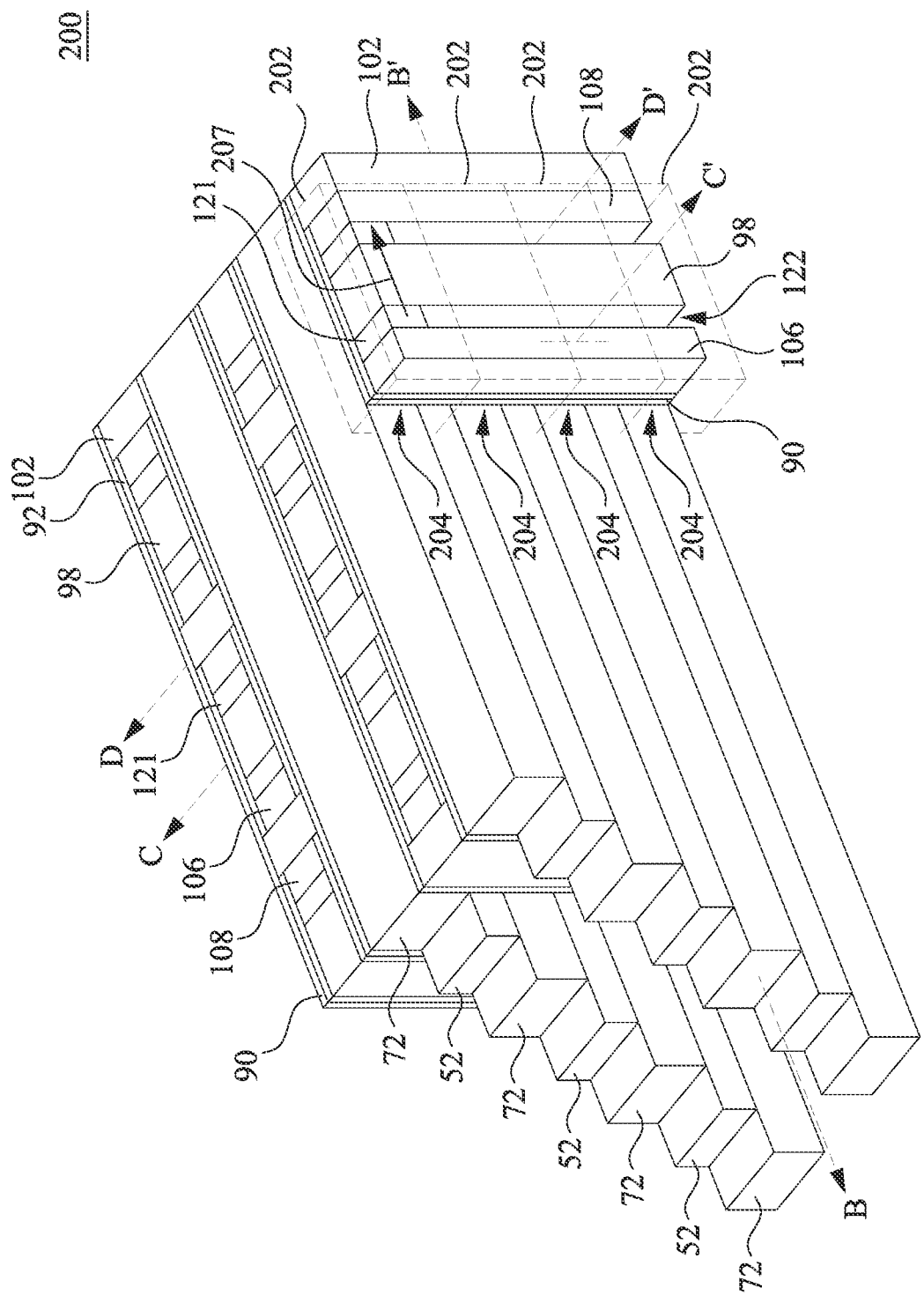
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes a transistor having a word line region acting as a gate electrode, a bit line region acting as a first source/drain electrode, and a source line region acting as a second source/drain electrode. The transistor may be, for example, a thin film transistor (TFT). Each transistor further includes an insulating memory film (e.g., as a gate dielectric) and an oxide semiconductor (OS) channel region. In some embodiments, isolation regions between bit line regions and source line regions are formed as air gaps. By separating the bit lines and source lines with air gaps, capacitance between the bit lines and source lines can be reduced. The air gaps may be formed, for example, by forming a trench between source lines and bit lines, and then depositing an insulating material that seals the top of the trench. An implantation process may be performed to expand the insulating material, in some embodiments. Forming air gaps in this manner can reduce the effects of parasitic capacitance between bit lines and source lines, which can allow for higher-frequency operation of the TFTs, improved device performance, and improved device efficiency.

Figure 1B:
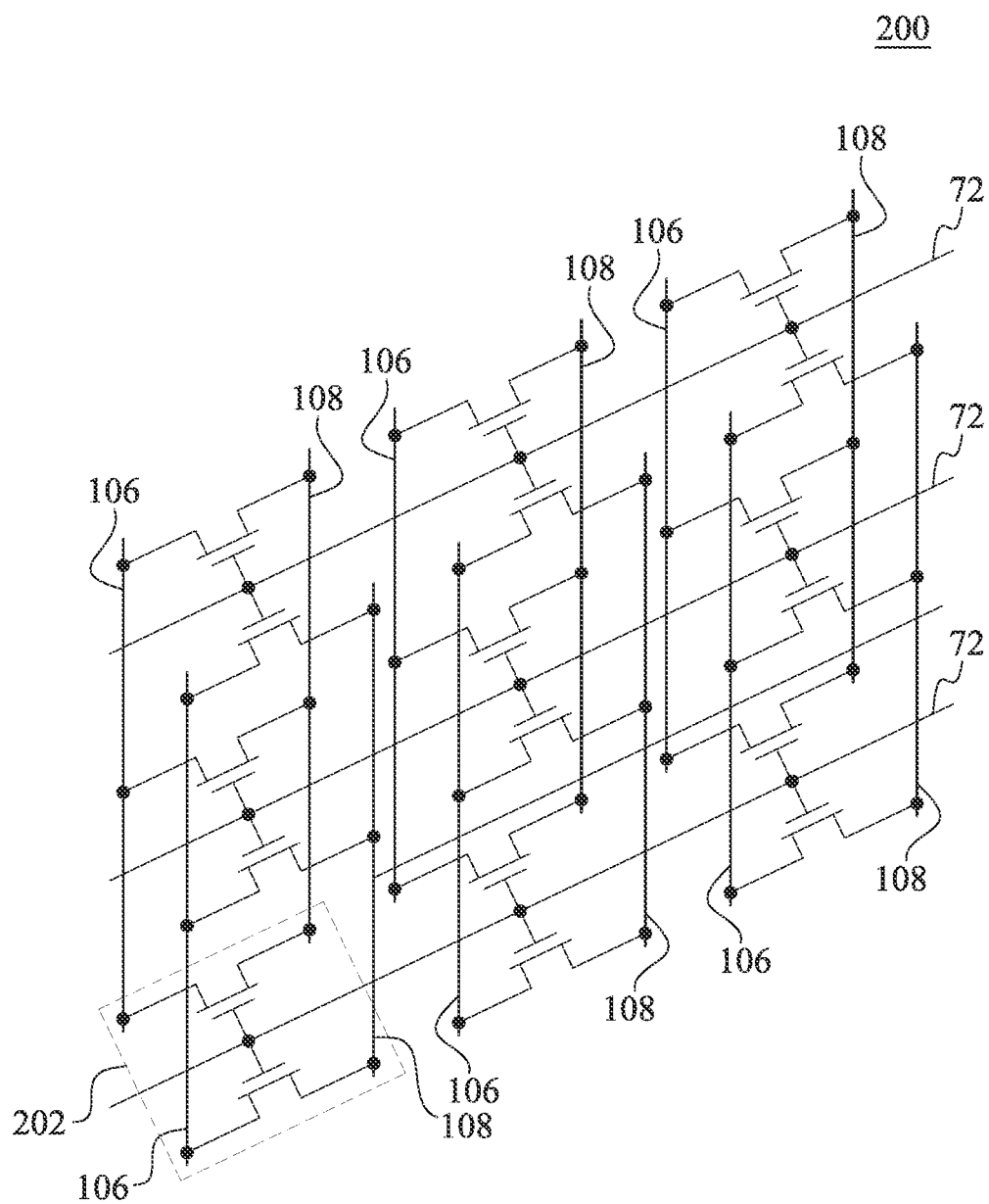
Figure 1C:
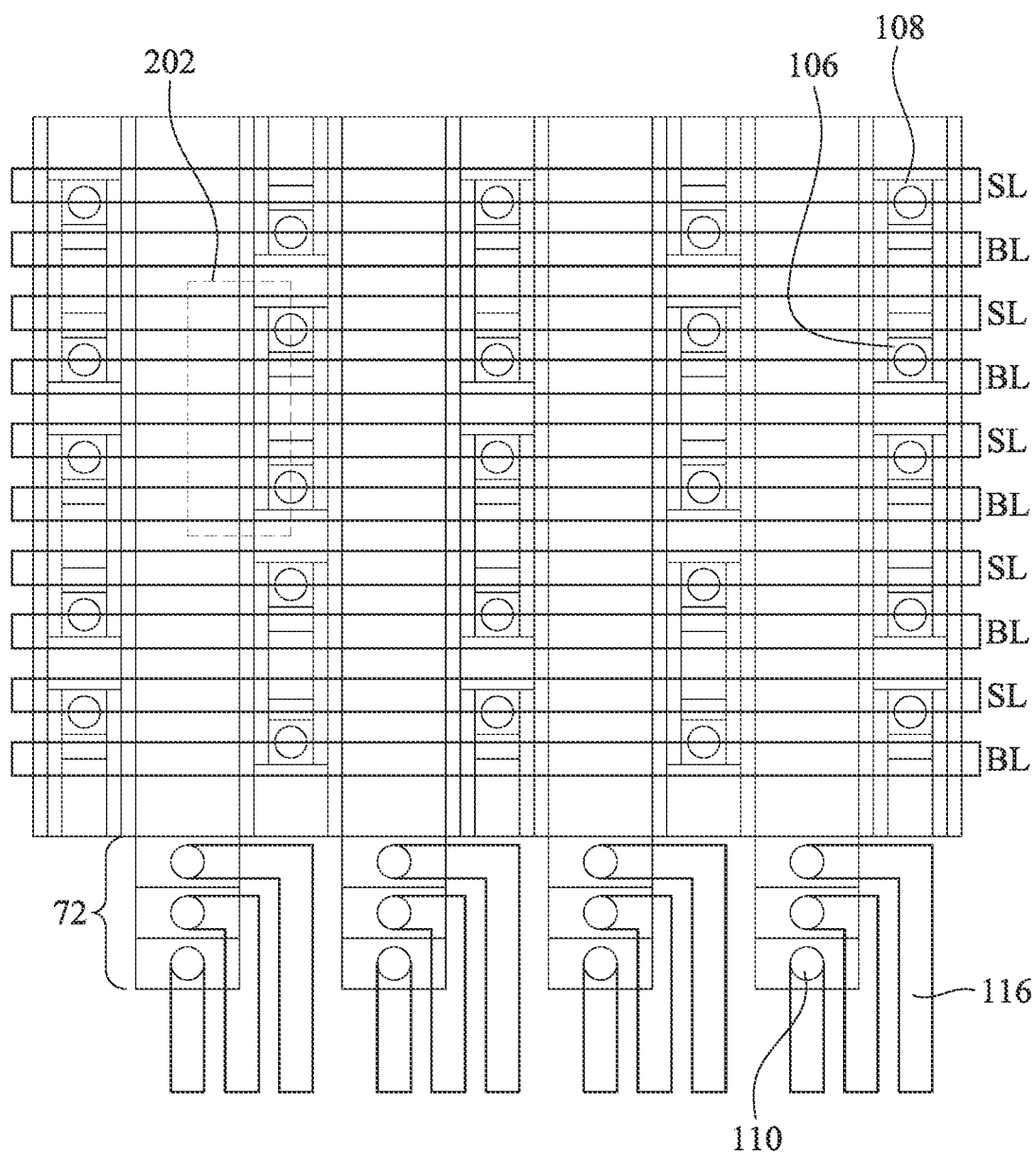

FIGS. 1A, 1B, and 1C illustrate examples of a memory array 200, in accordance with some embodiments. The memory array 200 includes air gaps 122 formed between bit lines 106 and source lines 108, described in greater detail below. FIG. 1A illustrates an example of a portion of the memory array 200 in a three-dimensional view; FIG. 1B illustrates a circuit diagram of the memory array 200; and FIG. 1C illustrates a top down view (e.g., a plan view) of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as above one or more active devices (e.g., transistors or the like) formed on a semiconductor substrate.

In some embodiments, the memory array 200 is a flash memory array, such as a NOR flash memory array, a thin film transistor (TFT) memory array, or the like. Each memory cell 202 may include a transistor 204 with an insulating memory film 90 as a gate dielectric. In some embodiments, a gate of each transistor 204 is electrically coupled to a respective word line (e.g., conductive line 72), a first source/drain region of each transistor 204 is electrically coupled to a respective bit line (e.g., conductive line 106), and a second source/drain region of each transistor 204 is electrically coupled to a respective source line (e.g., conductive line 108), which electrically couples the second source/drain region to ground. The memory cells 202 in a same horizontal row of the memory array 200 may share a common word line (e.g., 72), while the memory cells 202 in a same vertical column of the memory array 200 may share a common source line (e.g., 108) and a common bit line (e.g., 106).

The memory array 200 includes a plurality of vertically stacked conductive lines 72 (e.g., word lines). The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, as shown in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72 (see, for example, FIGS. 30A-D).

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each memory cell 202. In some embodiments, air gaps 122 are disposed between adjacent conductive lines 106 and conductive lines 108, which isolate and separate the conductive lines 106 and the conductive lines 108. The air gaps 122 of the memory array 200 may be formed between conductive lines 106/108 and adjacent dielectric material 98, in some embodiments. The air gaps 122 may be sealed by seals 121 formed of a dielectric material. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 207). Accordingly, the OS layer 92 may be considered a channel layer in some cases.

A memory film 90 is disposed between the conductive lines 72 and the OS layer 92, and the memory film 90 may provide gate dielectrics for the transistors 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a Ferroelectric Random Access Memory (FeRAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding transistor 204 varies, and a digital value (e.g., 0 or 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift may improve the efficiency of reading the digital value stored in the corresponding memory cell 202, and may reduce the chance of erroneous readings.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding transistor 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line). Depending on the polarization direction of the corresponding region of the memory film 90, the transistor 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Reference Cross-section B-B' is along a longitudinal axis of conductive lines 72 and in a direction, for example, parallel to the direction of current flow of the TFTs 204. Reference cross-section C-C' is perpendicular to cross-section B-B' and is parallel to a longitudinal axis of the conductive lines 72. Reference cross-section C-C' extends through the conductive lines 106 and/or the conductive lines 108. Reference cross-section D-D' is parallel to reference cross-section C-C' and extends through an air gap 122. Subsequent figures refer to these reference cross-sections for clarity.

Figure 2:
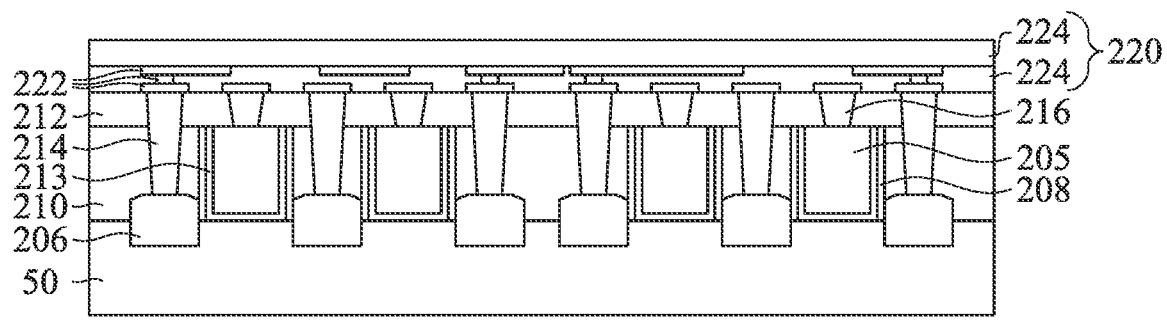
FIGS. 2, 3A, 3B, 4, 5, 6, 7, 8, 9, 10, 11, 12A, 12B, 13, 14A, 14B, 15, 16, 17A, 17B, 18A, 18B, 19A, 19B, 20, 21A, 21B, 21C, 22A, 22B, 22C, 23A, 23B, 23C, 24A, 24B, 24C, 25A, 25B, 25C, 26A, 26B, 26C, 27, 28, 29A, 29B, 29C, 30A, 30B, 30C, and 30D illustrate varying views of intermediate steps in the manufacture of a memory array, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant)

or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 213 over top surfaces of the substrate 50 and gate electrodes 205 over the gate dielectric layers 213. Source/drain regions 206 are disposed in the substrate 50 on opposite sides of the gate dielectric layers 213 and the gate electrodes 205. Gate spacers 208 are formed along sidewalls of the gate dielectric layers 213 and separate the source/drain regions 206 from the gate electrodes 205 by appropriate lateral distances. In some embodiments, the transistors may be planar field effect transistors (FETs), fin field effect transistors (FinFETs), nano-field effect transistors (nanoFETs), or the like.

A first ILD 210 surrounds and isolates the source/drain regions 206, the gate dielectric layers 21:3, and the gate electrodes 205 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
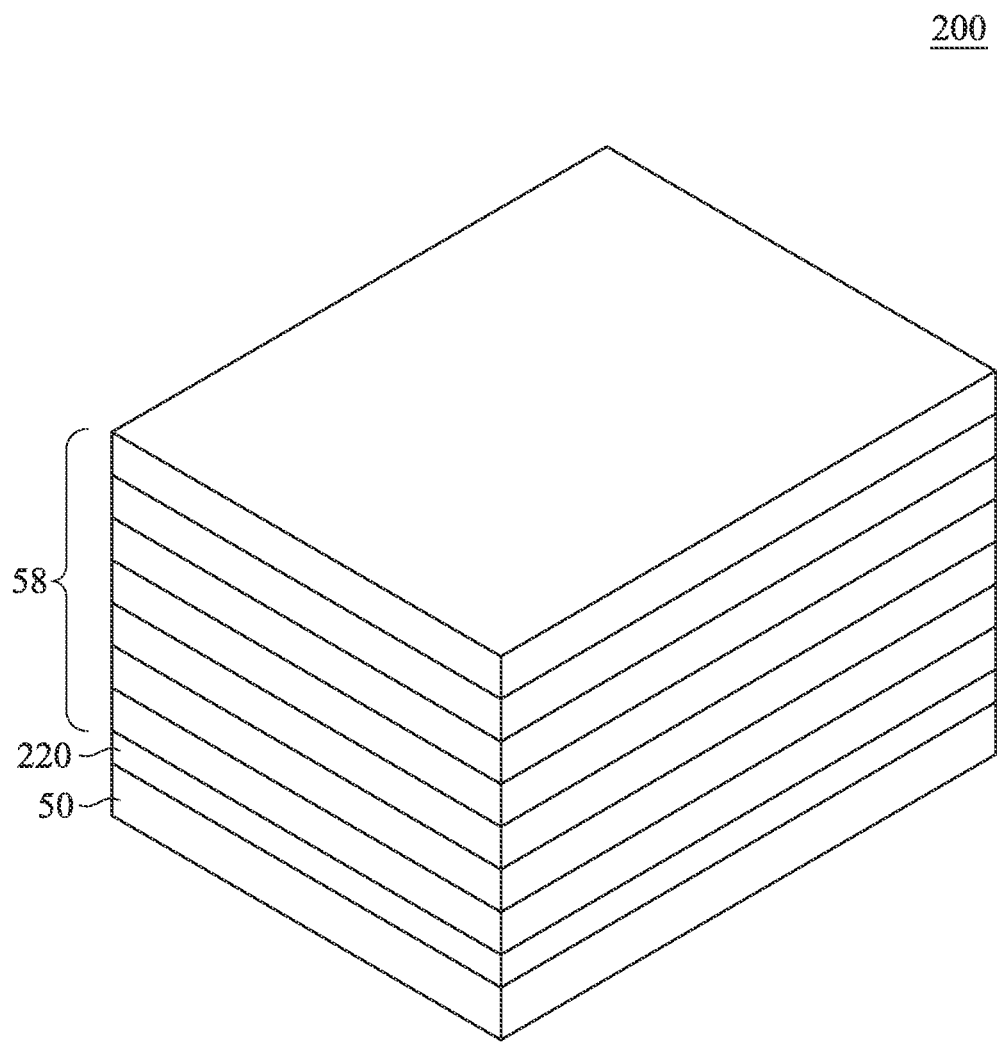
Figure 3B:
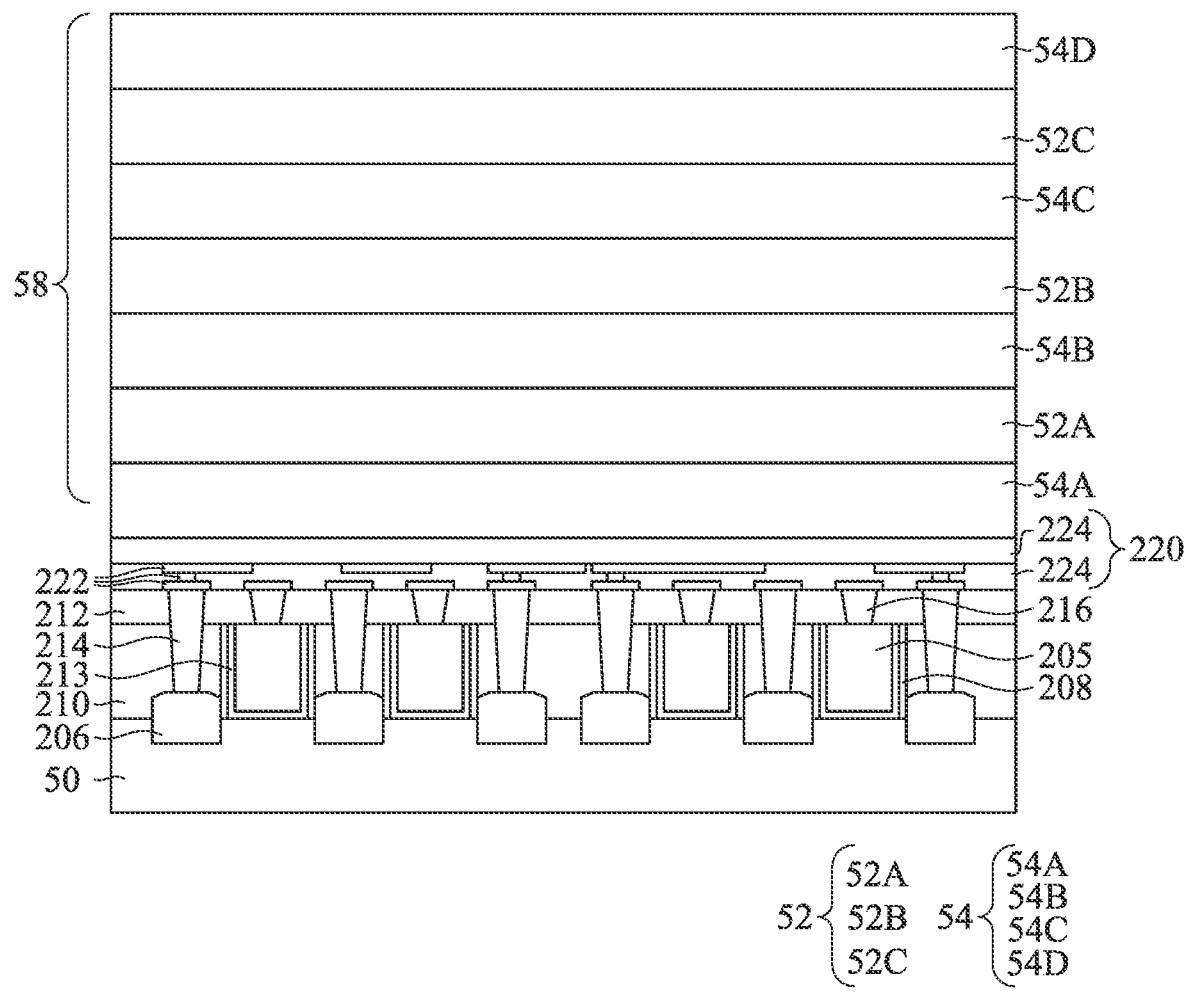

FIGS. 3A through 30D illustrate various views of intermediate steps in the manufacture of a memory array 200 similar to that shown in FIGS. 1A-C. Turning first to FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive lines 54A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

Figure 4:
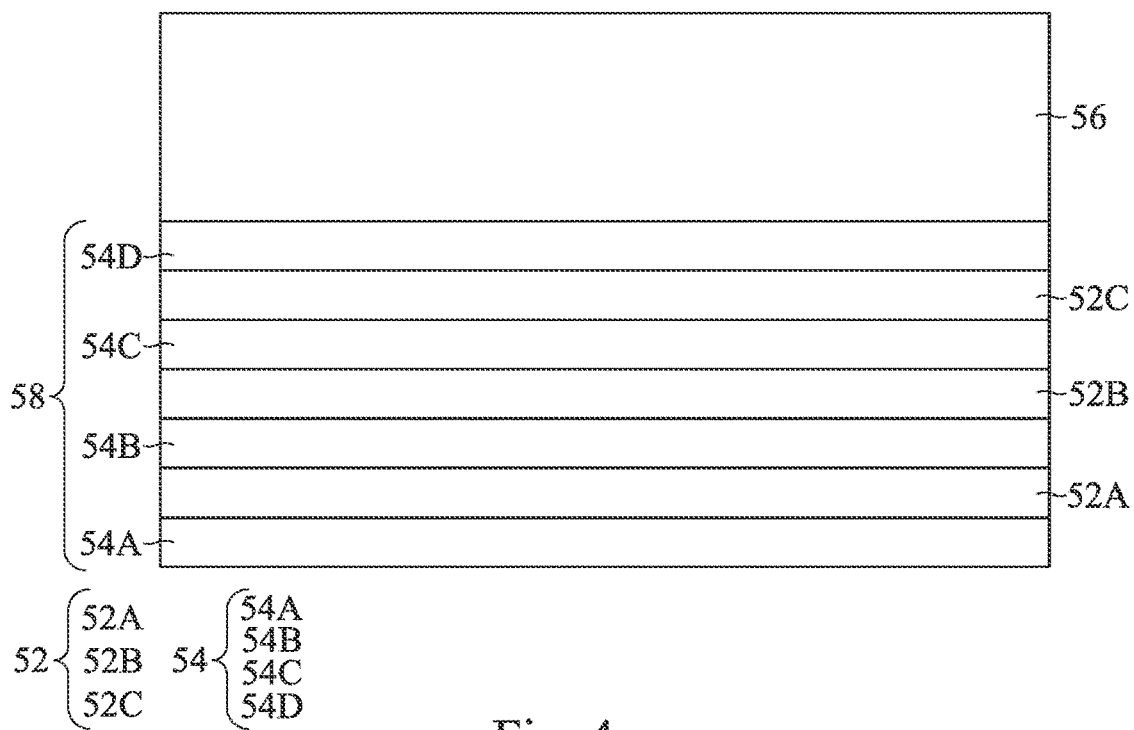

FIGS. 4 through 12B are views of intermediate stages in the manufacturing a staircase structure of the memory array 200, in accordance with some embodiments. FIGS. 4 through 11 and 12B are illustrated along reference cross-section B-B' illustrated in FIG. 1. FIG. 12A is illustrated in a three-dimensional view. In FIG. 4, a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed by using a spin-on technique.

Figure 5:
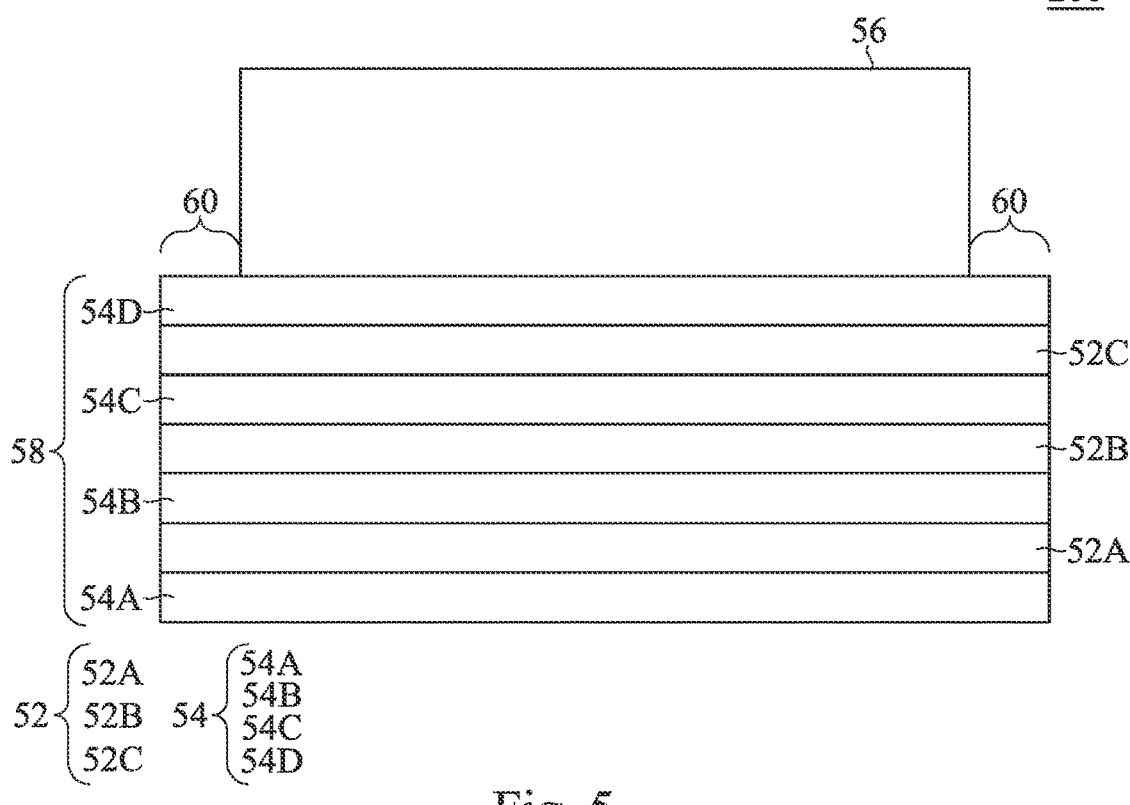

In FIG. 5, the photoresist 56 is patterned to expose the multi-layer stack 58 in regions 60 while masking remaining portions of the multi-layer stack 58. For example, a topmost layer of the multi-layer stack 58 (e.g., the conductive layer 54D) may be exposed in the regions 60. The photoresist 56 may be patterned using acceptable photolithography techniques.

Figure 6:
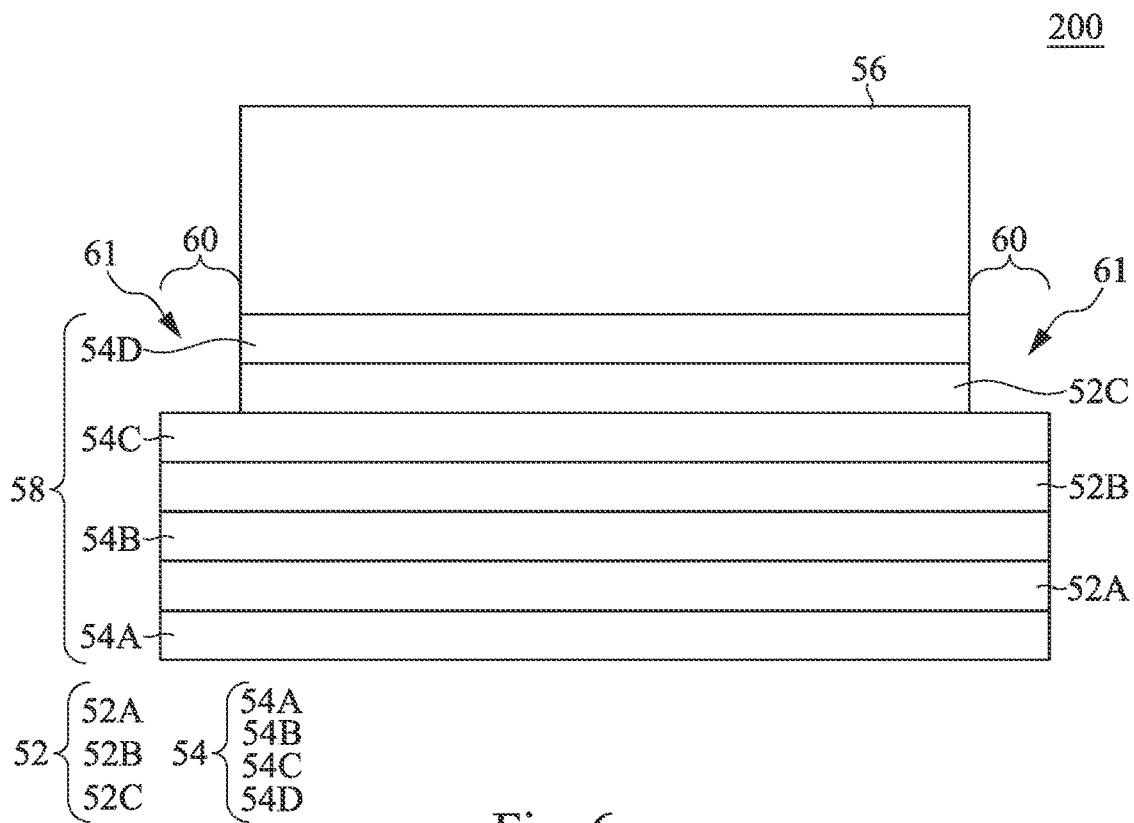

In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the conductive dielectric layer 52C and the conductive layer 54D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
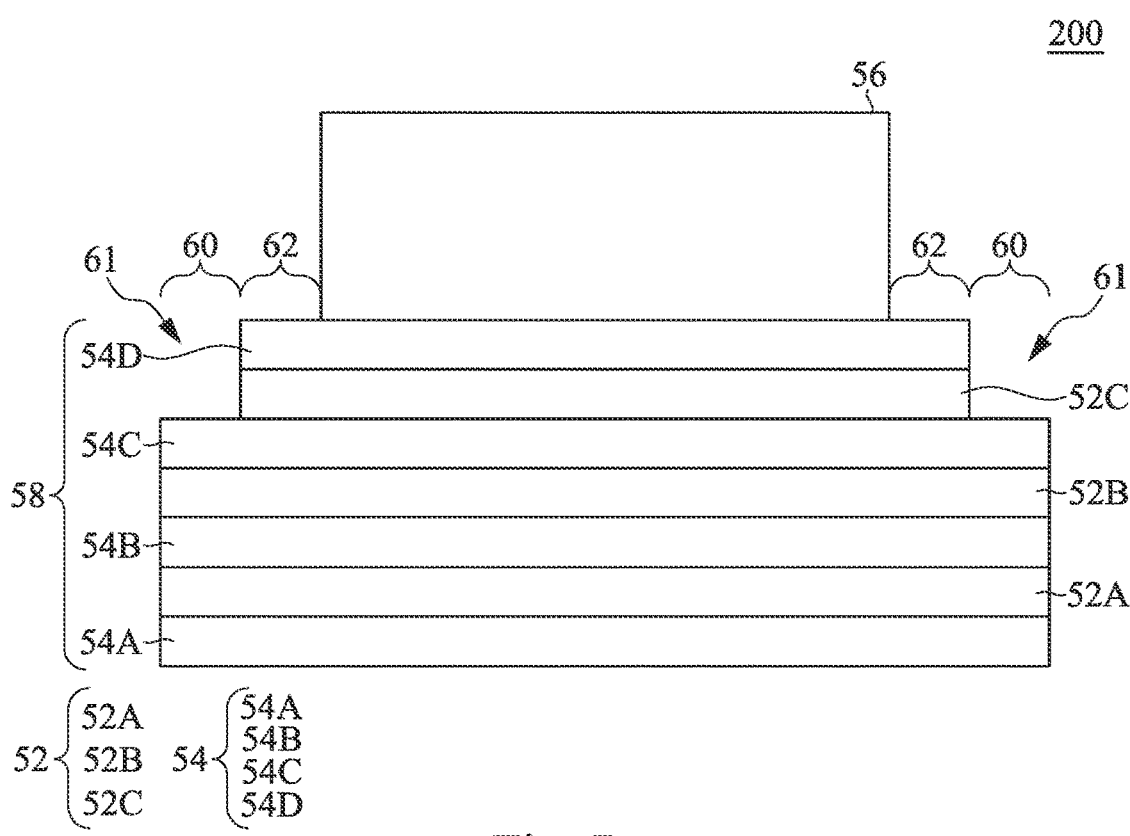

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions of the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
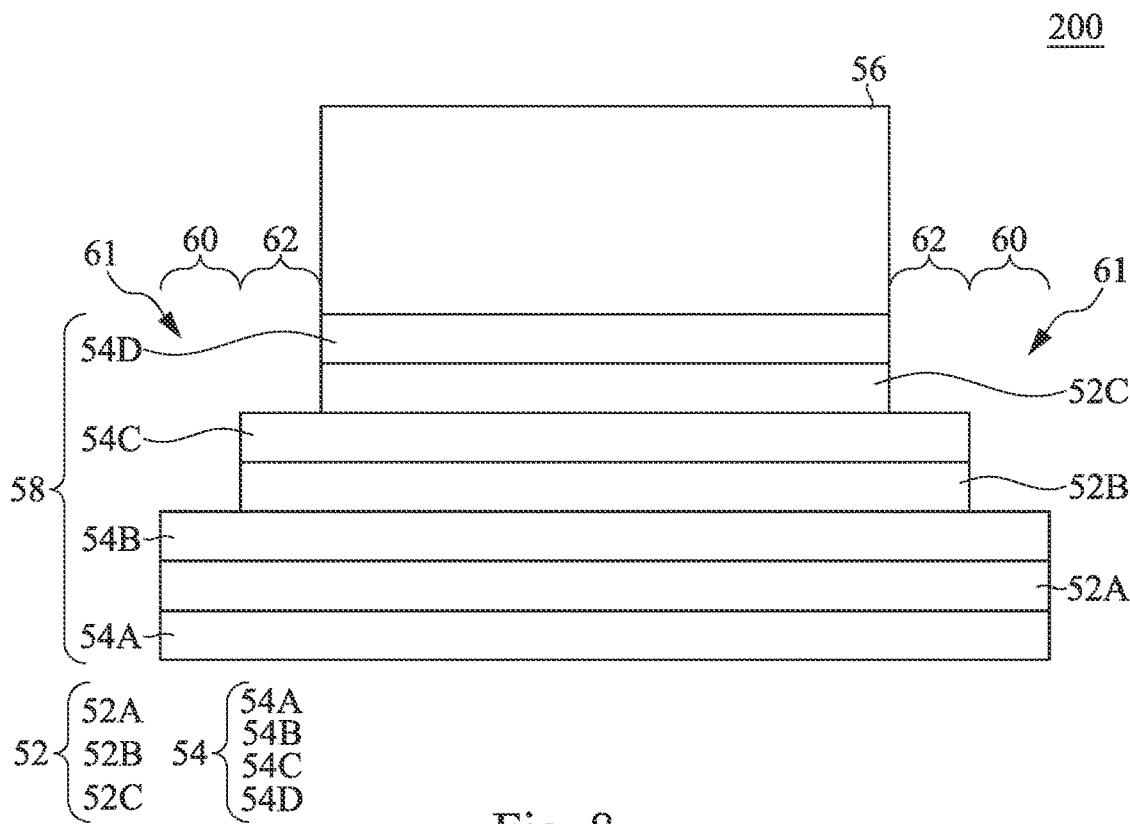

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
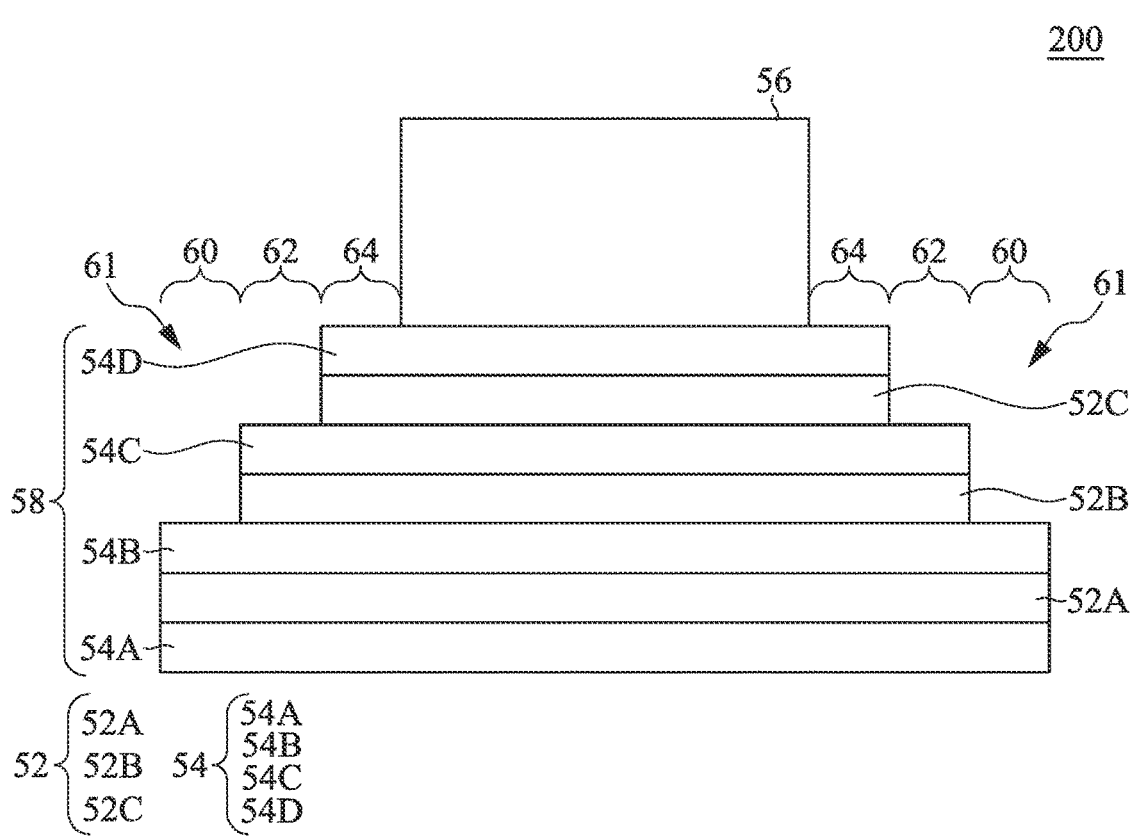

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 94D may be exposed in the regions 64.

Figure 10:
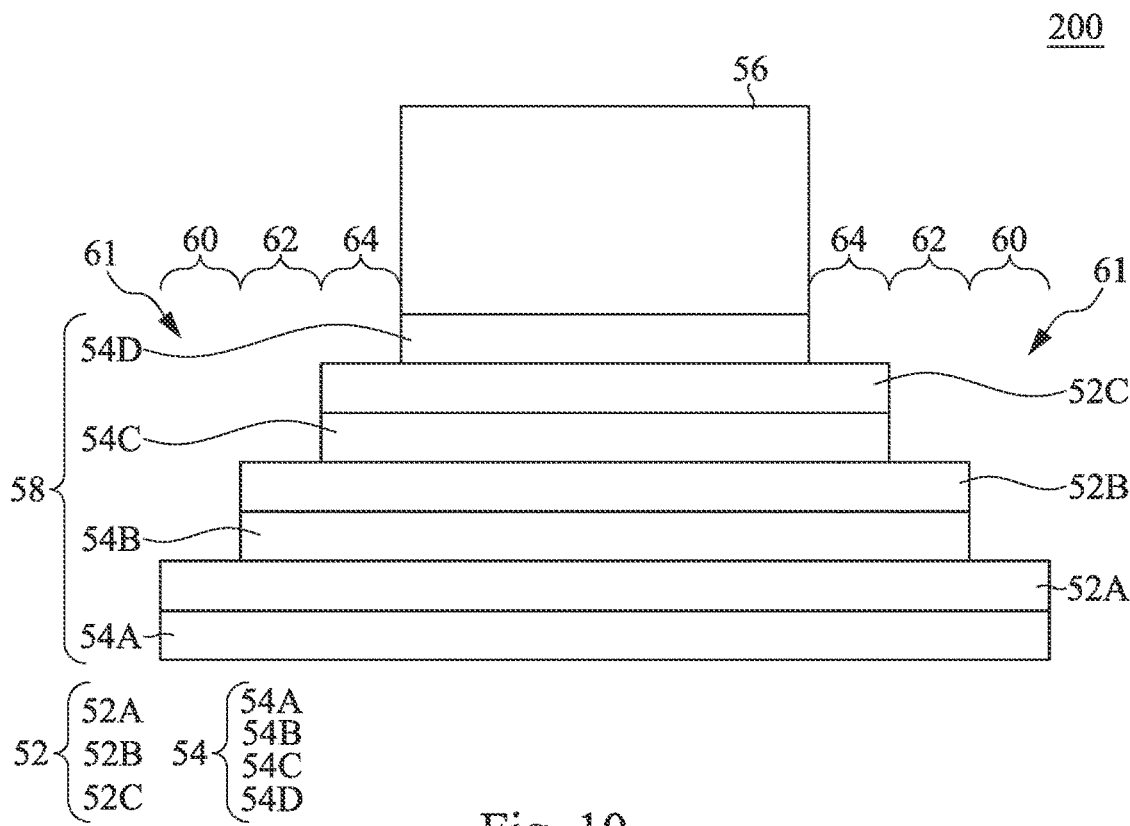

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

Figure 11:
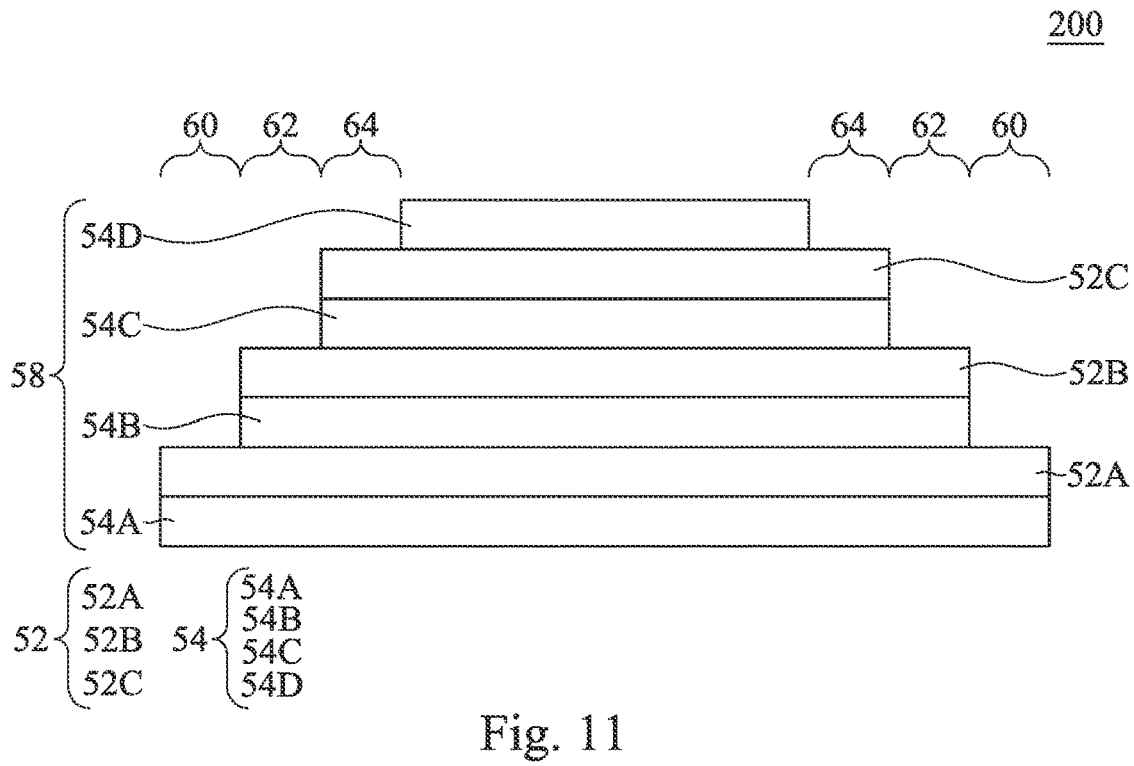

In FIG. 11, the photoresist 56 may be removed, such as by an acceptable ashing or wet strip process. Thus, a staircase structure is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure to each of the conductive layers 54 in subsequent processing steps.

Figure 12A:
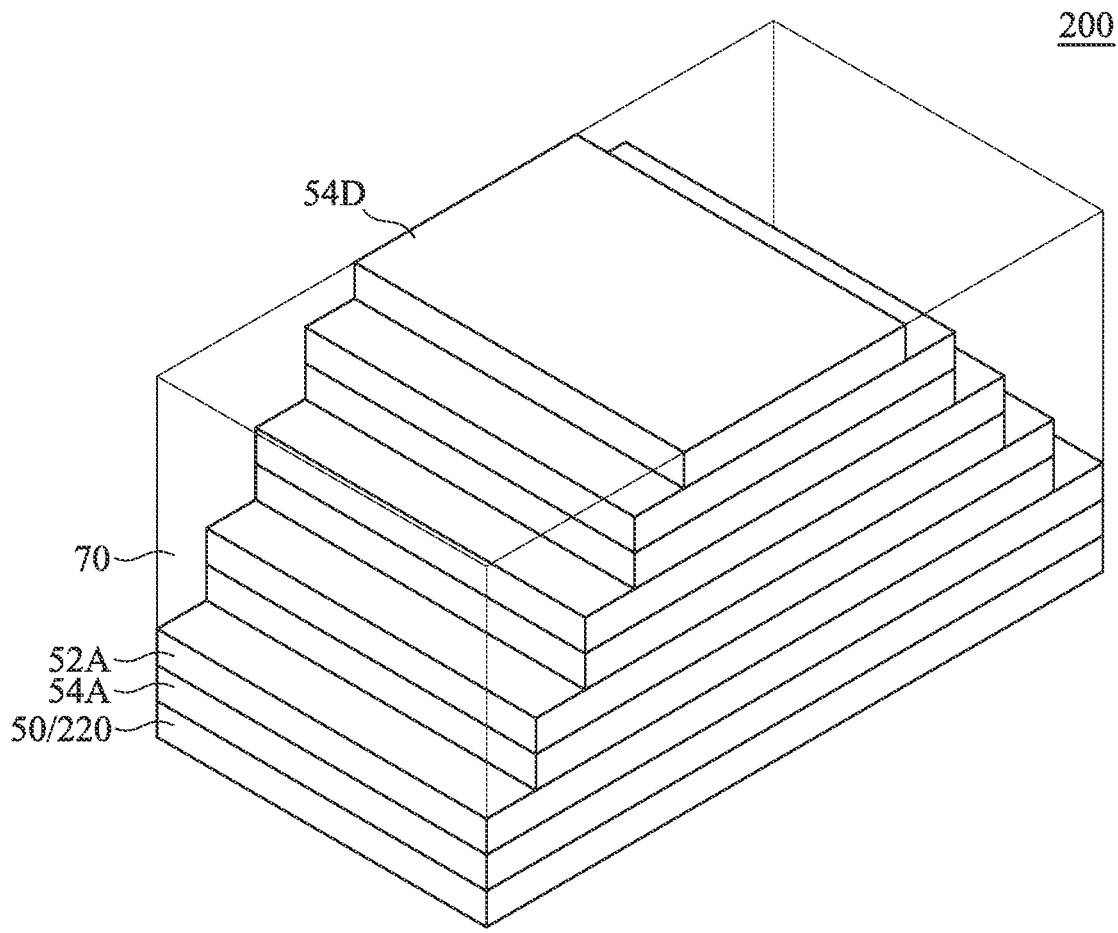
Figure 12B:
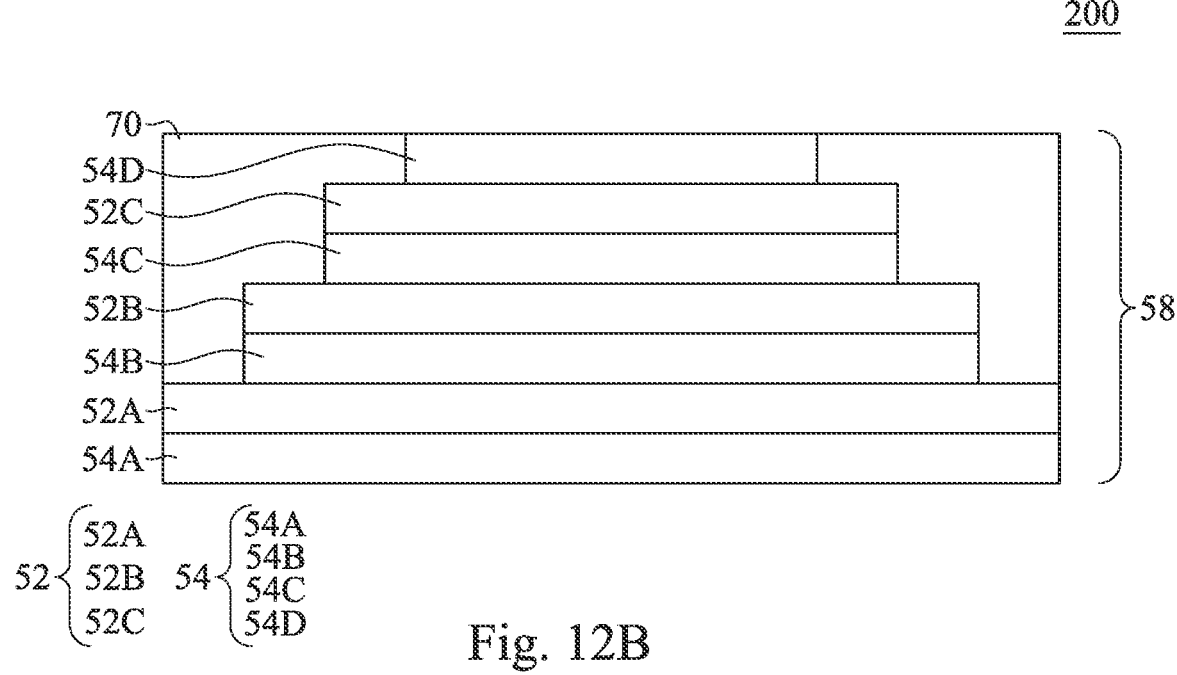

In FIGS. 12A and 12B, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIGS. 12A and 12B, a removal process may be performed to the IMD 70 to remove excess dielectric material over the multi-layer stack 58. In some embodiments, a planarization process such as a chemical mechanical polish (CMP), a grinding process, an etch-back process, combinations thereof, or the like may be utilized. The planarization process exposes the multi-layer stack 58 such that top surfaces of the multi-layer stack 58 and the IMD 70 are level after the planarization process is complete.

FIGS. 13 through 21C are views of intermediate stages in the manufacturing of the memory array 200, in accordance with some embodiments. In FIGS. 13 through 21C, the multi-layer stack 58 is formed and trenches 86 are formed in the multi-layer stack 58, thereby defining the conductive lines 72. The conductive lines 72 may correspond to word lines in the memory array 200, and the conductive lines 72 may further provide gate electrodes for the resulting transistors of the memory array 200. FIGS. 14A, 17A, 18A, 19A, and 21A are illustrated in a three-dimensional view. FIGS. 13, 14B, 15, 16, 17B, 18B, 19B, 20, and 21C are illustrated along reference cross-section C-C' illustrated in FIG. 1A. FIG. 21B is illustrated in a plan view.

Figure 13:
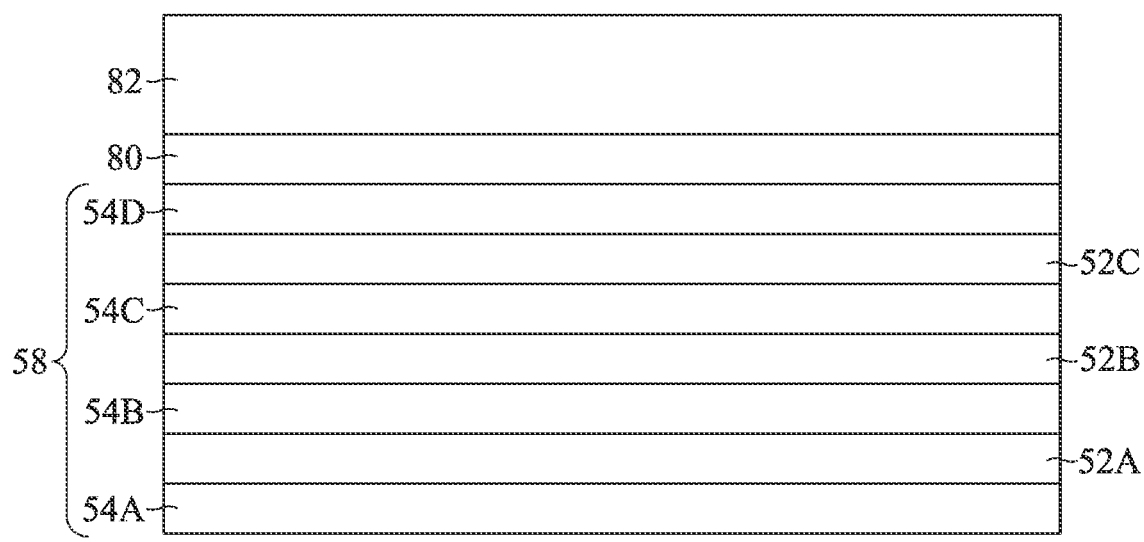

In FIG. 13, a hard mask 80 and a photoresist 82 are deposited over the multi-layer stack 58. The hard mask 80 may include, for example, silicon nitride, silicon oxynitride, or the like, which may be deposited by CVD, PVD, ALD, PECVD, or the like. The photoresist 82 can be formed by using a spin-on technique, for example.

Figure 14A:
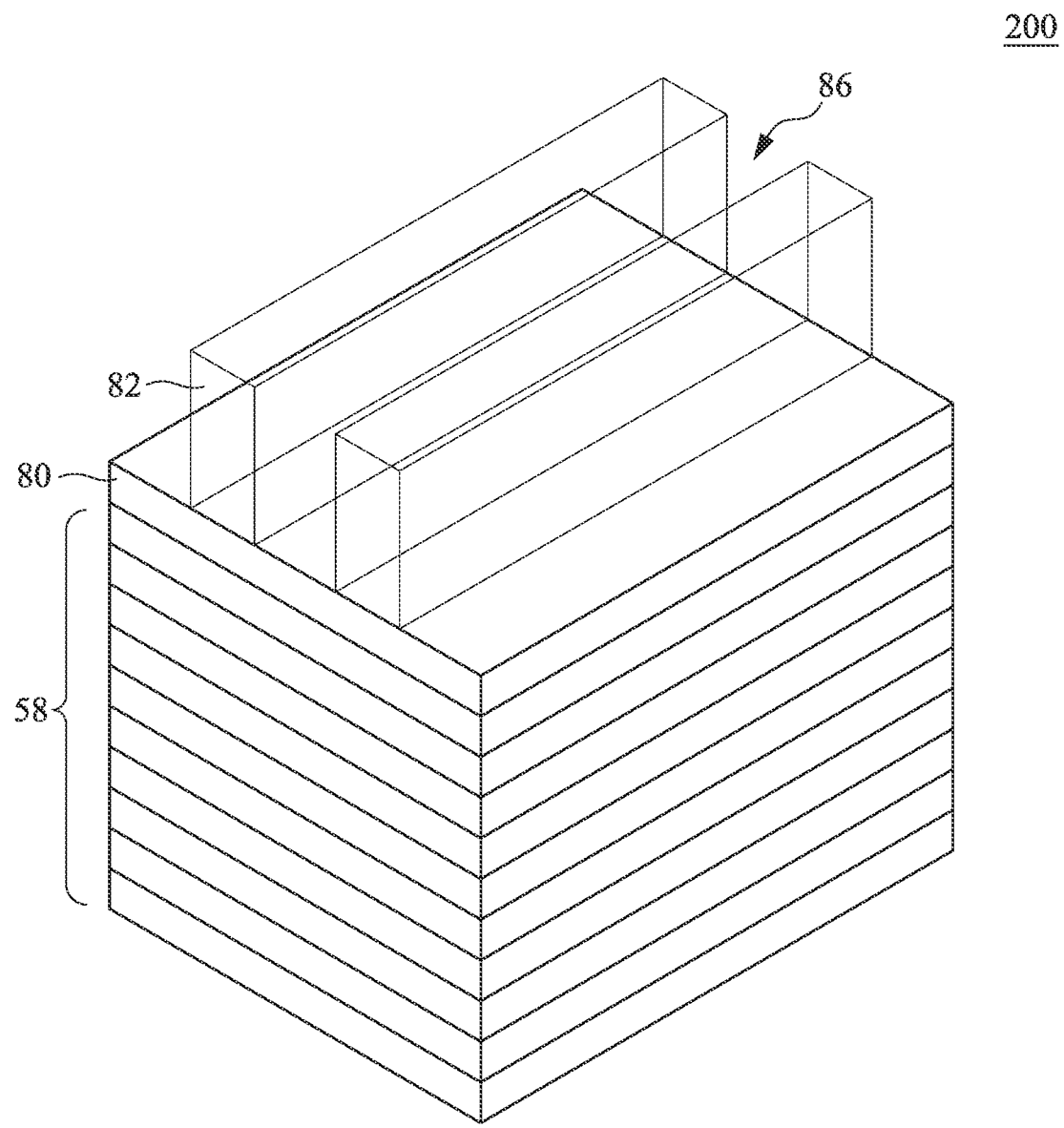
Figure 14B:
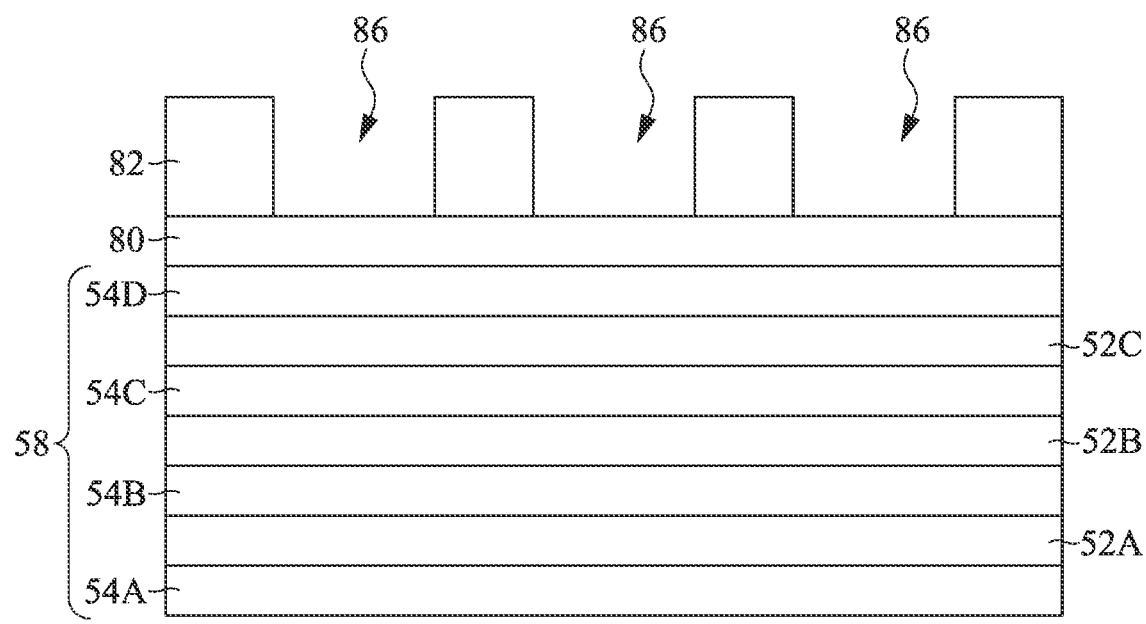

In FIGS. 14A and 14B, the photoresist 82 is patterned to form trenches 86. The photoresist 82 can be patterned using acceptable photolithography techniques. For example, the photoresist 82 be exposed to light for patterning. After the exposure process, the photoresist 82 may be developed to remove exposed or unexposed portions of the photoresist 82 depending on whether a negative or positive resist is used, thereby defining the pattern of the trenches 86.

Figure 15:
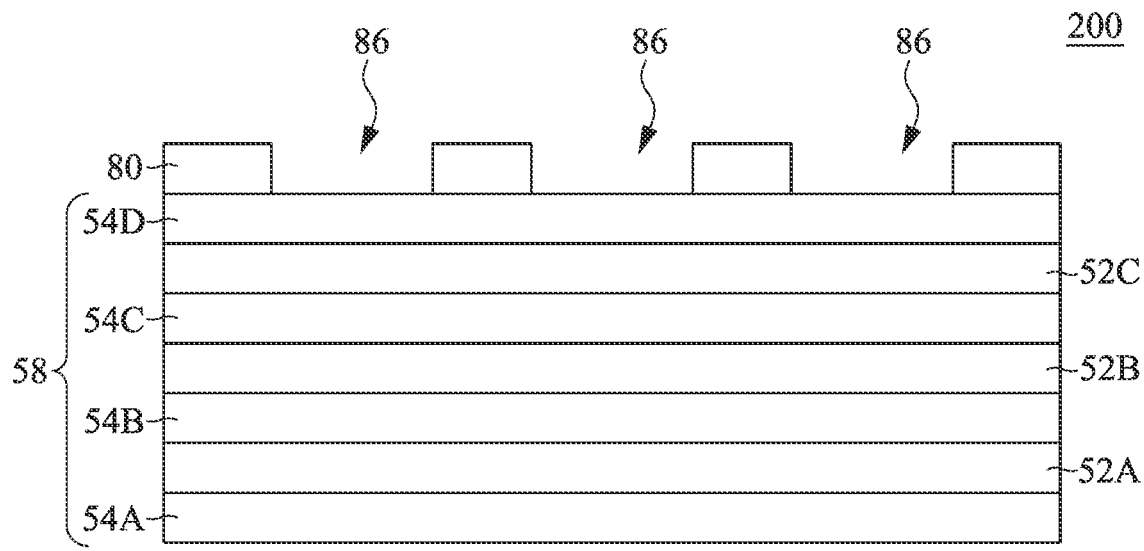

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
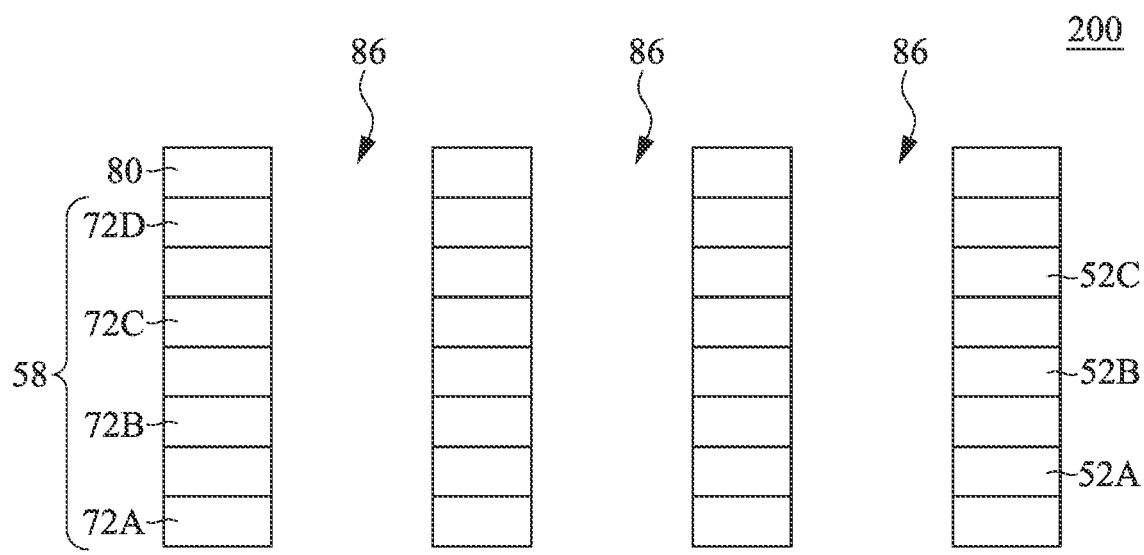
Figure 17A:
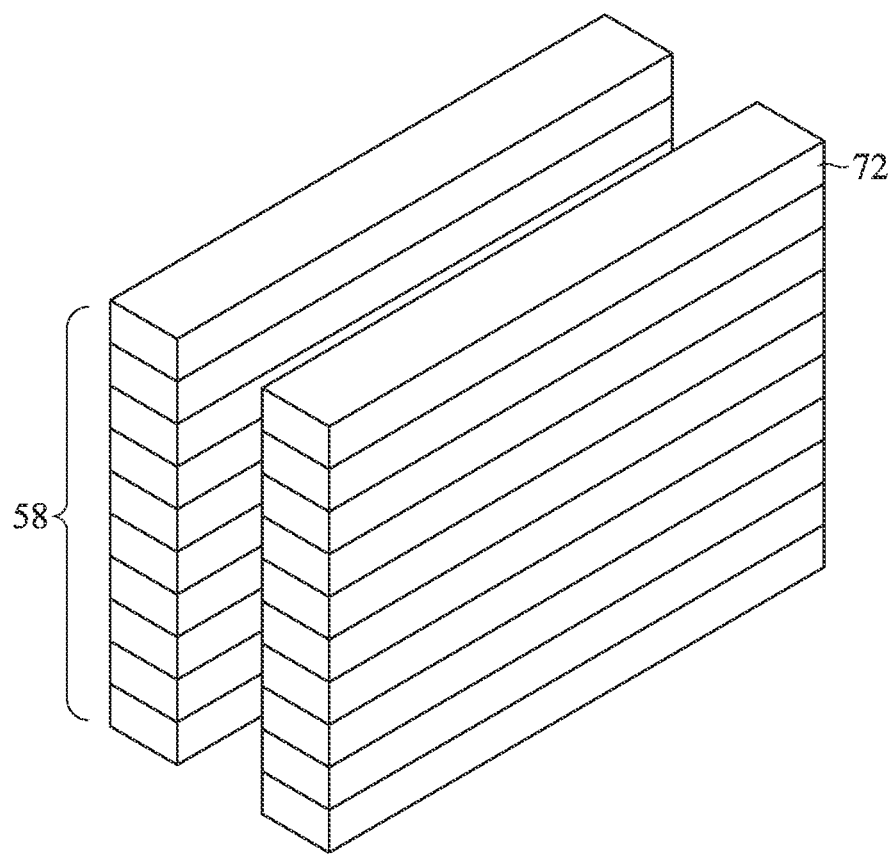
Figure 17B:
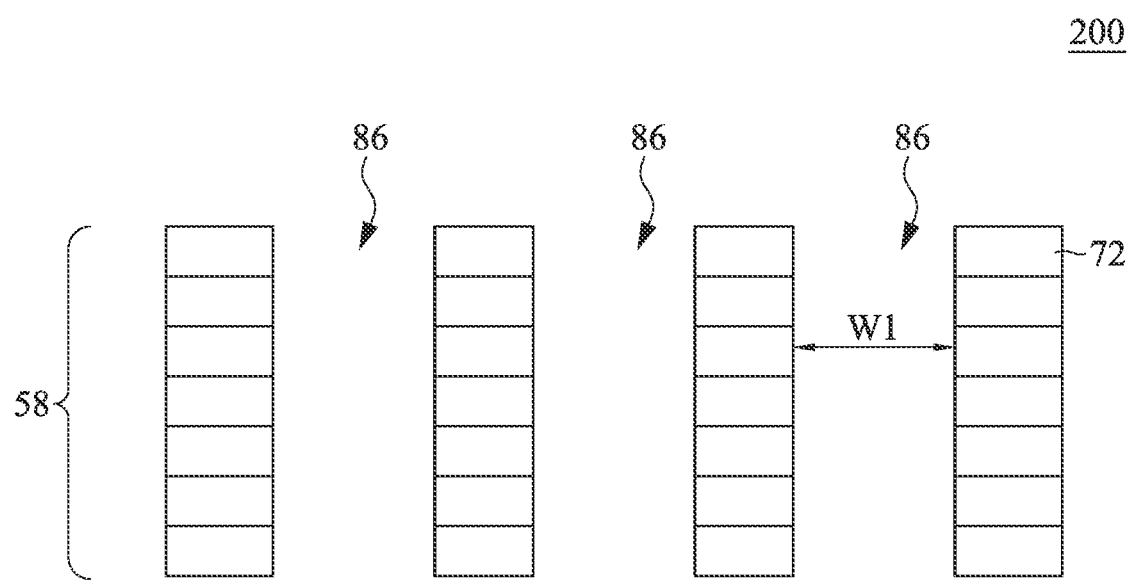

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIG. 12B), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D. In some embodiments, the trenches 86 may be formed having a width W1 that is in the range of about 50 nm to about 100 nm, though other widths are possible.

Figure 18A:
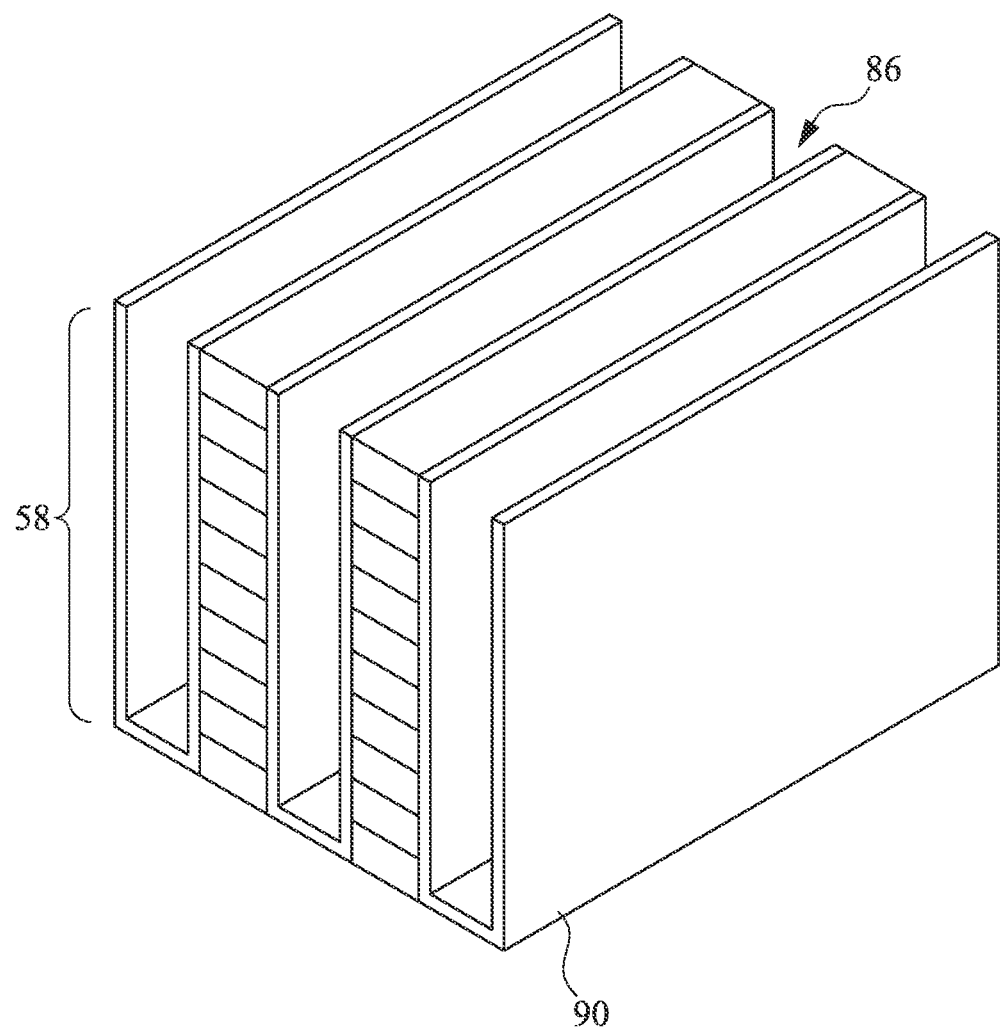
Figure 18B:
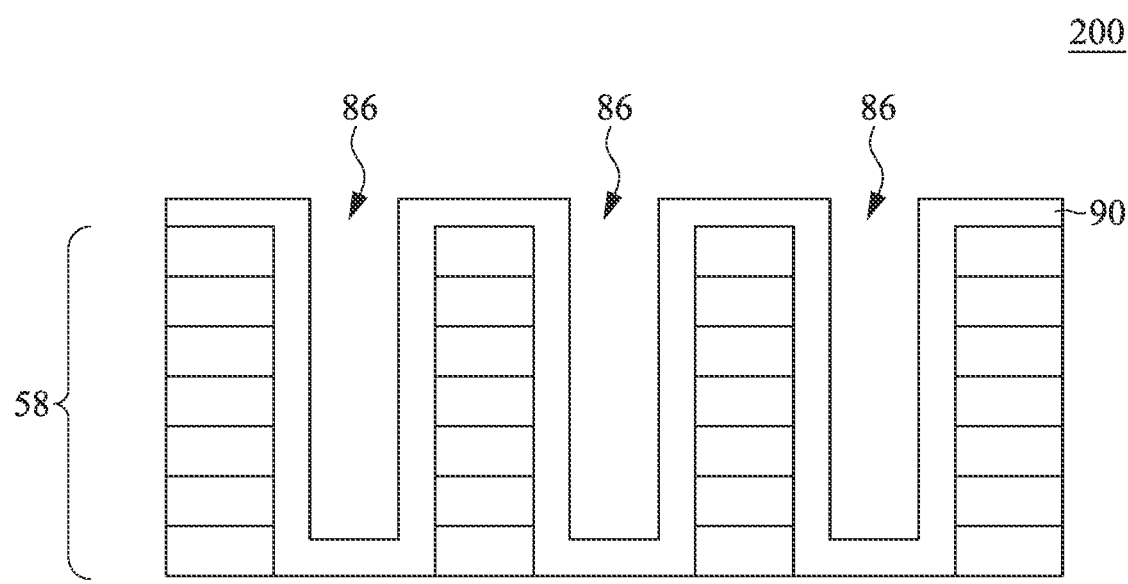

In FIGS. 18A and 18B, the memory film 90 is conformally deposited in the trenches 86. The memory film 90 may comprise a material that is capable of storing a bit, such as material capable of switching between two different polarization directions by applying an appropriate voltage differential across the memory film 90. For example, the polarization of the memory film 90 may change due to an electric field resulting from applying the voltage differential. In some embodiments, the memory film 90 comprises a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory film 90 may be a multilayer structure comprising a layer of SiN$_x$ between two SiO$_x$ layers (e.g., an ONO structure). In still other embodiments, the memory film 90 comprises a different ferroelectric material or a different type of memory material. The memory film 90 may be deposited by CVD, PVD, ALD, PECVD, or the like to extend along sidewalls and bottom surfaces of the trenches 86. In some embodiments, after the memory film 90 is deposited, an annealing step may be performed. In some embodiments, the memory film 90 may be deposited to a thickness that is in the range of about 5 nm to about 15 nm, though other thicknesses are possible.

Figure 19A:
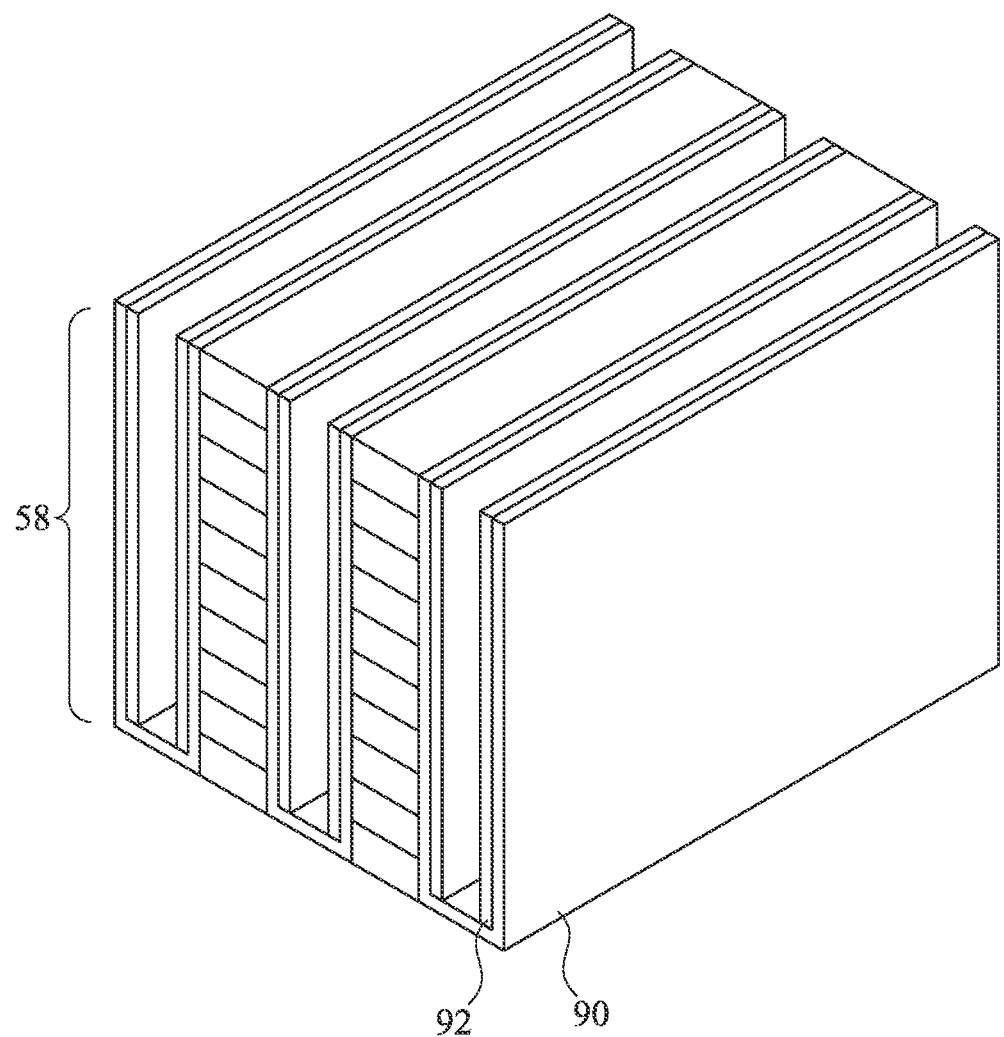
Figure 19B:
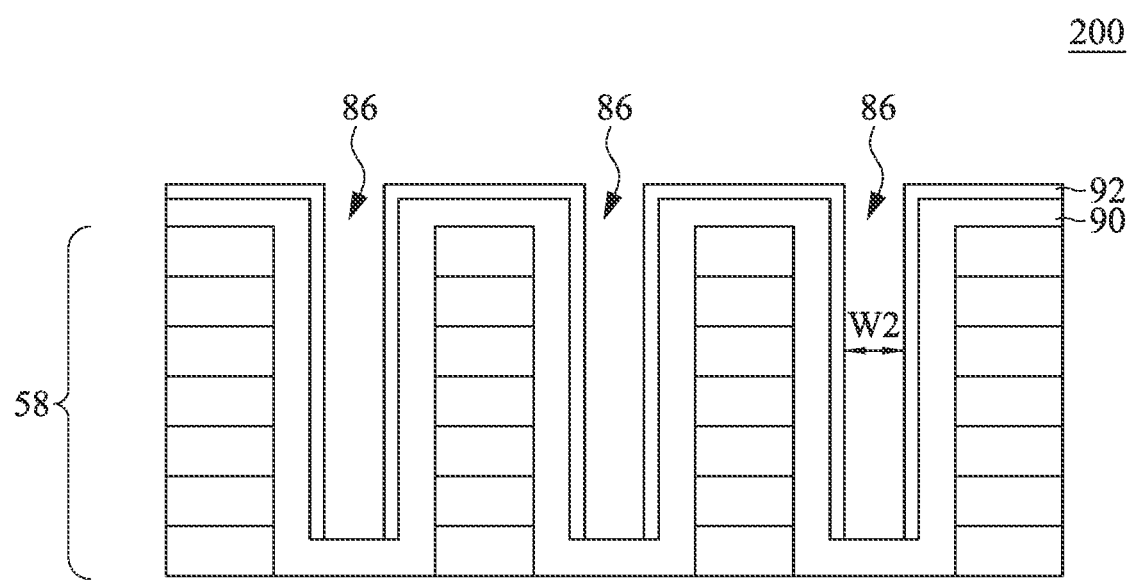

In FIGS. 19A and 19B, the OS layer 92 is conformally deposited in the trenches 86 over the memory film 90. The OS layer 92 comprises a material suitable for providing a channel region for a transistor (e.g., transistors 204, see FIG. 1A). In some embodiments, the OS layer 92 comprises an indium-comprising material, such as In$_x$Ga$_y$Zn$_z$MO, where M may be Ti, Al, Sn, W, or the like. X, Y, and Z may each be any value between 0 and 1. For example, the OS layer 92 may comprise indium gallium zinc oxide, indium titanium oxide, indium tungsten oxide, indium oxide, the like, or combinations thereof. In other embodiments, a different semiconductor material than these examples may be used for the OS layer 92. The OS layer 92 may be deposited by CVD, PVD, ALD, PECVD, or the like. The OS layer 92 may extend along sidewalls and may also extend on bottom surfaces of the memory film 90 within the trenches 86. In some embodiments, after the OS layer 92 is deposited, an annealing step (e.g., at a temperature range of about 300° C. to about 450° C.) in oxygen-related ambient may be performed to activate the charge carriers of the OS layer 92. In some embodiments, the OS layer 92 may be deposited to a thickness that is in the range of about 1 nm to about 15 nm, though other thicknesses are possible. In some embodiments, after depositing the OS layer 92, the trenches 86 may have a width W2 that is in the range of about 20 nm to about 70 nm, though other widths are possible.

Figure 20:
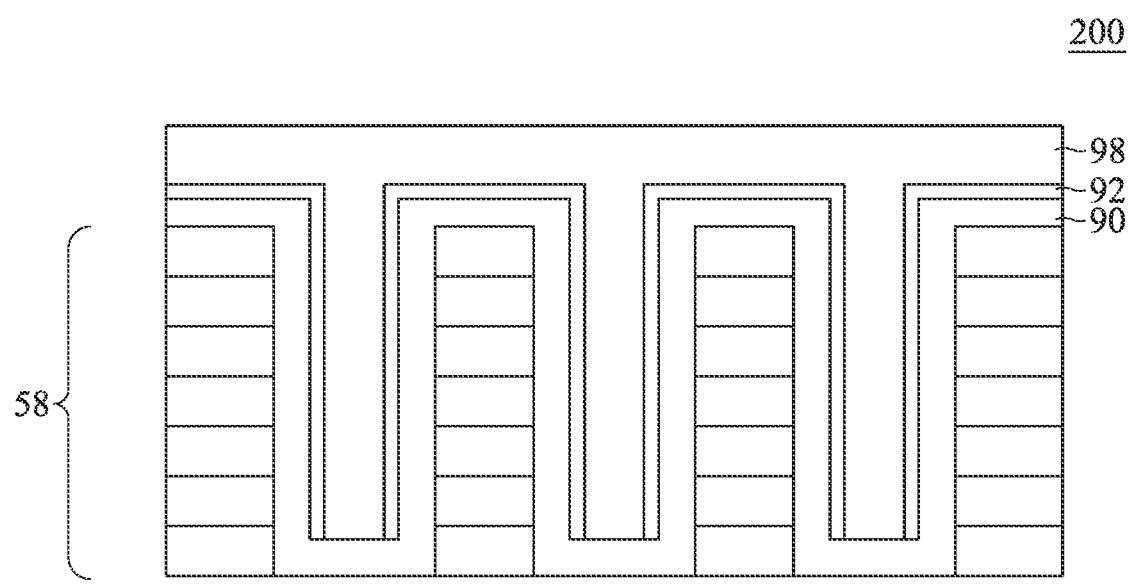

In FIG. 20, a dielectric material 98 is deposited on sidewalls and a bottom surface of the trenches 86. The dielectric material 98 may comprise, for example, silicon oxide, silicon nitride, silicon oxynitride, or the like, which may be deposited by CVD, PVD, ALD, PECVD, or the like. As shown in FIG. 20, the dielectric material 98 may fill the trenches 86 and may cover the multi-layer stack 58.

Figure 21A:
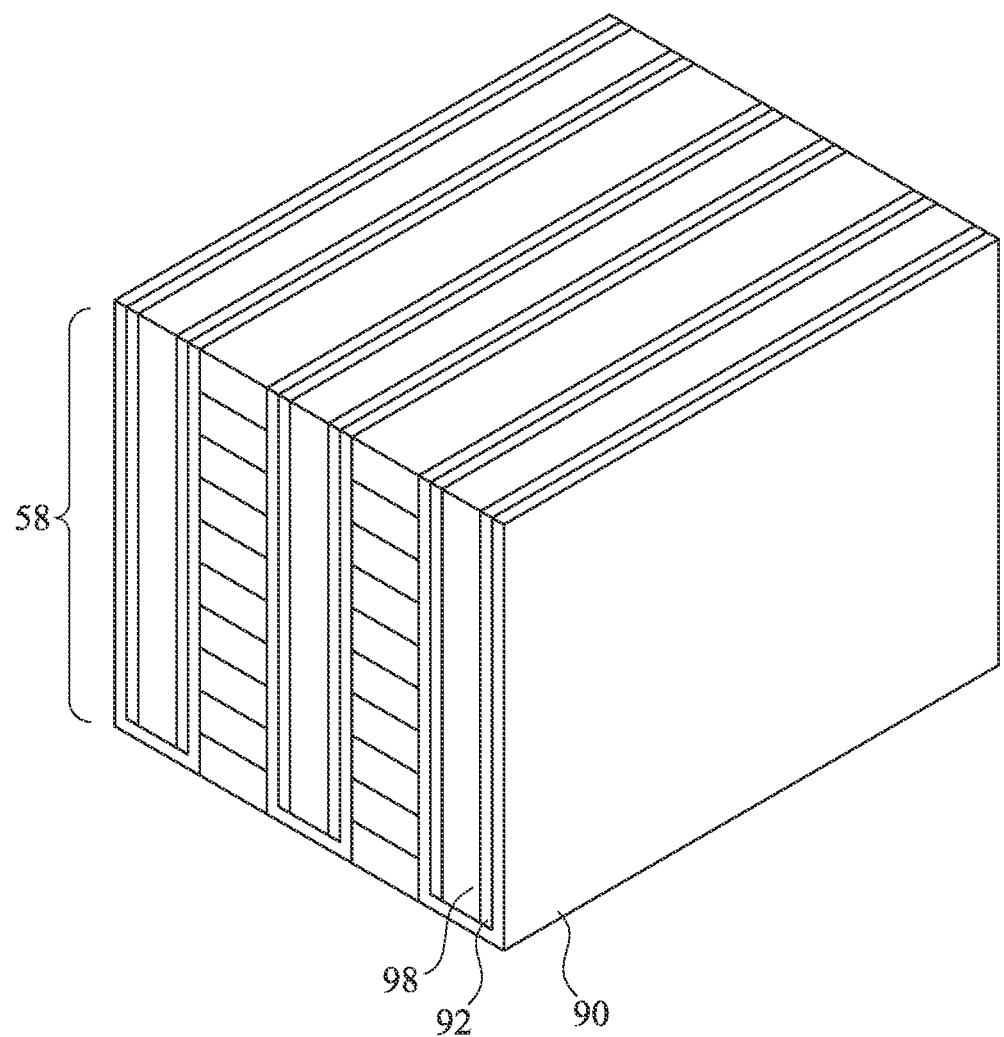
Figure 21B:
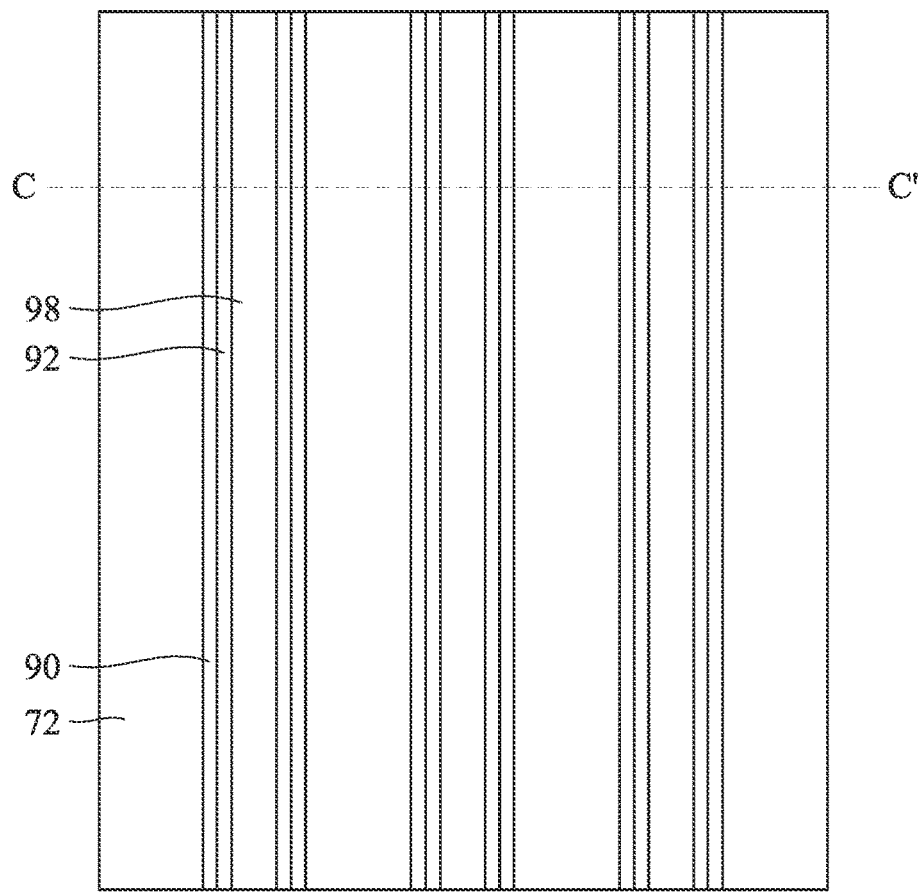
Figure 21C:
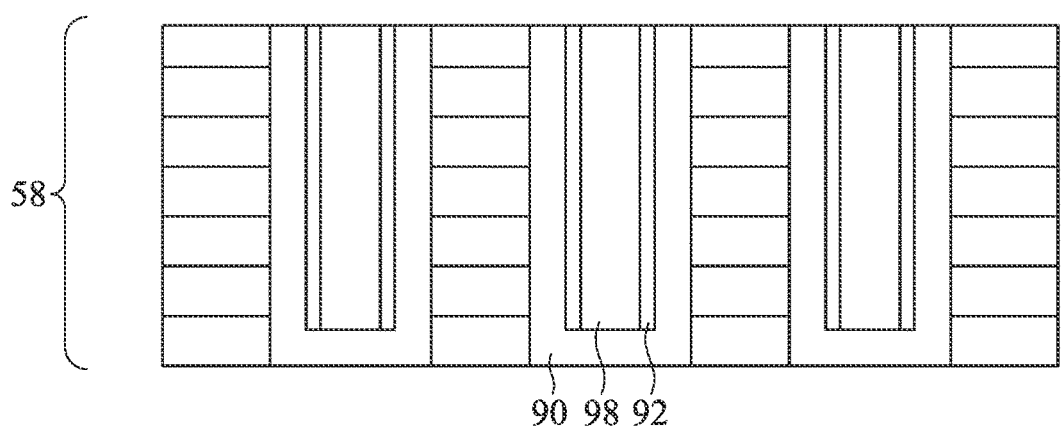

In FIGS. 21A, 21B, and 21C, a removal process is performed to remove excess dielectric material 98 over the multi-layer stack 58. FIG. 21A illustrates a three-dimensional view, FIG. 21B illustrates a plan view, and FIG. 21C illustrates a cross-sectional view through the reference cross-section C-C' shown in FIG. 21B. In some embodiments, a planarization process such as a chemical mechanical polish (CMP), a grinding process, an etch-back process, combinations thereof, or the like may be utilized. The planarization process may expose the multi-layer stack 58 such that top surfaces of the multi-layer stack 58 are level after the planarization process is complete.

Figure 22A:
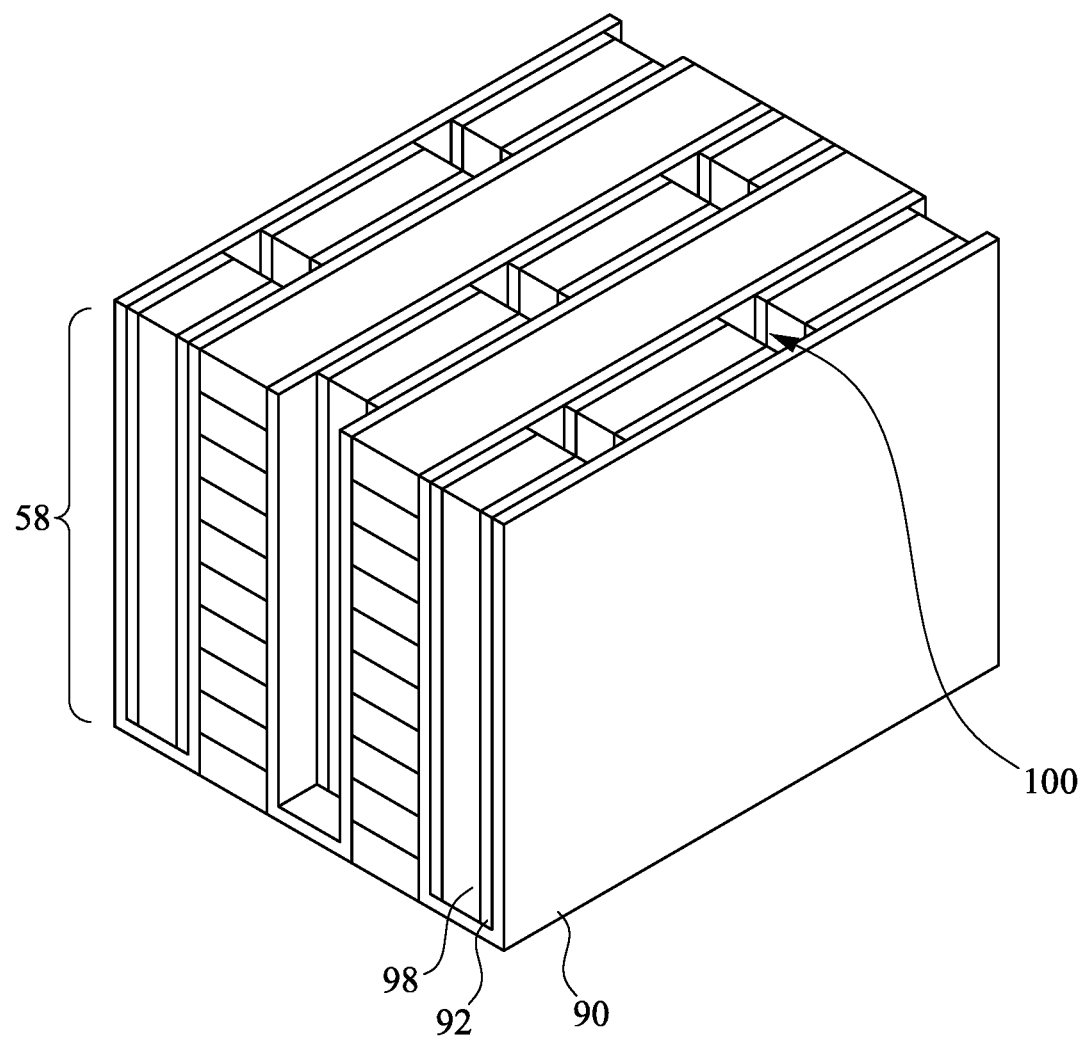
Figure 22B:
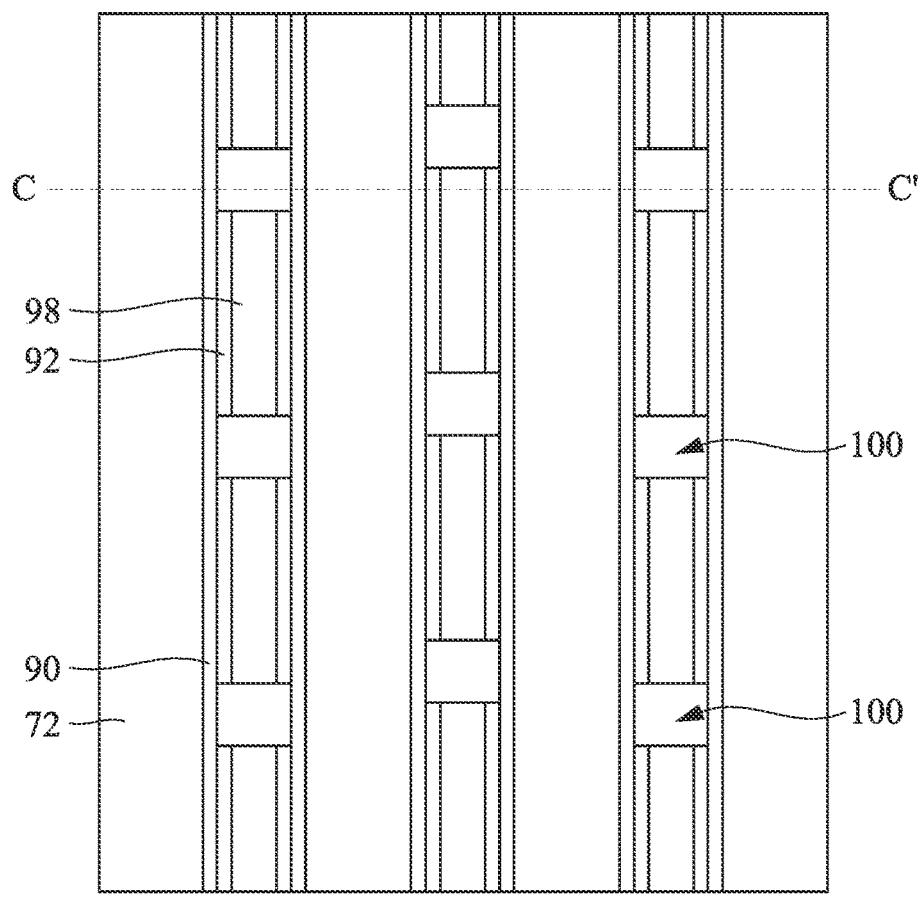
Figure 22C:
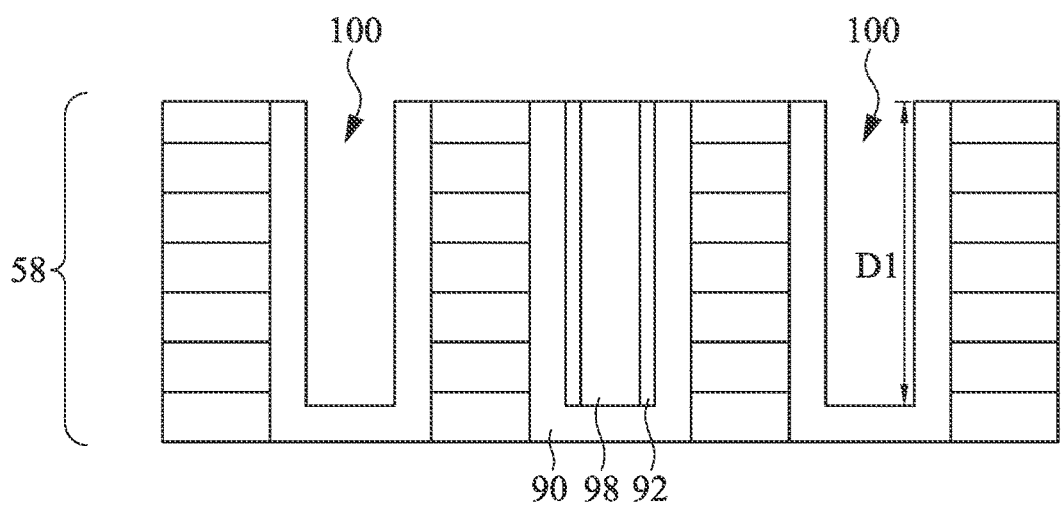

In FIGS. 22A, 22B, and 22C, trenches 100 are patterned through the dielectric material 98. FIG. 22A is illustrated in a three-dimensional view, FIG. 22B is illustrated in a plan view, and FIG. 22C is illustrated in a cross-sectional view along reference cross-section C-C' of FIG. 22B. The trenches 100 may be disposed between opposing sidewalls of the multi-layer stack 58, and define regions where portions of the transistors (e.g., transistors 204) are subsequently formed. Patterning the trenches 100 may be performed through a combination of photolithography and etching, in some embodiments. For example, a photoresist may be deposited over the multi-layer stack 58. The photoresist can be formed by using a suitable technique such as a spin-on technique, for example. The photoresist may then be patterned to define openings that expose regions of the dielectric material 98. The photoresist can be patterned using acceptable photolithography techniques.

Portions of the dielectric material 98 exposed by the openings may be removed by etching, forming trenches 100 in the dielectric material 98. The etching may be any acceptable etch process, such as by wet or dry etching, a reactive ion etch (RIE), neutral beam etch (NBE), the like, or a combination thereof. The etching may be anisotropic. In some embodiments, the trenches 100 may have a depth D1 that is in the range of about moo nm to about 2000 nm, though other depths are possible. After the trenches 100 are patterned, the photoresist may be removed by ashing, for example.

Figure 23A:
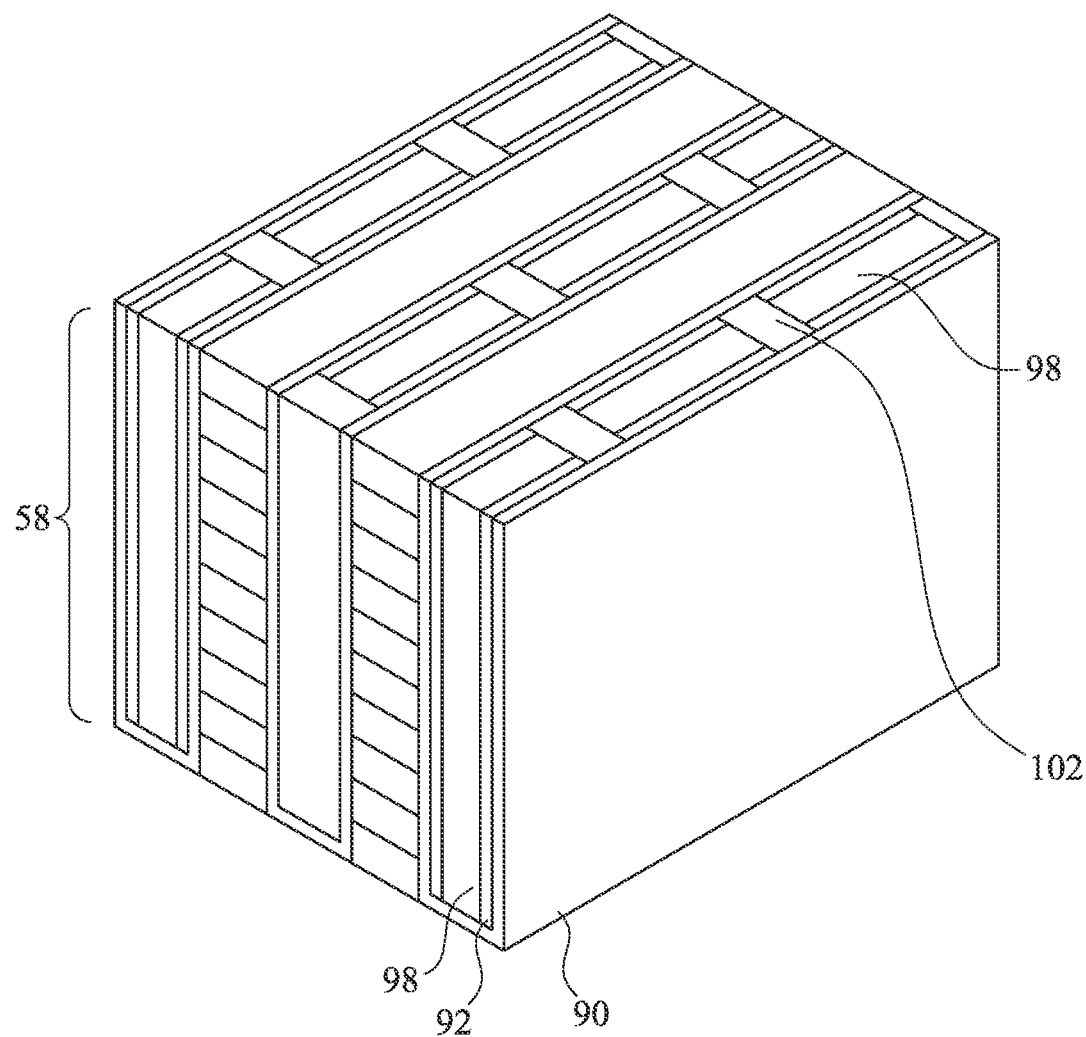
Figure 23B:
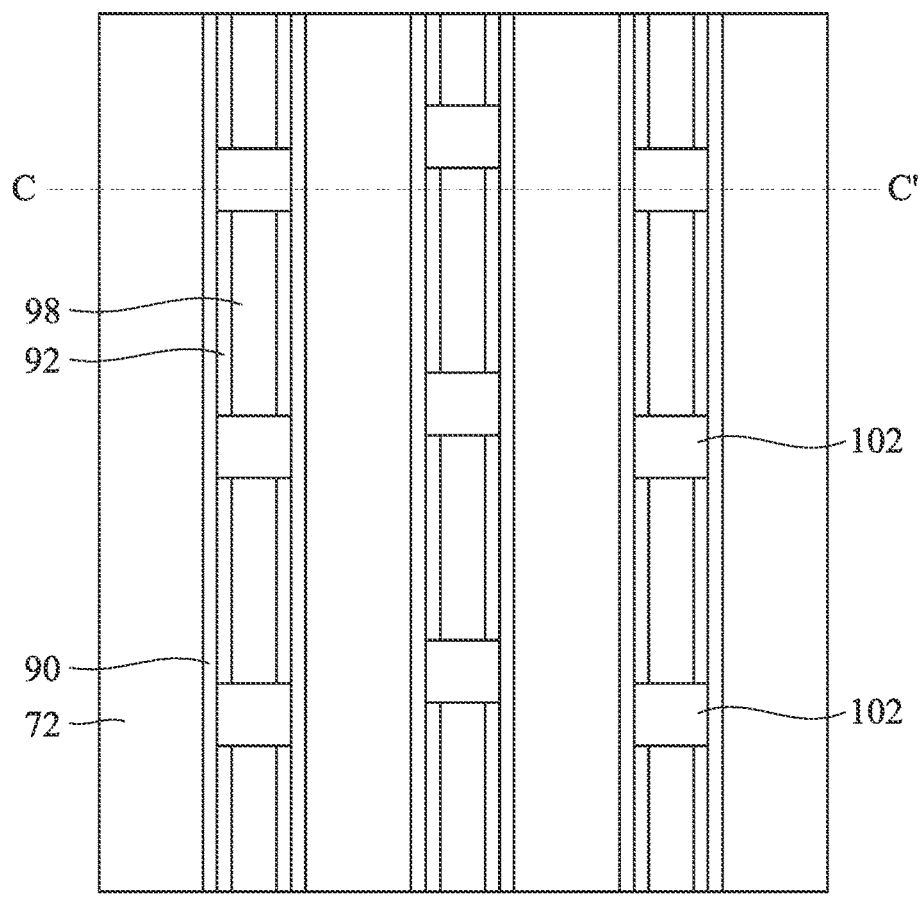
Figure 23C:
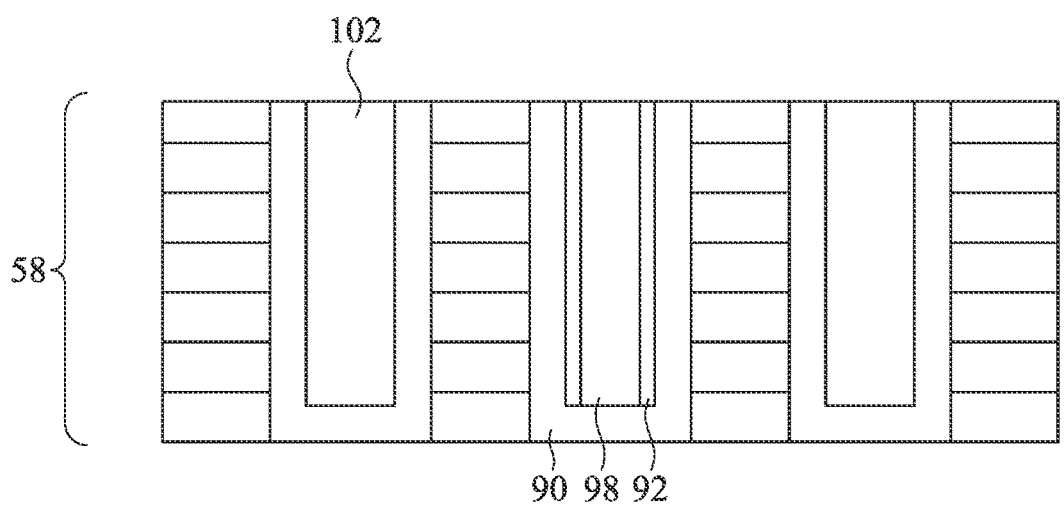

In FIGS. 23A, 23B, and 23C, a dielectric material 102 is deposited over the OS layer 92 and fills the trenches 100, in accordance with some embodiments. FIG. 23C illustrates a cross-sectional view of line C-C' in FIG. 23B. The dielectric material 102 may comprise, for example, silicon oxide, silicon nitride, silicon oxynitride, the like, or combinations thereof. The material of the dielectric material 102 may be the same as or different from the material of the dielectric material 98. The dielectric material 102 may be deposited using a suitable technique, such as CVD, PVD, ALD, PECVD, or the like. The dielectric material 102 may extend along sidewalls and along bottom surfaces of the OS layer 92 within the trenches 100. After deposition, a planarization process (e.g., a CMP, etch-back, or the like) may be performed to remove excess portions of the dielectric material 102. In the resulting structure, top surfaces of the multi-layer stack 58, the memory film 90, the OS layer 92, and the dielectric material 102 may be substantially level.

FIGS. 24A through 29C illustrate intermediate steps of manufacturing conductive lines 106 and 108 (e.g., source lines and bit lines) in the memory array 200, in accordance with some embodiments. The conductive lines 106 and 108 may extend along a direction perpendicular to the conductive lines 72 such that individual cells of the memory array 200 may be selected for read and write operations. FIGS. 28A through 29C illustrate the formation of air gaps 122 and seals 121 that isolate the conductive lines 106 and 108. FIGS. 24A, 25A, 26A, and 29A illustrate a three-dimensional view. FIGS. 24B, 25B, 26B, and 29B illustrate a plan view. FIGS. 24C and 25C illustrate cross-sectional views along the reference cross-section C-C' shown in FIGS. 24B and 25B. FIGS. 26C, 27, 28 and 29C illustrate cross-sectional views along the reference cross-section D-D' shown in FIGS. 26B and 29B.

Figure 24A:
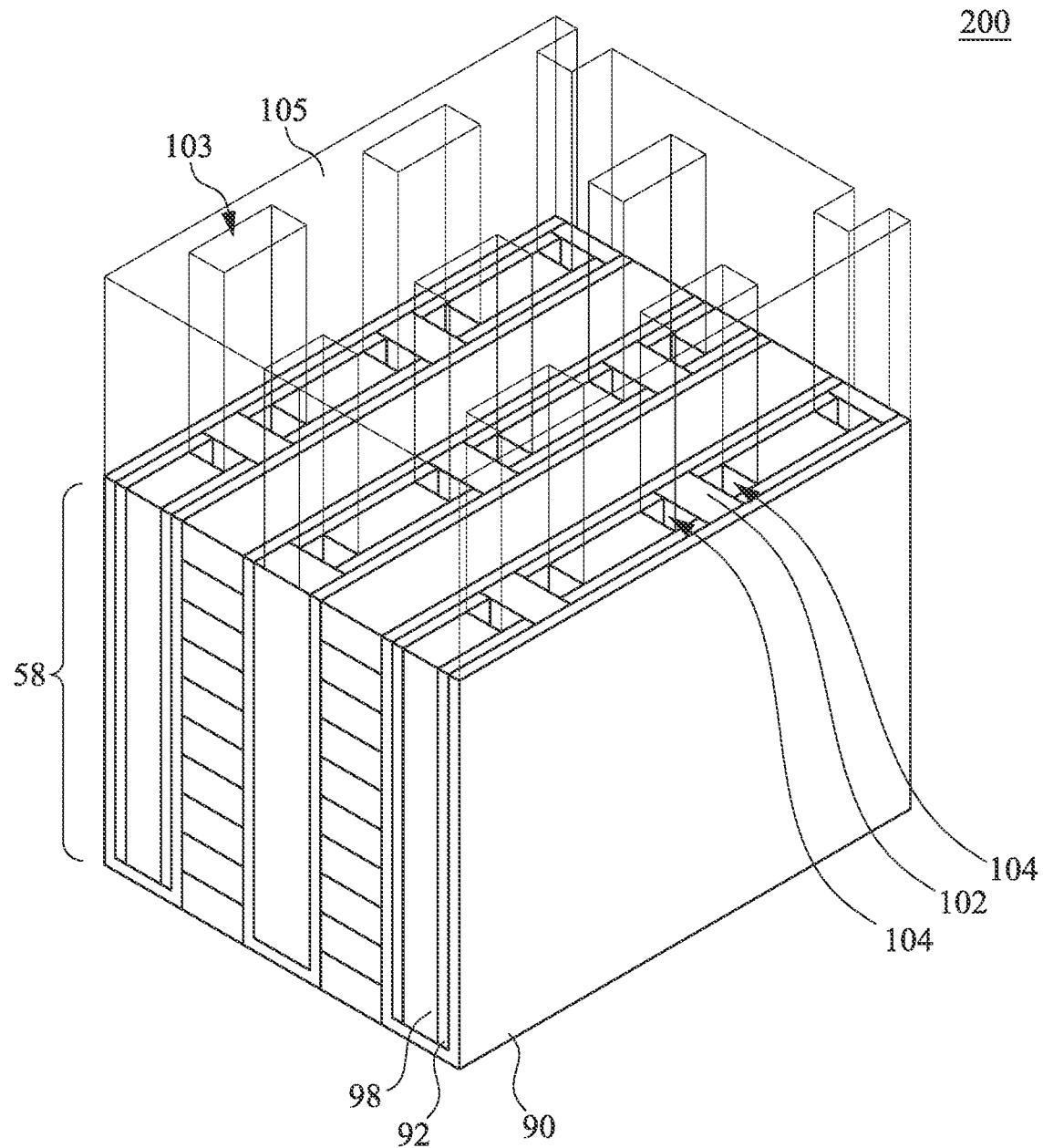
Figure 24B:
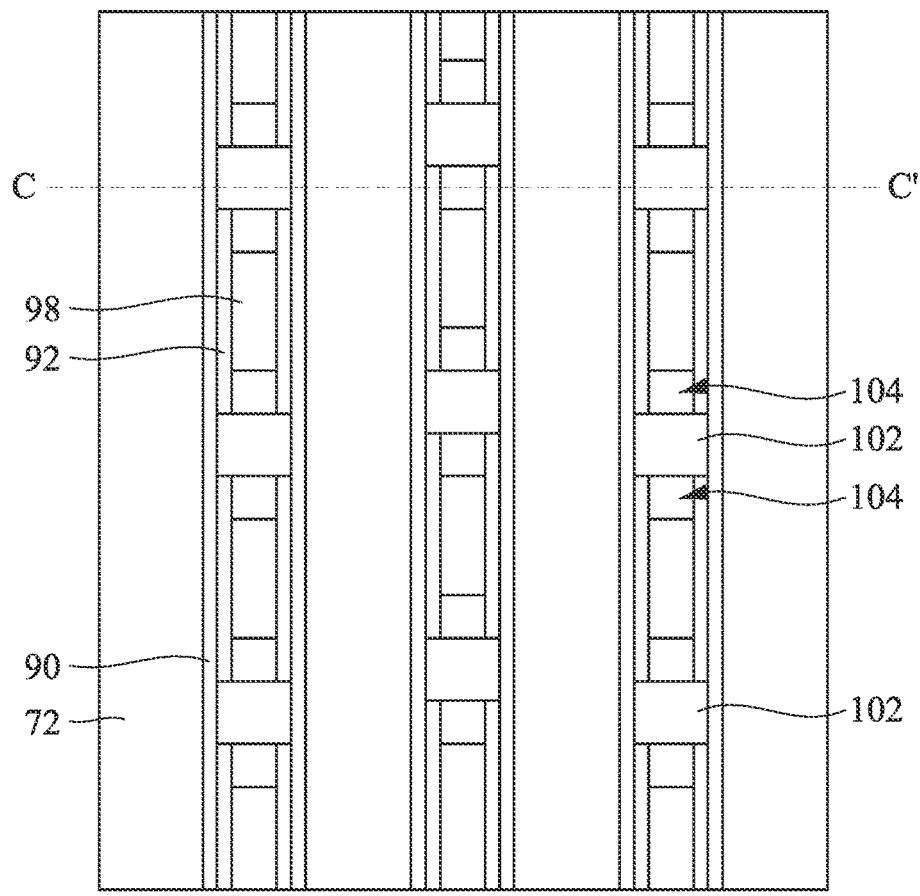
Figure 24C:
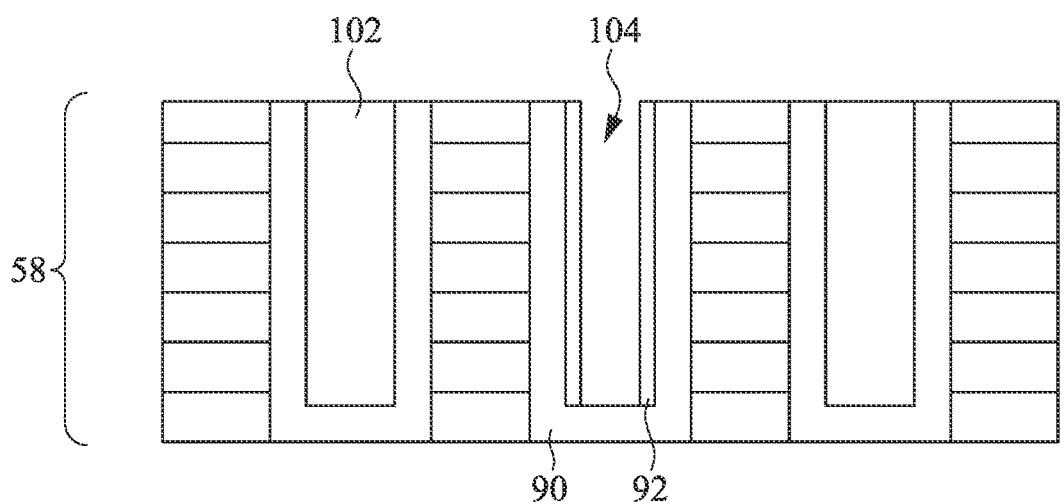

In FIGS. 24A, 24B, and 24C, trenches 104 are patterned for the conductive lines 106 and 108. The trenches 104 are patterned by patterning the dielectric material 98 using, for example, a combination of photolithography and etching. For example, a photoresist 105 may be deposited over the multi-layer stack 58, the dielectric material 98, the dielectric material 102, the OS layer 92, and the memory film 90. The photoresist 105 can be formed by using a spin-on technique, for example. The photoresist 105 is patterned to define openings 103. Each of the openings 103 may overlap a corresponding region of the dielectric material 102, and each of the openings 103 may further partially expose two separate regions of the dielectric material 98. For example, each opening 103 may expose a region of the dielectric material 102; partially expose a first region of the dielectric material 98; and partially expose a second region of the dielectric material 98 that is separated from the first region of the dielectric material 98 by the region of the dielectric material 102. In this way, each of the openings 103 may define a pattern of a conductive line 106 and an adjacent conductive line 108 that are separated by the dielectric material 102. The photoresist can be patterned using acceptable photolithography techniques.

Subsequently, portions of the dielectric material 98 exposed by the openings 103 may be removed, forming trenches 104. The dielectric material 98 may be removed, for example, using any acceptable etch process, such as by wet or dry etching, a reactive ion etch (RIE), neutral beam etch (NBE), the like, or a combination thereof. The etching may be anisotropic. In some embodiments, the etching process may use an etchant that etches the dielectric material 98 without significantly etching the dielectric material 102. As a result, even though the openings 103 expose the dielectric material 102, the dielectric material 102 may not be significantly removed. A pattern of the trenches 104 may correspond to the conductive lines 106 and 108 (see FIGS. 25A, 25B, and 25C). For example, a portion of the dielectric material 98 may remain between each pair of the trenches 104, and the dielectric material 102 may be disposed between adjacent pairs of the trenches 104. After the trenches 104 are patterned, the photoresist 105 may be removed by ashing, for example.

Figure 25A:
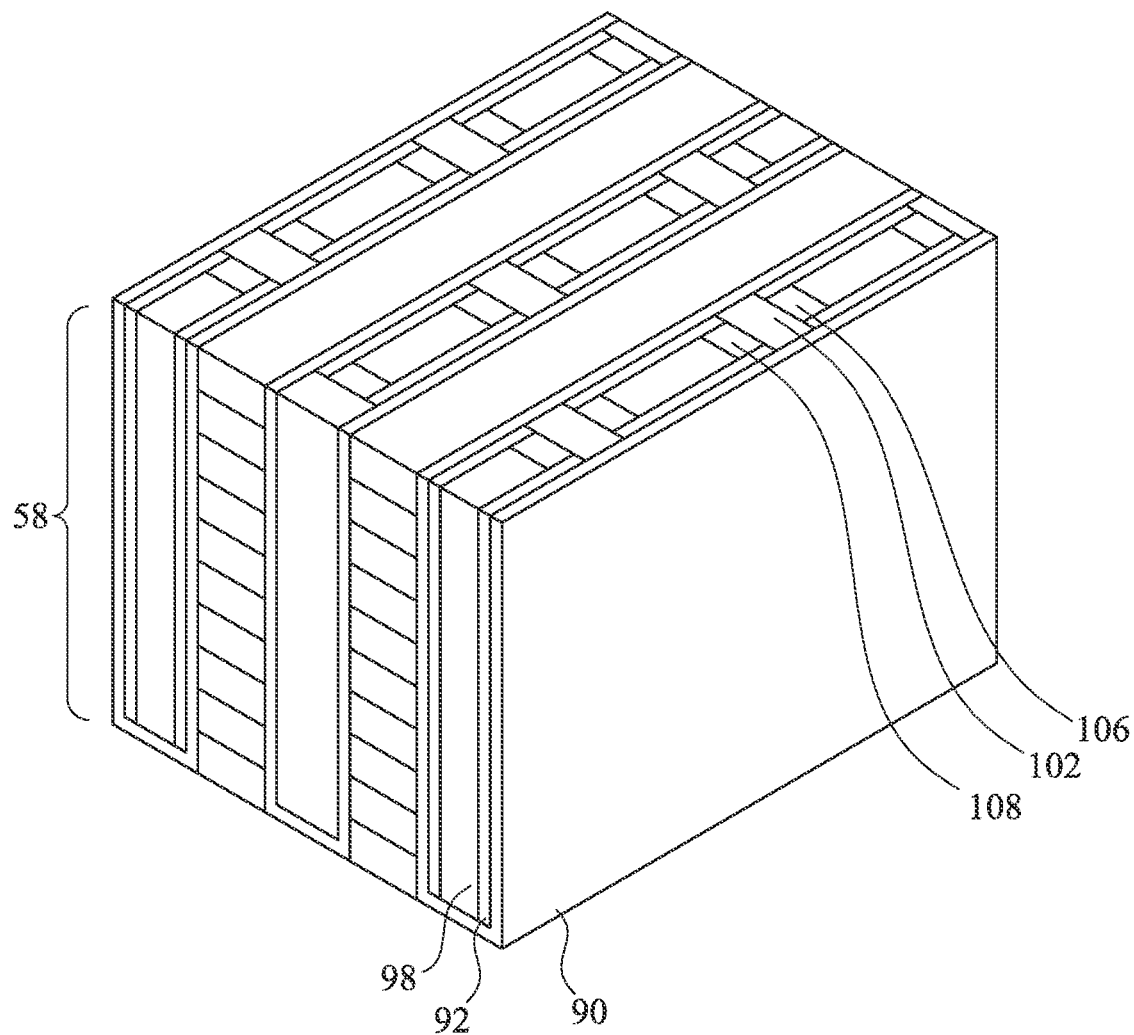
Figure 25B:
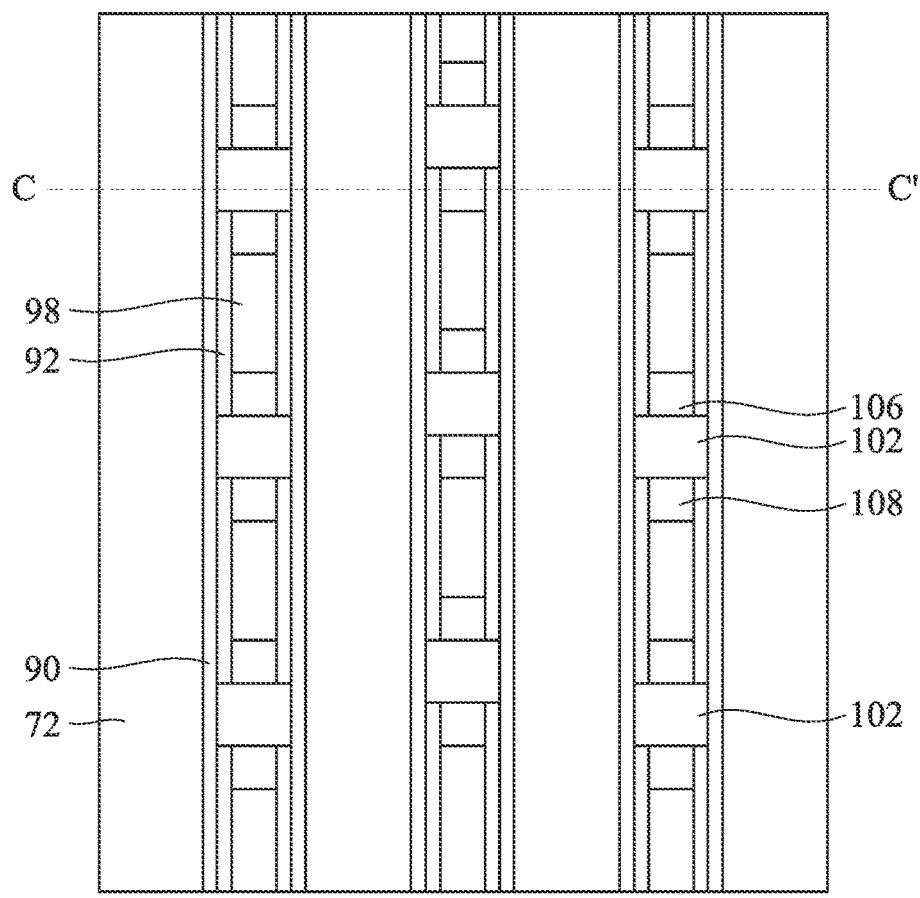
Figure 25C:
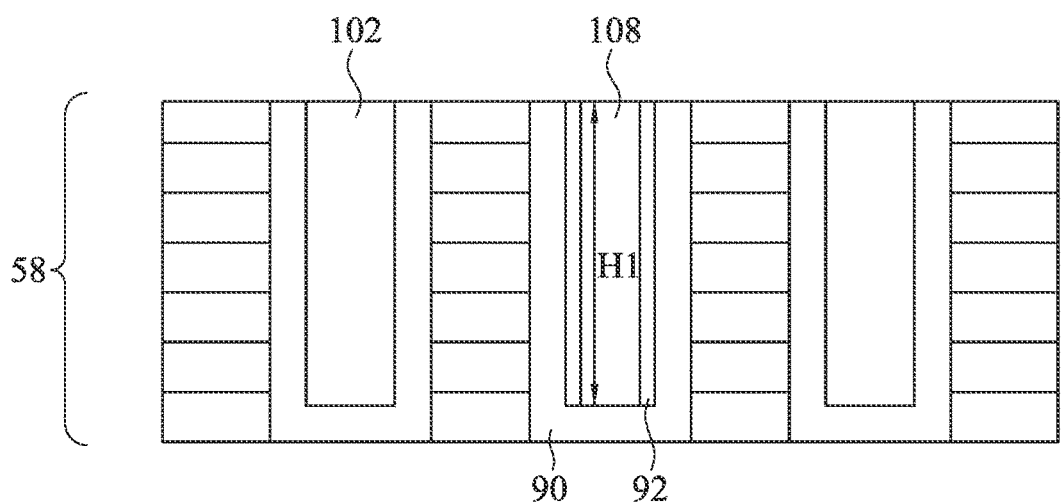

In FIGS. 25A, 25B, and 25C the trenches 104 are filled with a conductive material, forming conductive lines 106 and conductive lines 108, in accordance with some embodiments. The conductive material may comprise one or more materials such as copper, titanium, titanium nitride, tantalum, tantalum nitride, tungsten, ruthenium, aluminum, molybdenum, combinations thereof, or the like, which may be each formed using, for example, CVD, ALD, PVD, PECVD, or the like. After the conductive material is deposited, a planarization process may be performed to remove excess portions of the conductive material. In the resulting structure, top surfaces of the multi-layer stack 58, the memory film 90, the OS layer 92, the dielectric material 98, and the conductive lines 106/108 may be substantially level (e.g., coplanar within process variations). In some embodiments, the conductive lines 106/108 may have a height H1 that is in the range of about 1000 nm to about 2000 nm, which may be about the same as the depth D1 of the trenches 100 (see FIG. 22C). Other heights are possible.

The conductive lines 106 may correspond to bit lines in the memory array, and the conductive lines 108 may correspond to source lines in the memory array 200. Although FIG. 25C illustrates a cross-sectional view that only shows the conductive lines 108, a cross-sectional view of the conductive lines 106 may be similar. Adjacent conductive lines 106 and conductive lines 108 are separated by an isolation region formed from the dielectric material 102 and by the dielectric material 98. Air gaps 122 are subsequently formed between the conductive lines 106/108 and the dielectric material 98, described below.

Figure 26A:
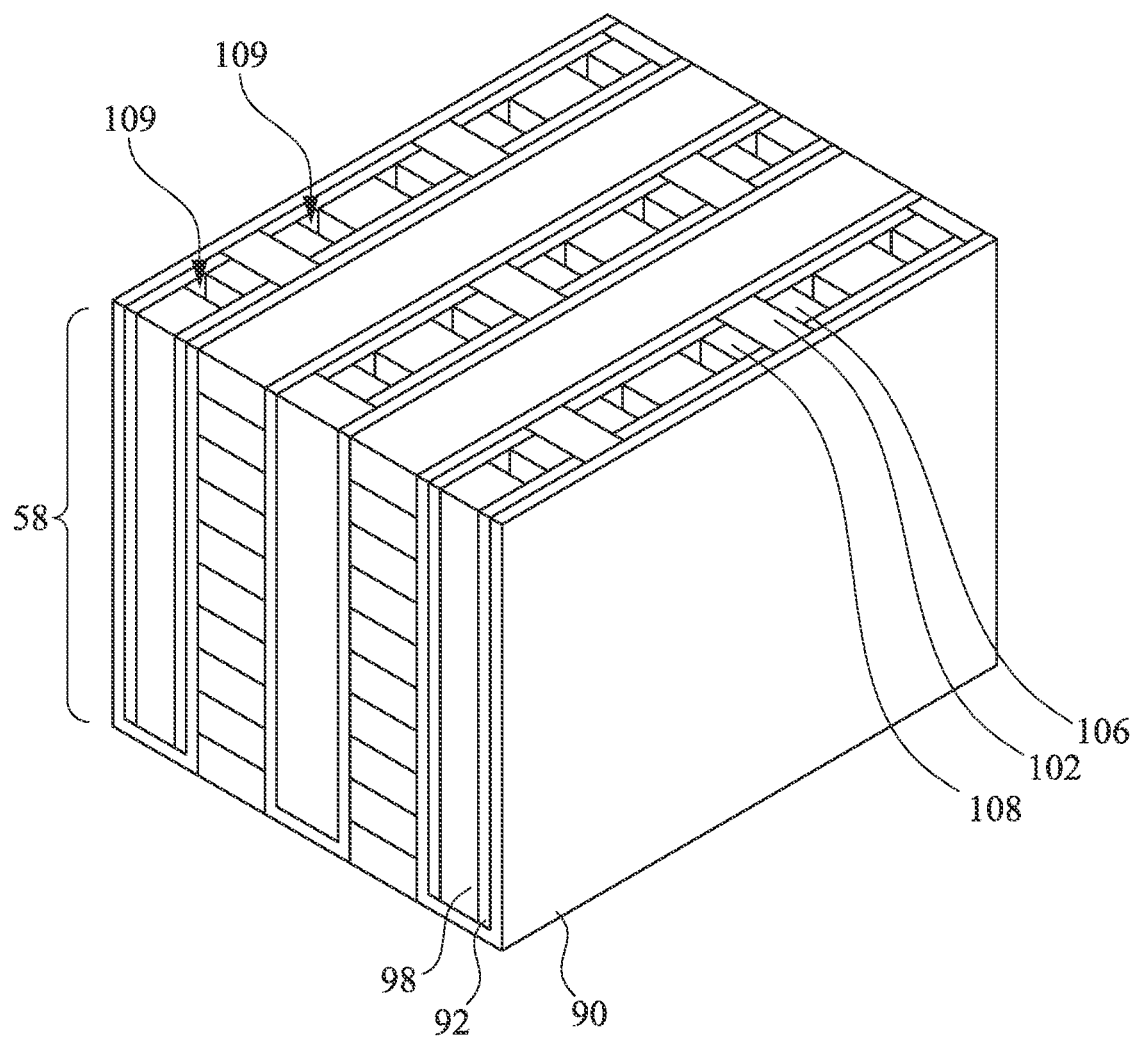
Figure 26B:
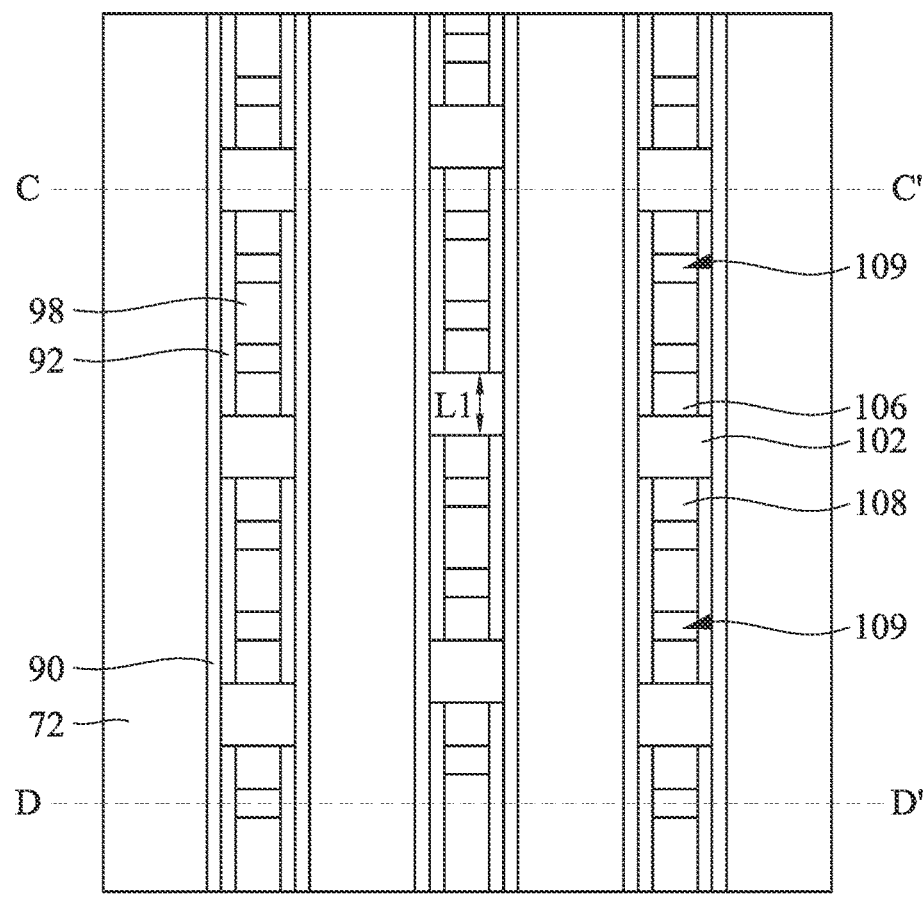
Figure 26C:
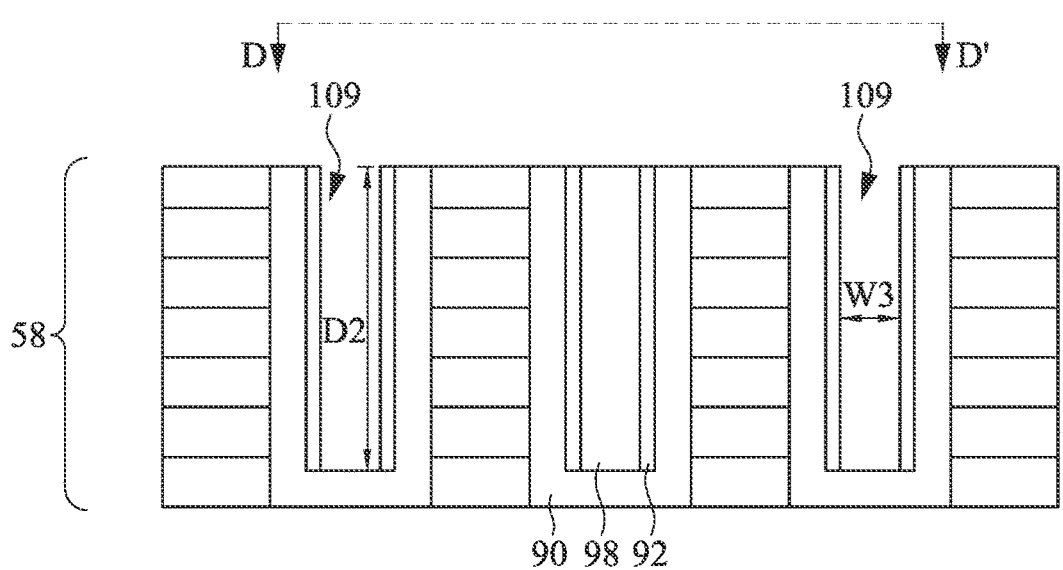

FIGS. 26A through 29C describe the formation of air gaps 122 in the memory array 200, in accordance with some embodiments. In FIGS. 26A, 26B, and 26C, trenches 109 are patterned for the air gaps 122. FIG. 26C illustrates a cross-sectional view along reference cross-section D-D' illustrated in FIG. 26B. The trenches 109 are patterned in the dielectric material 98 using, for example, a combination of photolithography and etching. For example, a photoresist (not illustrated in the figures) may be deposited over the multi-layer stack 58, the dielectric material 98, the dielectric material 102, the OS layer 92, the memory film 90, and the conductive lines 106/108. The photoresist can be formed by using a spin-on technique, for example. The photoresist is patterned to define openings in the photoresist that expose regions of the dielectric material 98 corresponding to the trenches 109. An opening in the photoresist may expose a single region of the dielectric material 98 corresponding to a single trench 109, or an opening in the photoresist may extend across the conductive lines 106/108 and the dielectric material 102 to expose two regions of the dielectric material 98 corresponding to two trenches 109. The photoresist can be patterned using acceptable photolithography techniques.

Subsequently, portions of the dielectric material 98 exposed by the openings in the photoresist may be removed, forming trenches 109. The dielectric material 98 may be removed, for example, using any acceptable etch process, such as by wet or dry etching, a reactive ion etch (RIE), neutral beam etch (NBE), the like, or a combination thereof. The etching may be anisotropic. In some embodiments, the etching process may use an etchant that etches the dielectric material 98 without significantly etching the dielectric material 102 or the conductive lines 106/108. Each trench 109 may extend between a conductive line 106/108 and a portion of the dielectric material 98, and portion of the dielectric material 98 may extend between trenches 109. After the trenches 109 are patterned, the photoresist may be removed by ashing, for example. The trenches 109 may have a depth D2 that is in the range of about 1000 nm to about 2000 nm, which may be about the same as the height H1 of the conductive lines 106/108 and/or the depth D1 of the trenches 100. The trenches may have a width W3 that is about the same as the width W2 of the trenches (see FIG. 19B). In some embodiments, the trenches 109 have a length L1 that is in the range of about 5 nm to about 50 nm. The trenches 109 may have other dimensions in other embodiments.

Figure 27:
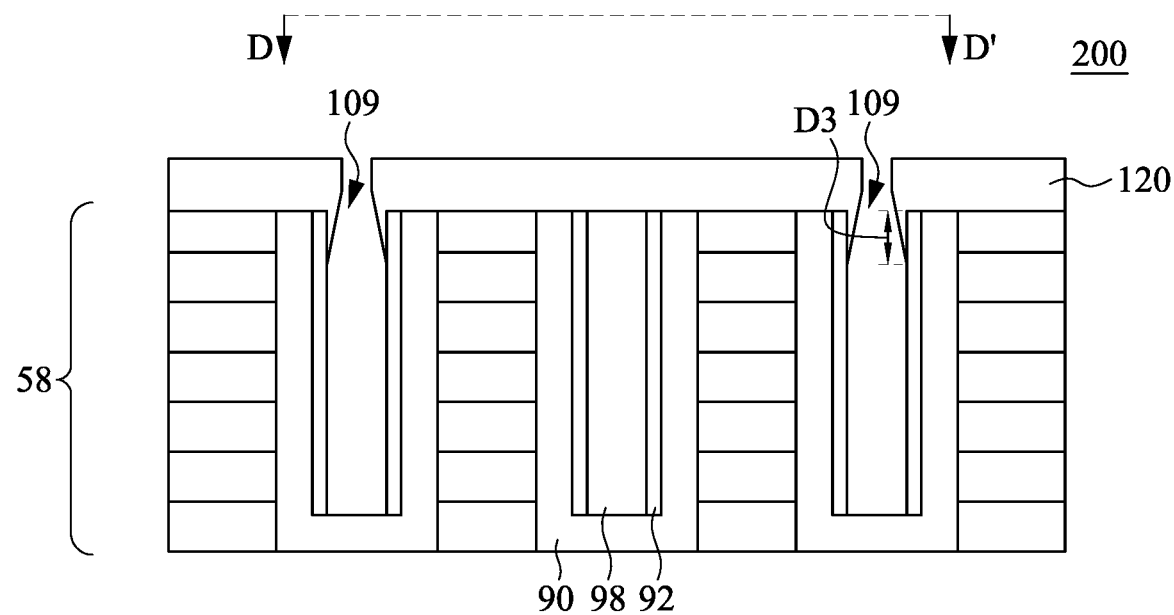

In FIG. 27, a sealing material 120 is deposited over the multi-layer stack 58 and within the trenches 109, in accordance with some embodiments. In some embodiments, the sealing material 120 is formed of a dielectric material such as PSG, BSG, BPSG, USG, silicon oxide, or the like. The sealing material 120 may be deposited using any suitable method, such as CVD, PECVD, or the like. In some embodiments, the sealing material 120 is a flowable film formed by a flowable CVD method.

In some embodiments, the sealing material 120 may be formed having a thickness in the range of about 5 nm to about 50 nm. Other thicknesses are possible. In some embodiments, the sealing material 120 may extend partially over the trenches 109, as shown in FIG. 27. In other embodiments, the sealing material 120 may extend completely across the trenches 109. The sealing material 120 may extend partially into the trenches 109 along sidewalls of the trenches 109. In some embodiments, the sealing material 120 extends a depth D3 into the trenches 109 that is in the range of about 10 nm to about 50 nm. Other depths D3 are possible. In other embodiments, the sealing material 120 extends the full depth into the trenches 109. Controlling the depth D3 of the sealing material 120 can control the size of the seals 121 that seal the air gaps 122, described below with regard to FIGS. 29A-29C.

Figure 28:
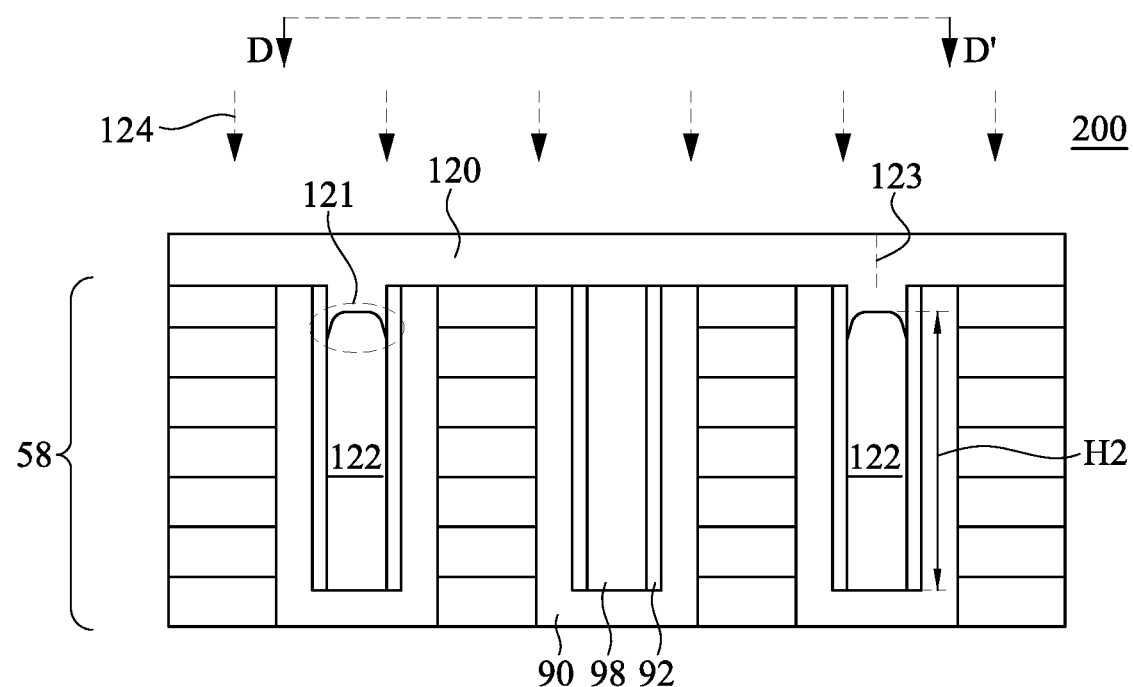

In FIG. 28, an implantation process 124 may be performed to implant the sealing material 120 with dopants to seal the trenches 109 and form the air gaps 122, in accordance with some embodiments. In some embodiments, the implantation process implants dopants that cause the sealing material 120 to expand. In some embodiments, the implantation process 124 can be controlled to implant dopants in the sealing material 120 such that the expanded portions of the sealing material 120 extend fully across the width of the trenches 109, sealing the trenches 109 to form the air gaps 122. The expanded portions of the sealing material 120 covering the trenches 109 are referred to herein as seals 121. In some cases, the expanded sealing material 120 may merge over the trenches 109, and in some cases the seals 121 may be formed having a seam 123. By forming seals 121 over the air gaps 122 in this manner, subsequently deposited material may be prevented from entering the air gaps 122.

By forming air gaps 122 in this manner, the capacitance between the conductive lines 106 and the conductive lines 108 may be reduced. The capacitance may be reduced due to the lower dielectric constant (k-value) of air, about k=1, relative to other spacer materials such as silicon oxides, silicon nitrides, or the like. By reducing capacitance using the air gaps 122, the memory array 200 may have faster response speed and improved performance at higher frequency operation.

In some embodiments, the air gaps 122 may have a height H2 that is in the range of about 1000 nm to about 3000 nm. In some embodiments, the height H2 may be between about 95% and about 99% of the depth D2 of the trenches 109. In some embodiments, the volume of the air gaps 122 may be between about 95% and about 99% of the volume of the trenches 109. In some embodiments, the volume of the air gaps 122 may be between about 80% and about 99% of the volume of a conductive line 106/108. In some cases, forming larger air gaps 122 may provide a greater reduction of the capacitance between the conductive lines 106/108. The bottom surfaces of the seals 121 are shown as concave as shown in FIG. 28, but may be flat, convex, irregular, or have another shape than these examples.

In some embodiments, the dose, implant depth, dopant species, angle, implant energy, or other characteristics of the implantation process 124 may be controlled to control the expansion of the sealing material 120. In some embodiments, the dopant species implanted by the implantation process 124 includes Ge, Ar, Xe, Si, the like, or a combination thereof. In some embodiments, the implanted dopants are an atomic species having a larger atomic radius than silicon. For example, when implanted into sealing material 120 comprising silicon oxide, the larger size of the implanted dopants can cause the implanted regions of the sealing material 120 to increase in volume. In some embodiments, the implantation process 124 includes implanting the dopants at an angle from a vertical axis that is between about 0 degrees and about 60 degrees. In some cases, controlling the implantation angle can be beneficial depending on the application or device geometry. For example, the implantation process 124 may be performed at an angle to reduce straggle effects. In some embodiments, the implanted dose of dopants may be between about $10^{14}$ atoms/cm$^2$ and about $10^{16}$ atoms/cm$^2$. In some embodiments, the dopants may be implanted to a concentration of equal to or less than about $10^{22}$ cm$^{-3}$, such as between about $10^{19}$ cm$^{-3}$ and about $10^{22}$ cm$^{-3}$. Increasing the implanted dose or increasing the concentration of dopants can increase the expansion of the sealing material 120. In some embodiments, the implantation temperature is in the range from about −100° C. to about 450° C. In some embodiments, the implantation process 124 can cause the volume of the sealing material 120 to increase between about 10% and about 90%.

Figure 29A:
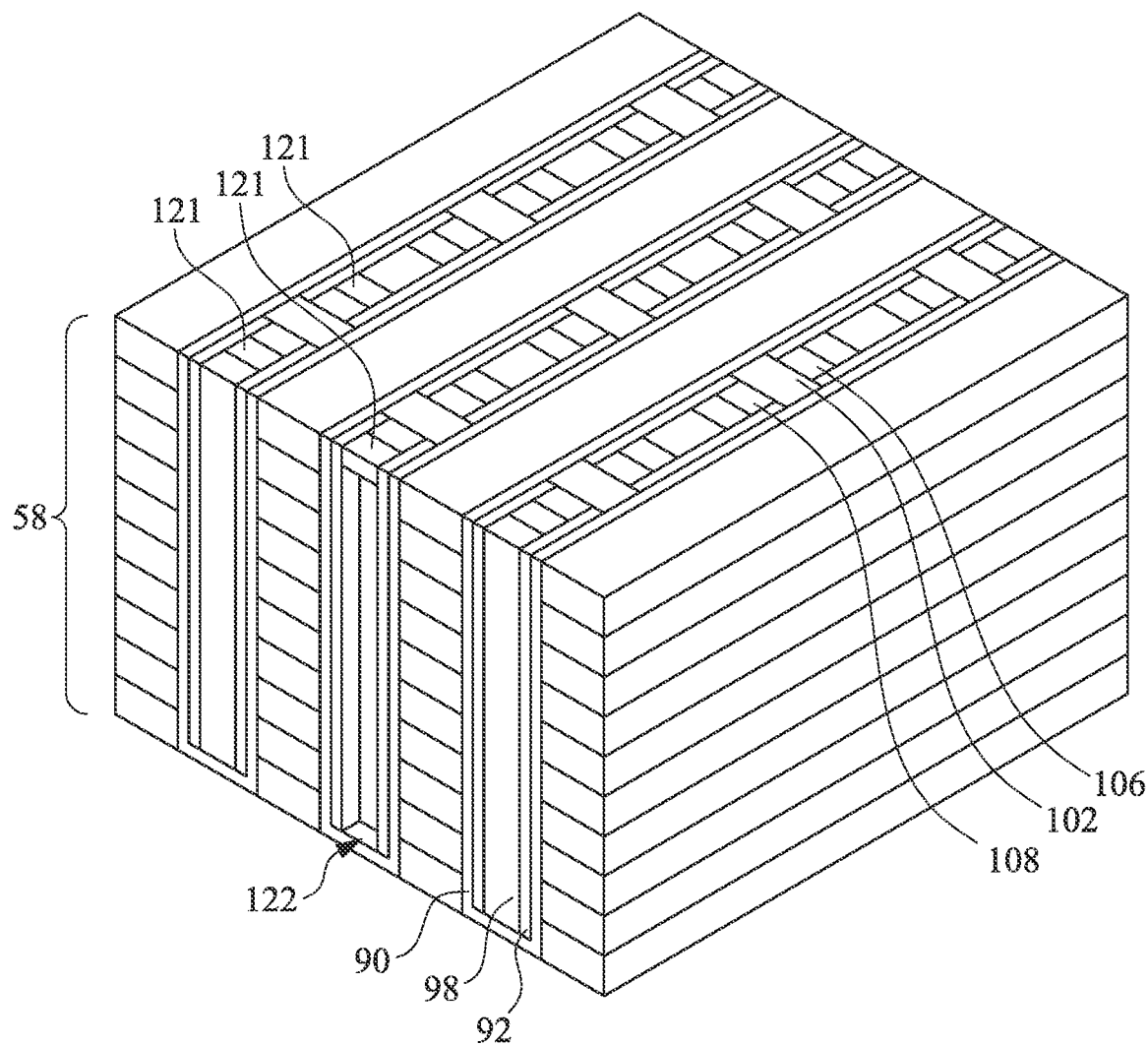
Figure 29B:
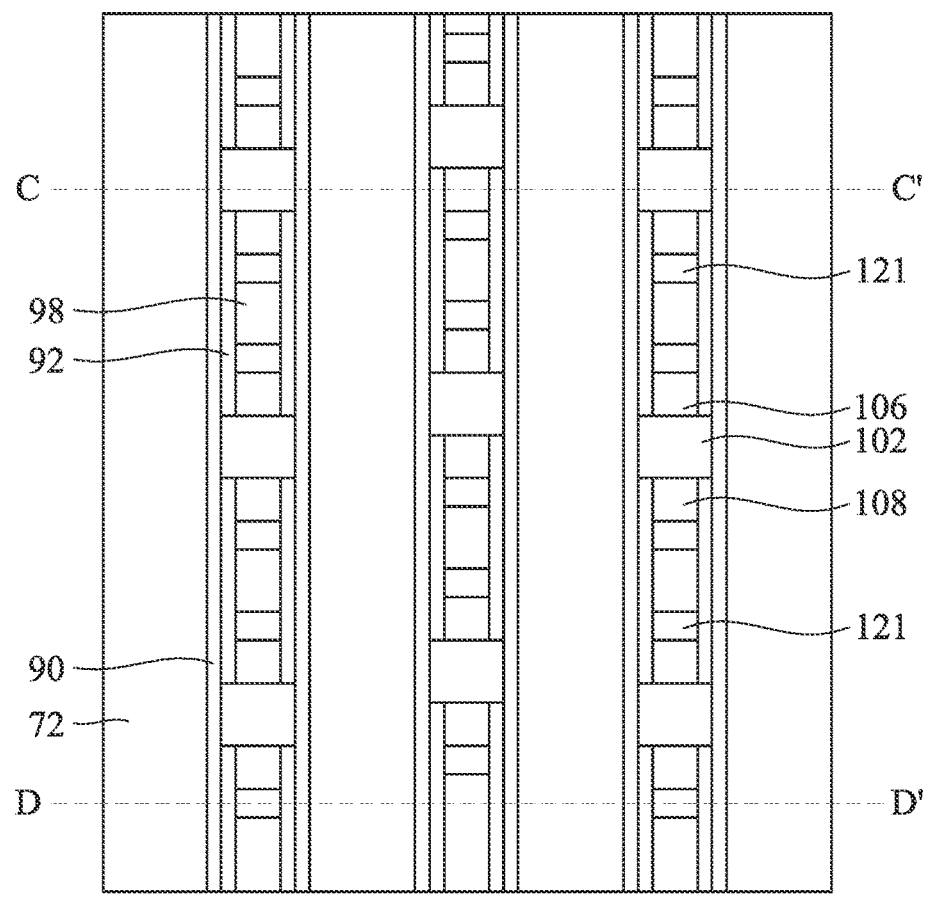
Figure 29C:
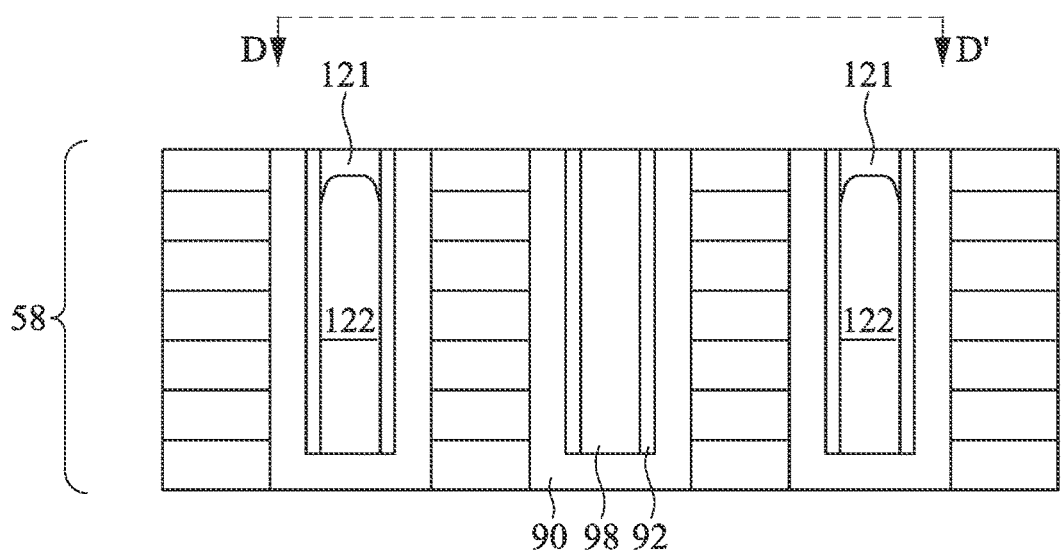

In FIGS. 29A, 29B, and 29C, a planarization process is performed to remove excess sealing material 120, in accordance with some embodiments. After performing the planarization process, the remaining portions of the sealing material 120 form the seals 121. In some embodiments, the planarization process may include a CMP process, a grinding process, an etch-back process, combinations thereof, or the like. After performing the planarization process, top surfaces of the seals 121, the multi-layer stack 58, the dielectric material 98, the dielectric material 102, and the conductive lines 106/108 may be substantially level. In some embodiments, after performing the planarization process, the seals 121 have a height H3 that is in the range of about 50 nm to about 100 nm, though other heights are possible.

Figure 30A:
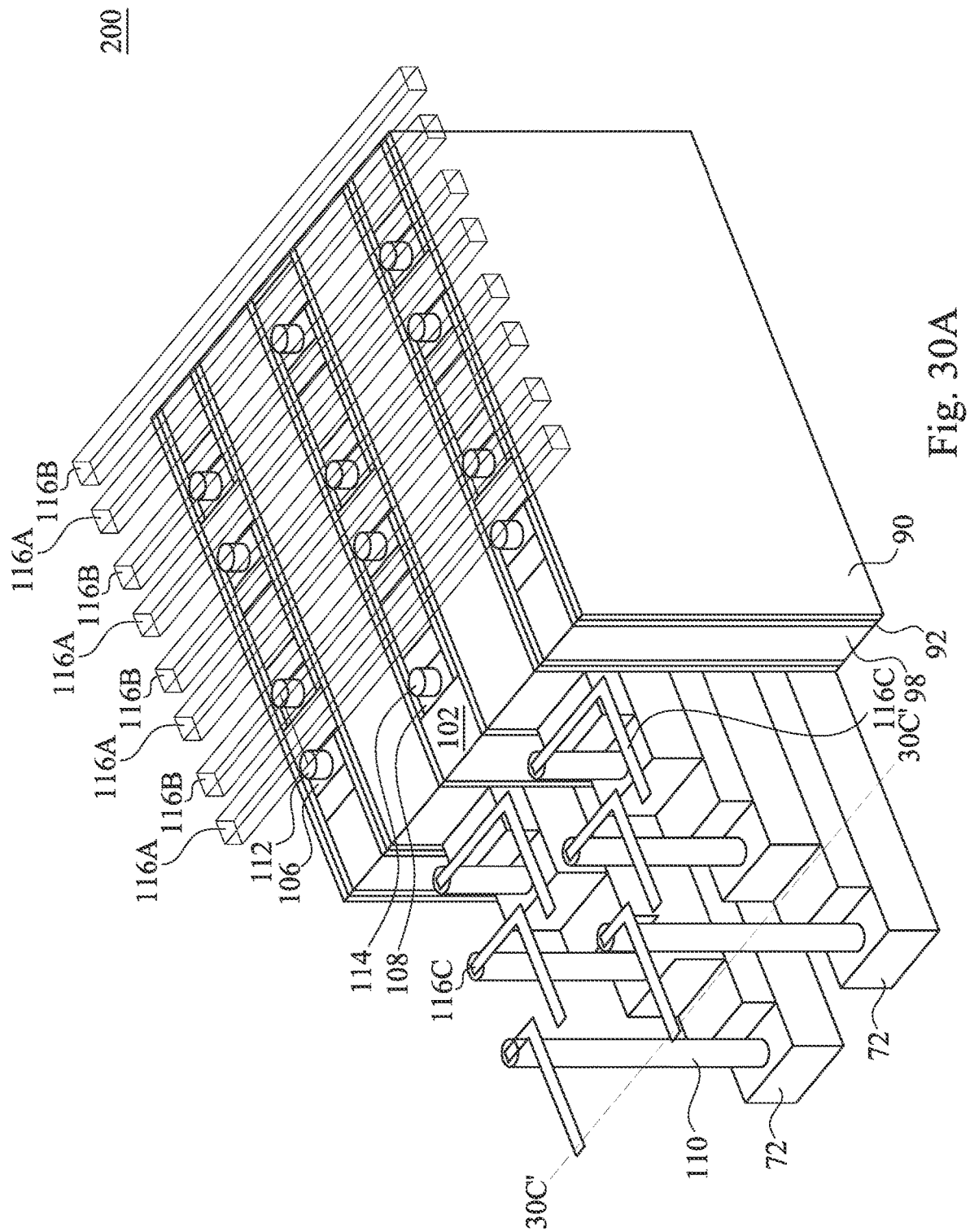
Figure 30B:
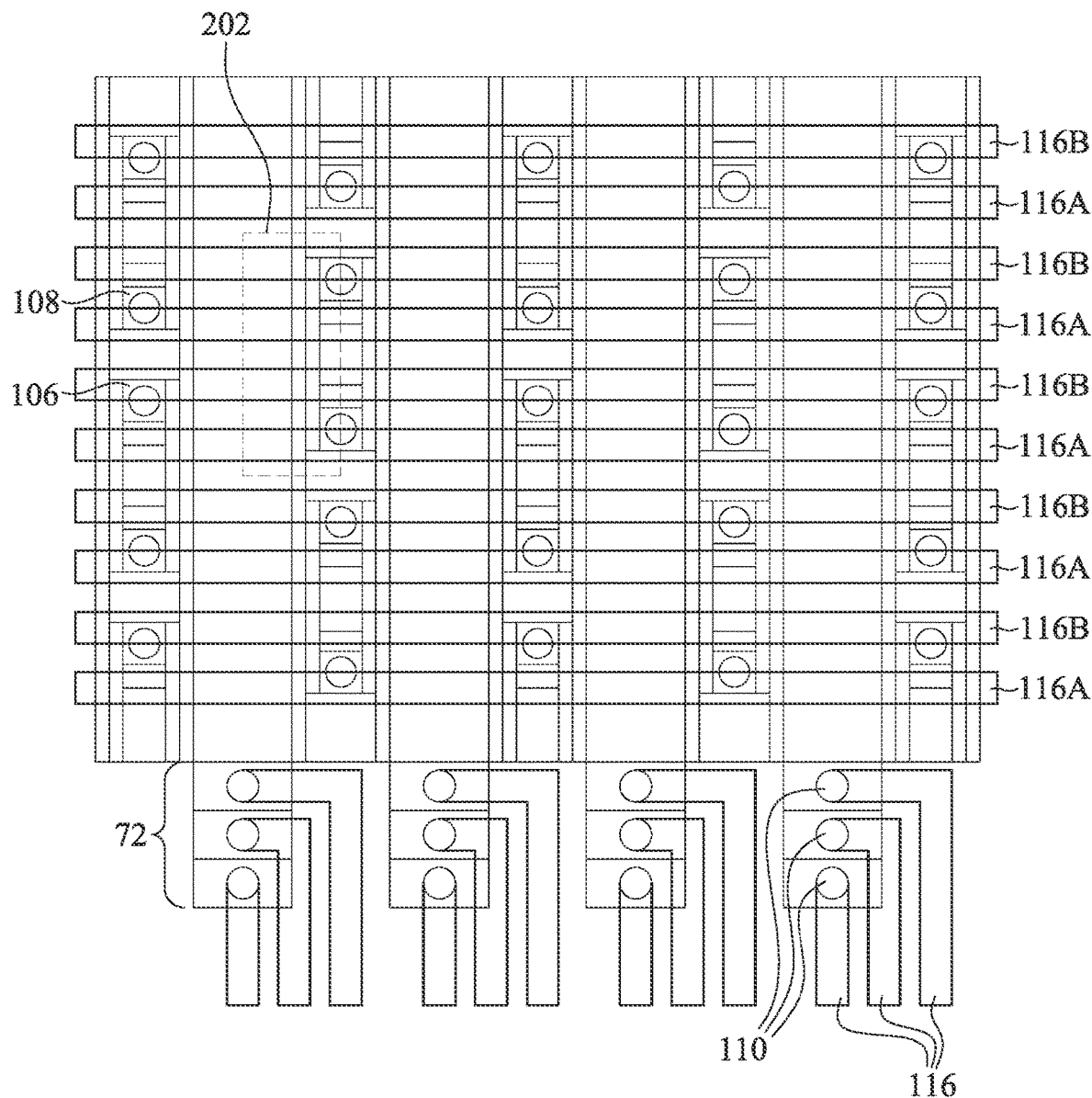
Figure 30C:
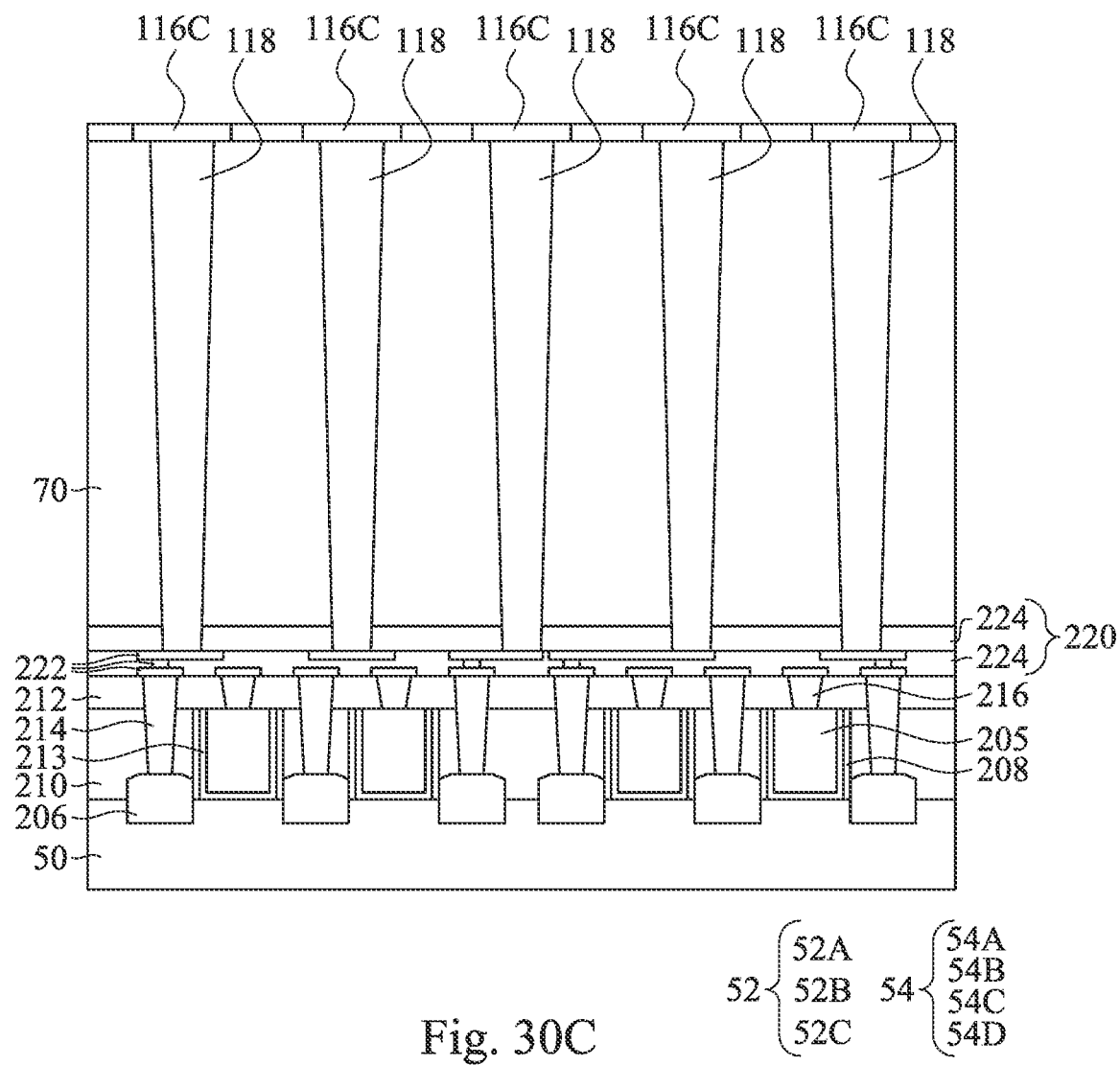
Figure 30D:
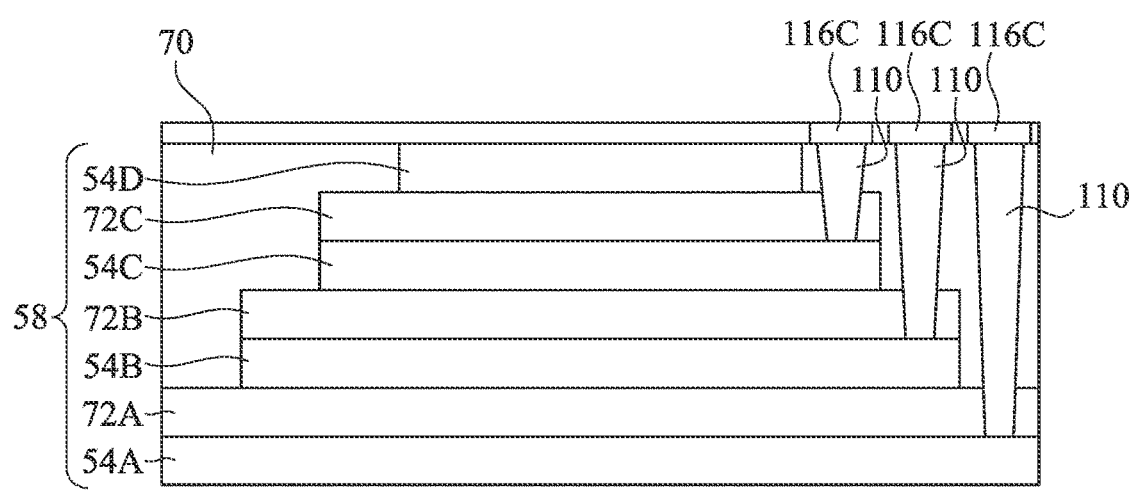

In FIGS. 30A, 30B, 30C, and 30D, contacts no are made to the conductive lines 72, the conductive lines 106, and the conductive lines 108, in accordance with some embodiments. FIG. 30A illustrates a perspective view of the memory array 200; FIG. 30B illustrates a top-down view of the memory array 200; FIG. 30C illustrates a cross-sectional view of the device and underlying substrate alone along the line 30C'-30C' of FIG. 30A; and FIG. 30D illustrates a cross-sectional view of the device along line B-B' of FIG. 1A. In some embodiments, the staircase shape of the conductive lines 72 may provide a surface on each of the conductive lines 72 for the conductive contacts no to land on. Forming the contacts no may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of the IMD 70. The remaining liner and conductive material form the contacts no in the openings.

As illustrated by the perspective view of FIG. 30A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 30C. Other conductive vias may be formed through the IMD 70 to electrically connect the conductive lines 116A and 116B to the underlying circuitry of the interconnect structure 220. In alternate embodiments, routing and/or power lines to and from the memory array 200 may be provided by an interconnect structure formed over the memory array 200 in addition to or in lieu of the interconnect structure 220. In this manner, a memory array 200 may be formed, in accordance with some embodiments.

Although the embodiments of FIGS. 2 through 30D illustrate a particular pattern for the conductive lines 106 and 108, other configurations are also possible. For example, in these embodiments, the conductive lines 106/108 have a staggered pattern. In some embodiments, the conductive lines 106/108 that are in a same row of the array are all aligned with each other.

Figure 31:
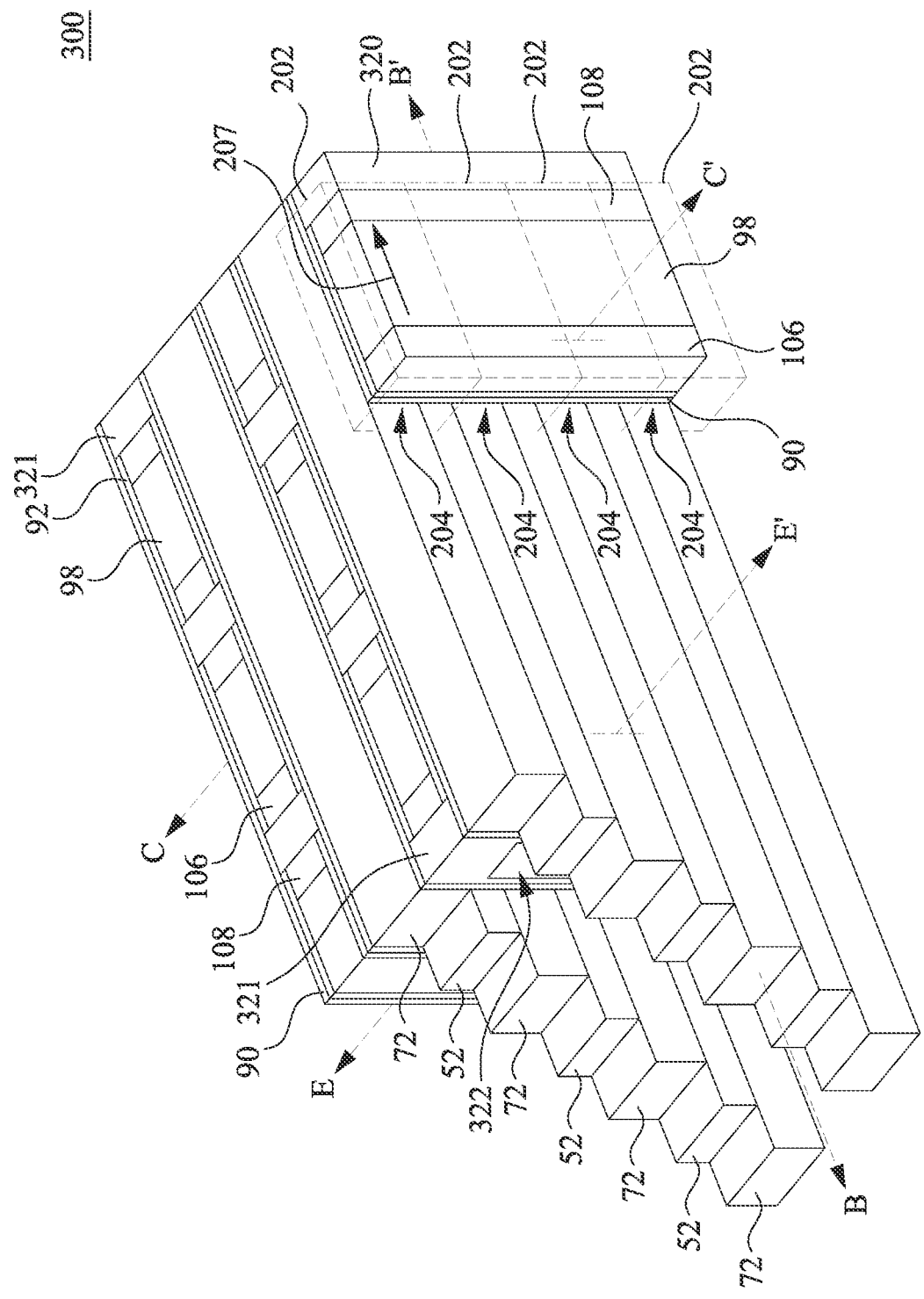
FIGS. 31, 32A, 32B, 32C, 33A, 33B, 33C, 34A, 34B, 34C, 35A, 35B, 35C, 36, 37, 38A, 38B, and 38C, illustrate varying views of intermediate steps in the manufacture of a memory array, in accordance with some embodiments.

FIG. 31 illustrates a perspective view of a memory array 300, in accordance with some embodiments. The memory array 300 is similar to the memory array 200 shown in FIGS. 1A-C, except the memory array 300 includes air gaps 322 formed between each pair of conductive lines 106/108 instead of between each conductive line 106/108 and the dielectric material 98. In this manner, the air gaps 322 isolate the conductive lines 106/108 between adjacent transistors 204. The air gaps 322 are sealed by seals 321 formed of a sealing material 320. In some cases, the presence of the air gaps 322 between the conductive lines 106/108 can reduce capacitance of the memory array 300 and improve performance. The memory array 300 may be similar to the memory array 200 such that like reference numerals indicate like elements formed using like processes.

Figure 32A:
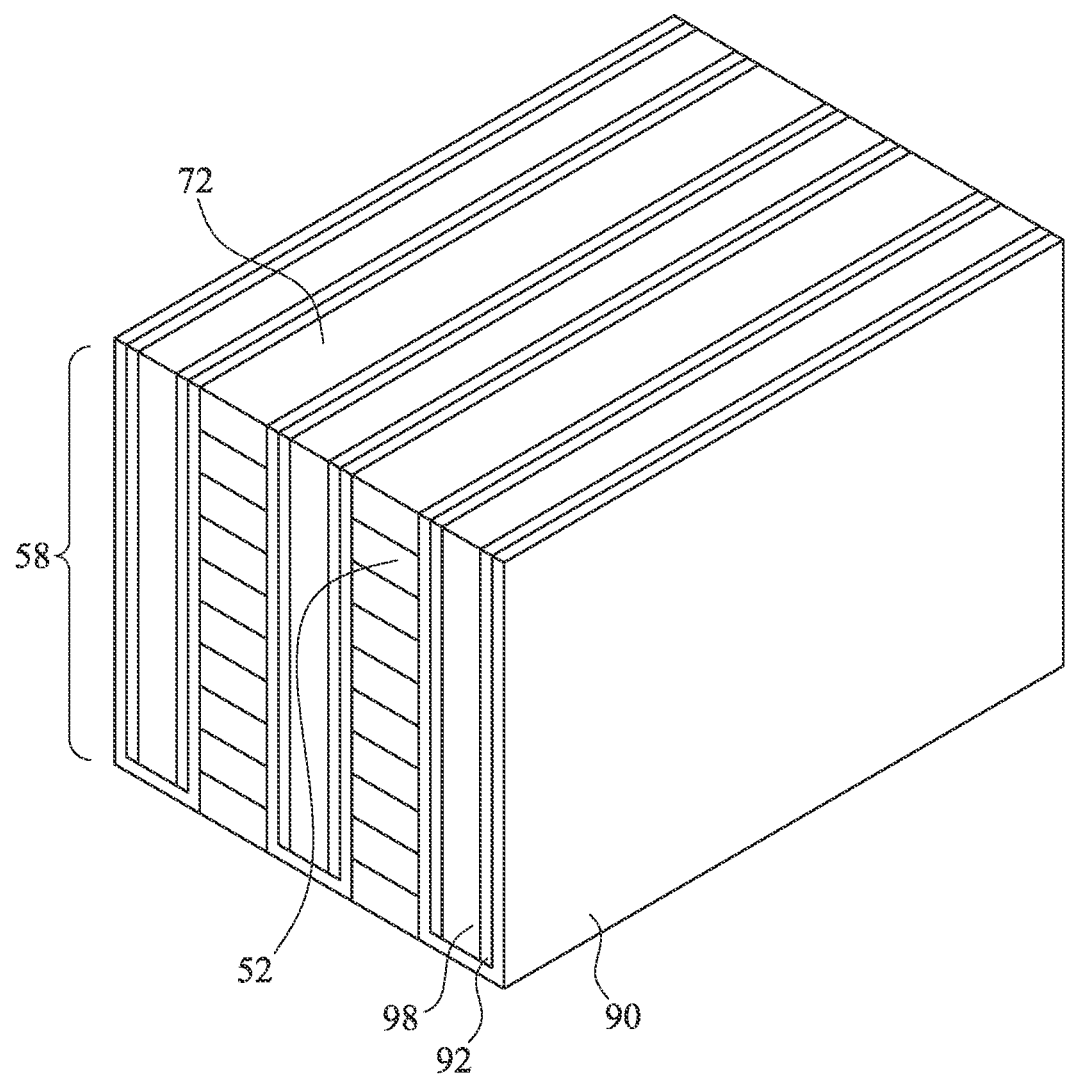
Figure 32B:
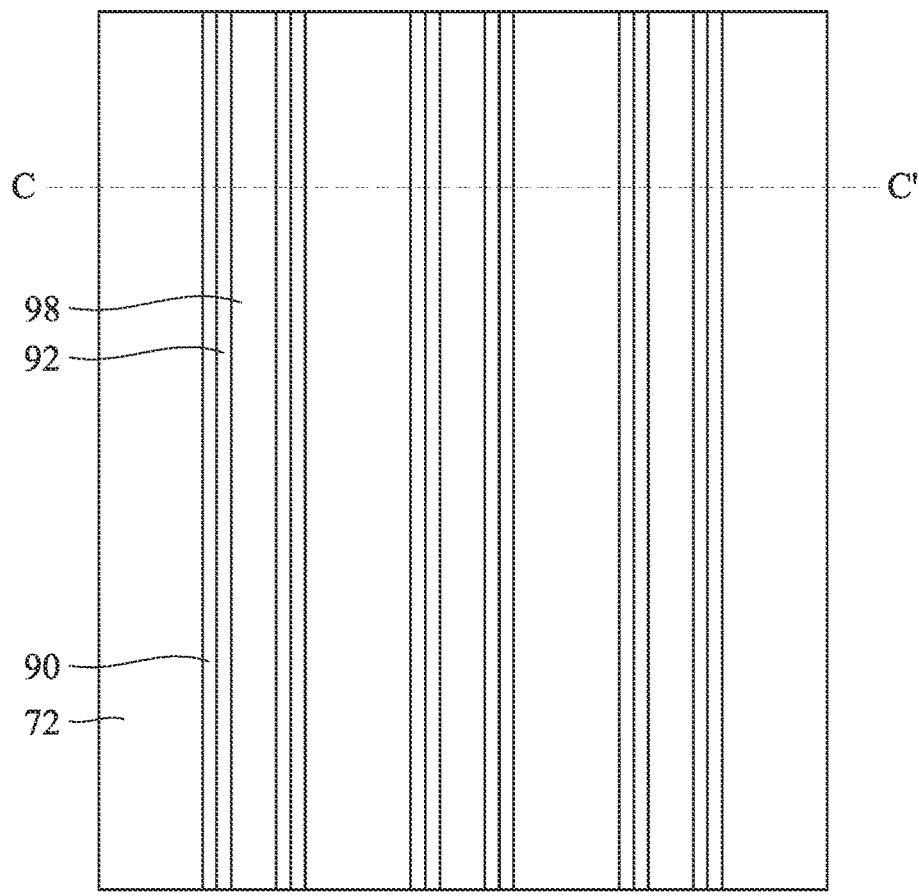
Figure 32C:
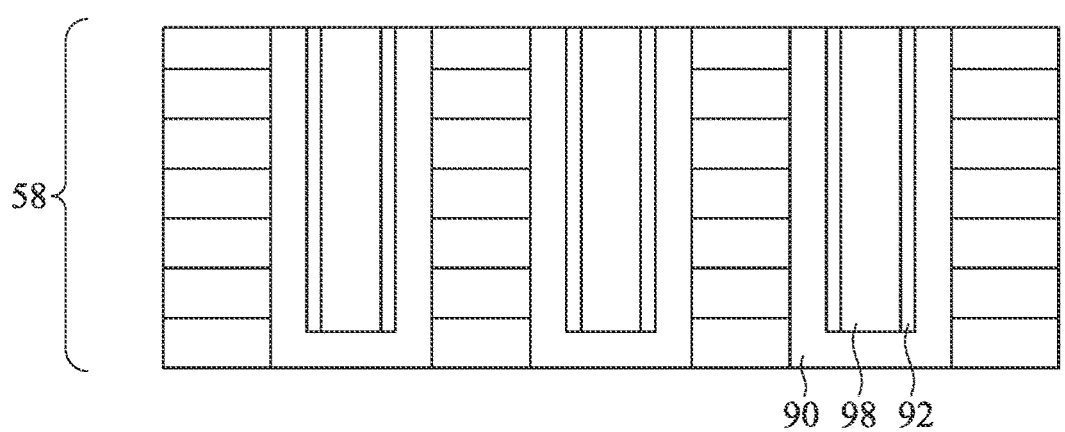

FIGS. 32A through 38C illustrate various views of intermediate steps in the manufacture of a memory array 300 similar to that shown in FIG. 31. FIGS. 32A, 32B, and 32C illustrate a structure similar to that shown in FIGS. 21A, 21B, and 21C. The structure shown in FIG. 32A-C may be formed in a similar manner as the structure formed in FIGS. 21A, 21B, and 21C. For example, trenches may be formed in a multi-layer stack 58, and a memory film 90, an OS layer 92, and a dielectric material 98 may be deposited in the trenches. FIG. 32A illustrates a perspective view, FIG. 32B illustrates a plan view, and FIG. 32C illustrates a cross-sectional view of the device along reference cross-section C-C' of FIG. 32B.

Figure 33A:
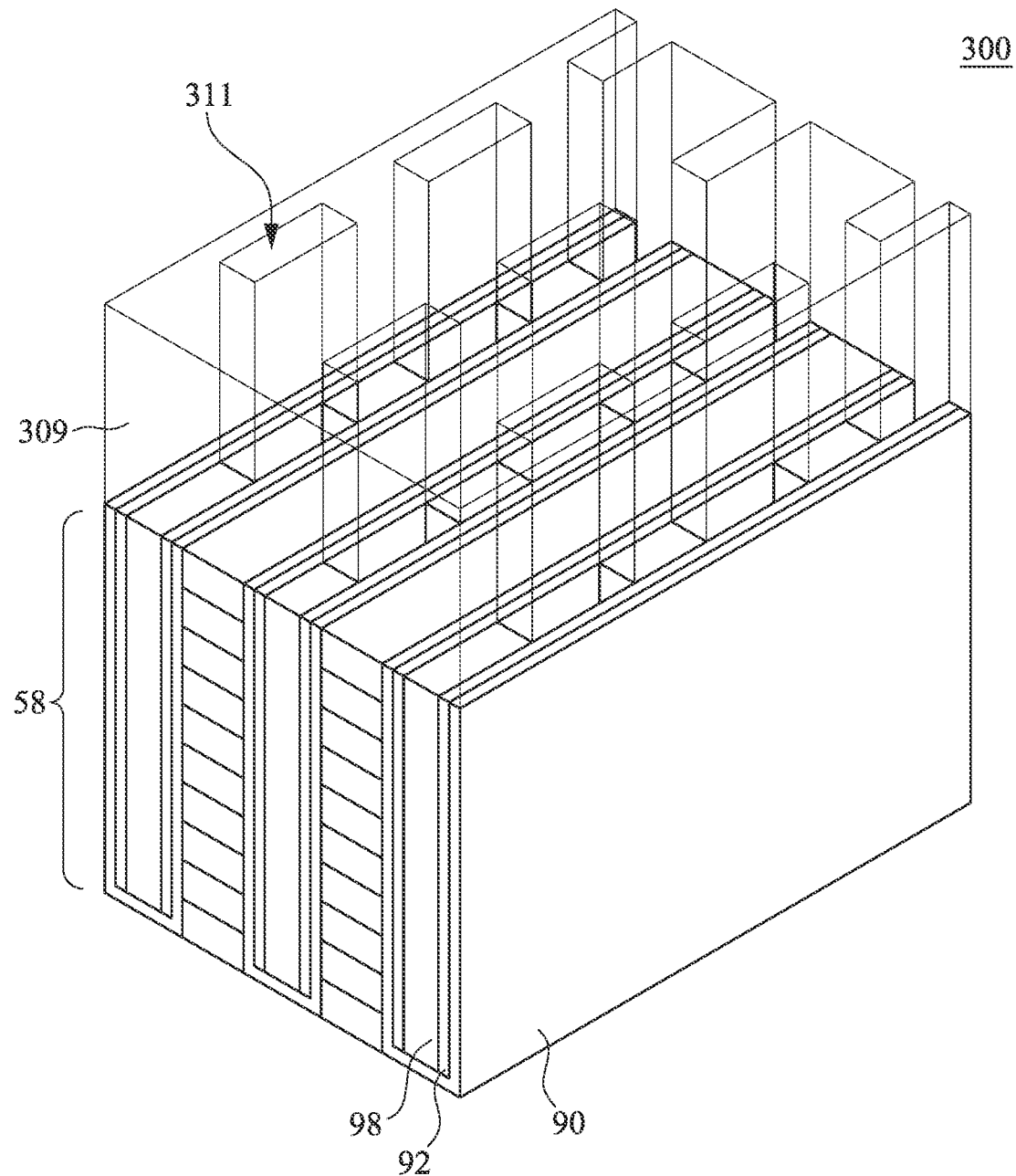
Figure 33B:
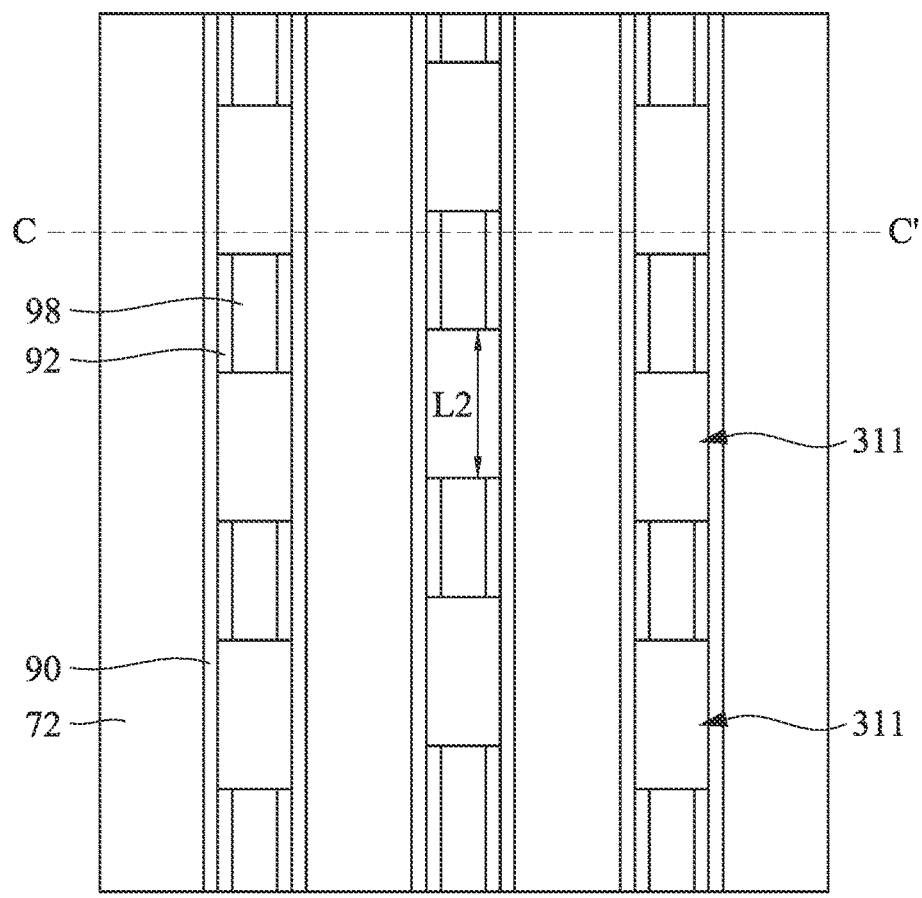
Figure 33C:
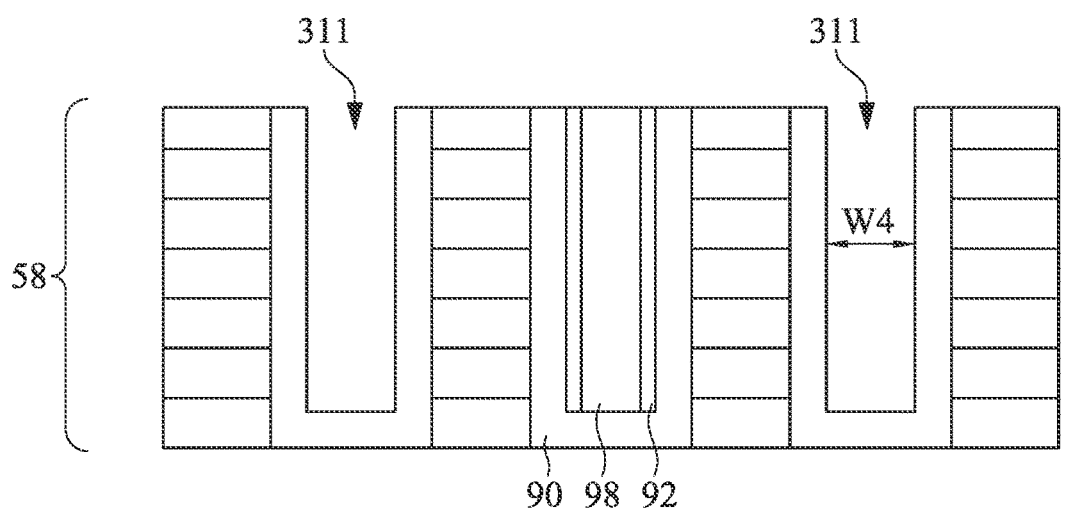

In FIGS. 33A, 33B, and 33C, trenches 311 are patterned through the dielectric material 98. The trenches 311 may be disposed between opposing sidewalls of the memory film 90, and define regions where the conductive lines 106/108 are subsequently formed. Patterning the trenches 311 may be performed through a combination of photolithography and etching, in some embodiments. For example, a photoresist 309 may be deposited over the multi-layer stack 58, the dielectric material 98, the OS layer 92, and the memory film 90. The photoresist 309 can be formed by using a suitable technique such as a spin-on technique, for example. The photoresist 309 is then patterned to define openings 311. Each of the openings 311 exposes a region of the dielectric material 98, and may expose regions of the OS layer 92. The photoresist 309 can be patterned using acceptable photolithography techniques. For example, the photoresist 309 be exposed to light for patterning. After the exposure process, the photoresist 309 may be developed to remove exposed or unexposed portions of the photoresist 309 depending on whether a negative or positive resist is used, thereby defining the pattern of the openings 311.

Portions of the dielectric material 98 exposed by the openings 311 may be removed by etching, forming trenches 311 in the dielectric material 98. The etching may be any acceptable etch process, such as by wet or dry etching, a reactive ion etch (RIE), neutral beam etch (NBE), the like, or a combination thereof. The etching may be anisotropic. In some embodiments, the trenches 311 may have a width W4 that is in the range of about 40 nm to about 70 nm or a length L2 that is in the range of about 80 nm to about 150 nm, though other dimensions are possible. In some embodiments, the trenches 100 are separated by a distance L2 that is in the range of about 30 nm to about 120 nm, though other distances are possible. In some embodiments, the trenches 311 may have a depth that is in the range of about moo nm to about 2000 nm, though other depths are possible. After the trenches 311 are patterned, the photoresist 309 may be removed by ashing, for example.

Figure 34A:
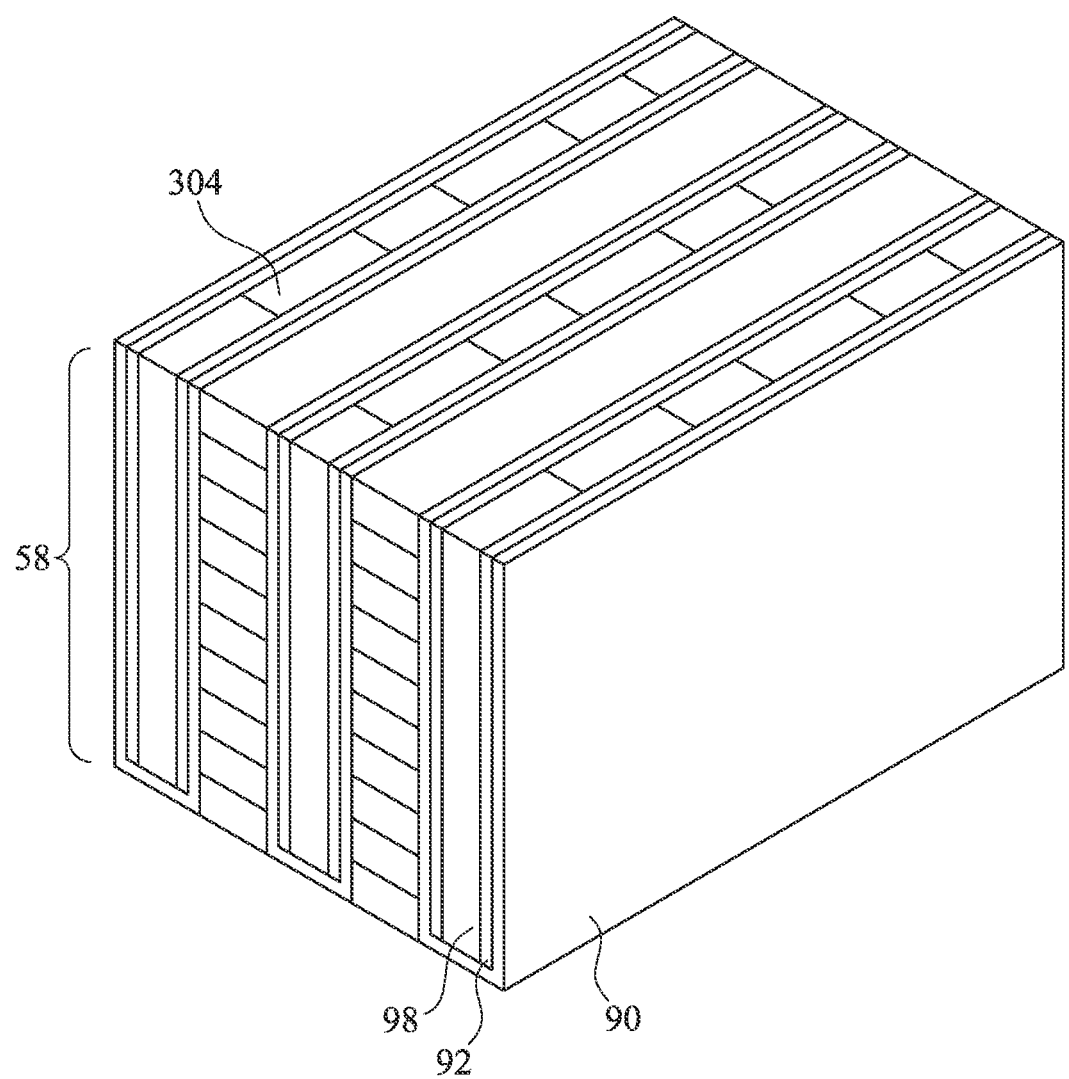
Figure 34B:
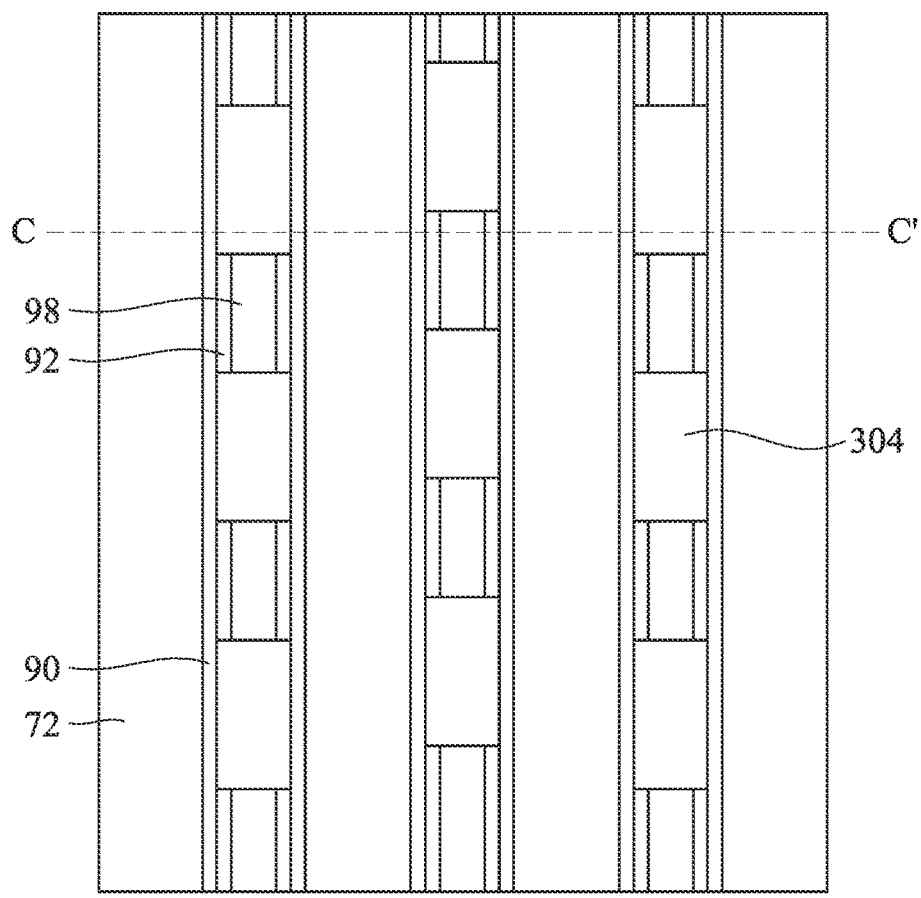
Figure 34C:
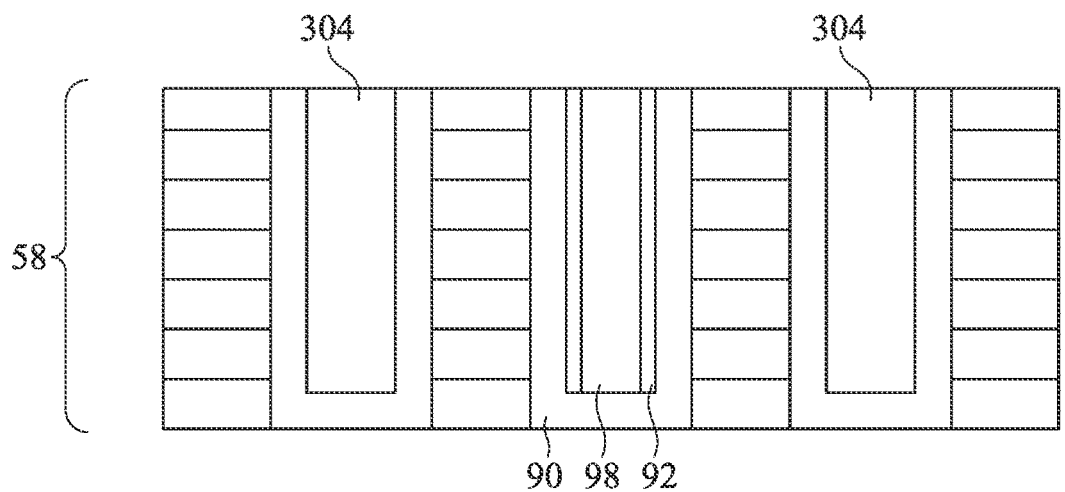

In FIGS. 34A, 34B, and 34C the trenches 311 are filled with a conductive material 304, in accordance with some embodiments. The conductive lines 106/108 are subsequently formed from the conductive material 304 (see FIGS. 35A-35C). The conductive material 304 may be similar to the conductive material used to form the conductive lines 106/108 described for FIGS. 25A-C, and may be formed in a similar manner. For example, the conductive material 304 may comprise one or more materials such as copper, titanium, titanium nitride, tantalum, tantalum nitride, tungsten, ruthenium, aluminum, molybdenum, combinations thereof, or the like, which may be each formed using, for example, CVD, ALD, PVD, PECVD, or the like. After the conductive material 304 is deposited, a planarization process may be performed to remove excess portions of the conductive material 304. In the resulting structure, top surfaces of the multi-layer stack 58, the memory film 90, the OS layer 92, and the conductive material 304 may be substantially level (e.g., coplanar within process variations).

Figure 35A:
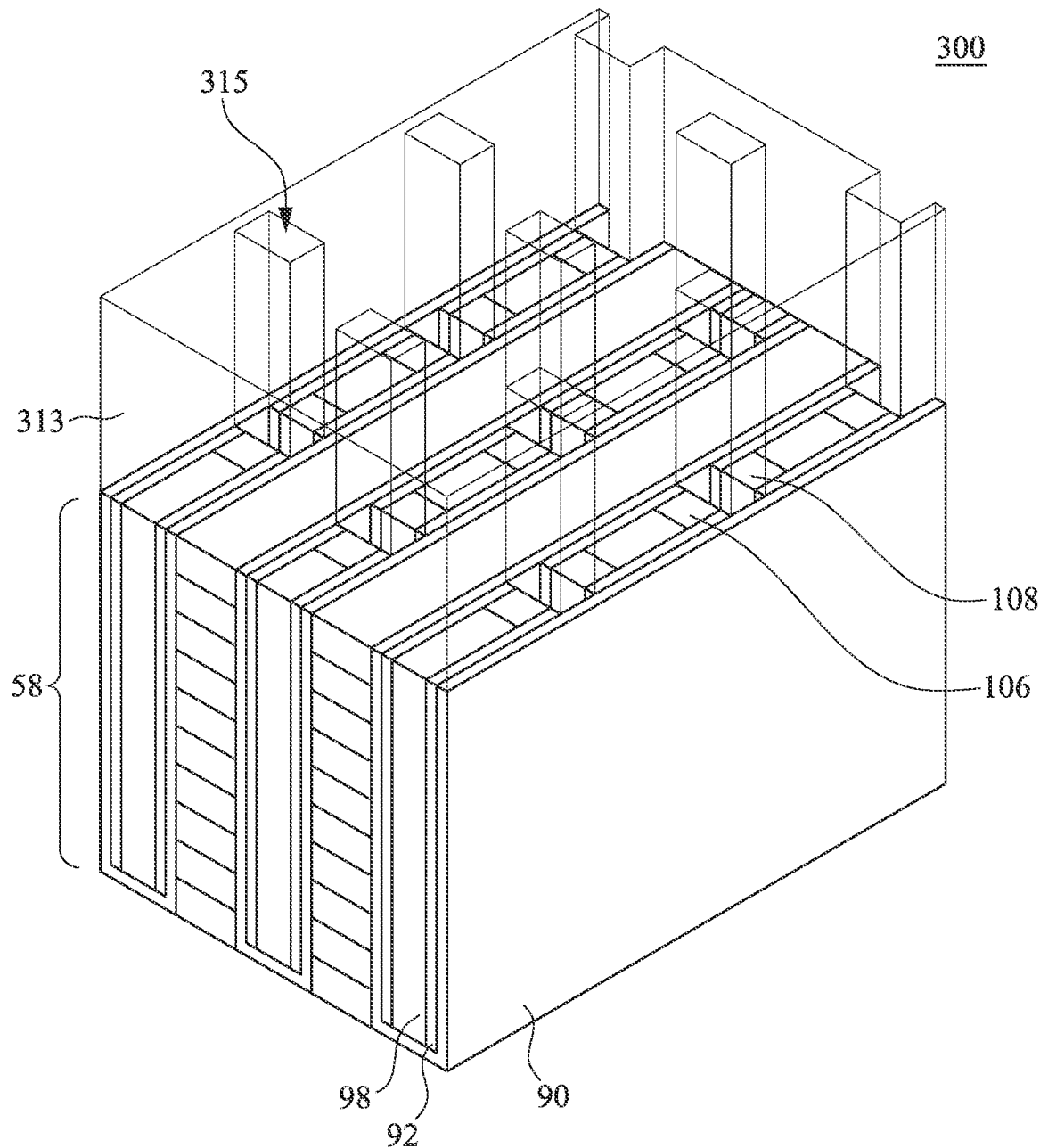
Figure 35B:
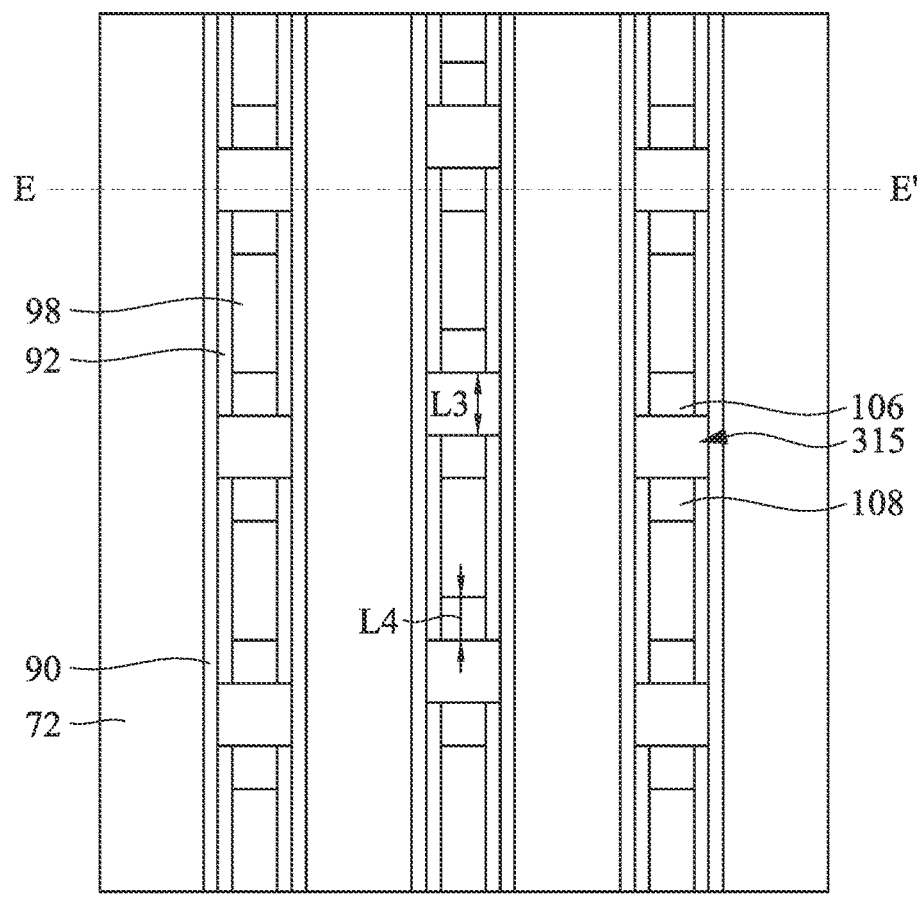
Figure 35C:
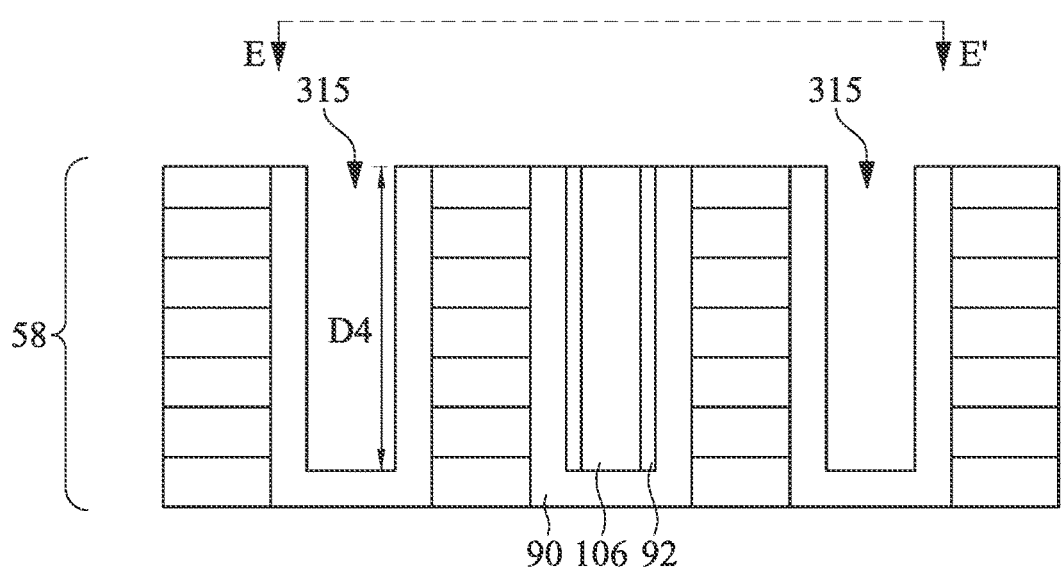

In FIGS. 35A, 35B, and 35C, trenches 315 are patterned in the conductive material 304, forming conductive lines 106 and conductive lines 108, in accordance with some embodiments. FIG. 35C illustrates a cross-sectional view of line E-E' illustrated in FIG. 35B. The trenches 315 are patterned by patterning the conductive material 304 using a combination of photolithography and etching. For example, a photoresist 313 may be deposited over the multi-layer stack 58, the dielectric material 98, the OS layer 92, the memory film 90, and the conductive material 304. The photoresist 313 can be formed by using a spin-on technique, for example. The photoresist 313 is patterned to define openings 315. Each of the openings 315 may overlap corresponding regions of the conductive material 304. The openings 315 do not completely overlap the conductive material 304, and the portions of the conductive material 304 that the openings 315 do not overlap define the portions of the conductive material 304 that form the conductive lines 106/108. The photoresist 313 can be patterned using acceptable photolithography techniques.

Portions of the conductive material 304 exposed by the openings 315 may be removed by etching, forming trenches 315. The etching may be any acceptable etch process, such as by wet or dry etching, a reactive ion etch (RIE), neutral beam etch (NBE), the like, or a combination thereof. The etching may be anisotropic. In this way, each of the trenches 315 may define a pattern of a conductive line 106 of conductive material 304 and an adjacent conductive line 108 of conductive material 304 that are separated by that trench 315. The conductive lines 106 may correspond to bit lines in the memory array 300, and the conductive lines 108 may correspond to source lines in the memory array 300. Although FIG. 35C illustrates a cross-sectional view that only shows the conductive lines 106, a cross-sectional view of the conductive lines 108 may be similar. After the trenches 315 are patterned, the photoresist 313 may be removed by ashing, for example.

In some embodiments, the trenches 315 may have a length L3 that is in the range of about 30 nm to about 100 nm, though other dimensions are possible. After etching the trenches 315, the remaining portions of the conductive material 304 that form the conductive lines 106/108 may have a length L4 that is in the range of about 20 nm to about 50 nm, though other dimensions are possible. In some cases, a conductive line 106 and a conductive line 108 adjacent the same trench 315 may have different lengths (e.g., lengths L4). In some embodiments, the length L4 of the conductive lines 106/108 can be controlled by controlling the length L3 of the trenches 315 (e.g., by controlling the patterning of the trenches 315). In this manner, controlling the size of the trenches 315 can control the size of the conductive lines 106/108. The trenches 315 may have a width similar to the width W4 (see FIG. 33C). The trenches 315 may have a depth D4 that is in the range of about moo nm to about 2000 nm, and which may be similar to the depth D2 described previously for FIG. 26C. Other dimensions are possible.

Figure 36:
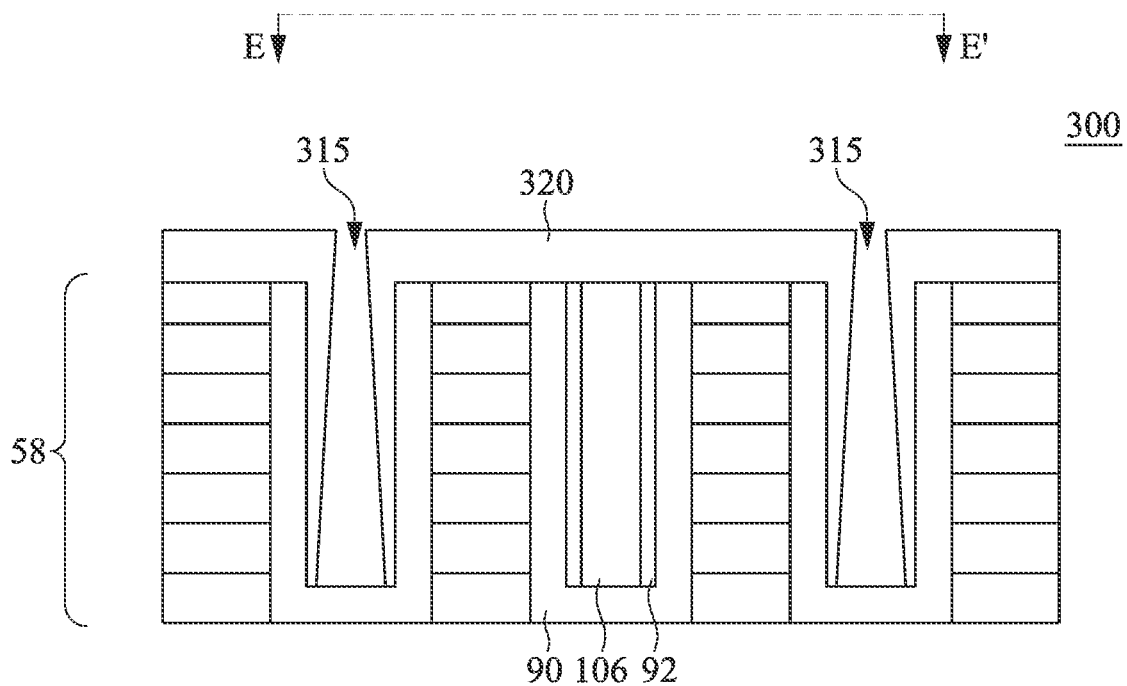

In FIG. 36, a sealing material 320 is deposited over the multi-layer stack 58 and within the trenches 315, in accordance with some embodiments. In some embodiments, the sealing material 320 is similar to the sealing material 120 described previously for FIG. 27. For example, the sealing material 320 may be formed of a dielectric material such as PSG, BSG, BPSG, USG, silicon oxide, or the like. The sealing material 320 may be deposited using any suitable method, such as CVD, PECVD, or the like. In some embodiments, the sealing material 320 is a flowable film formed by a flowable CVD method.

In some embodiments, the sealing material 320 may be formed having a thickness in the range of about 5 nm to about 50 nm. Other thicknesses are possible. In some embodiments, the sealing material 320 may extend partially over the trenches 315, as shown in FIG. 36. In other embodiments, the sealing material 320 may extend completely across the trenches 315. The sealing material 320 may extend partially or fully into the trenches 315 along sidewalls of the trenches 315. Controlling the thickness of the sealing material 320 can control the size of the seals 321 that seal the air gaps 322, described below with regard to FIG. 37.

Figure 37:
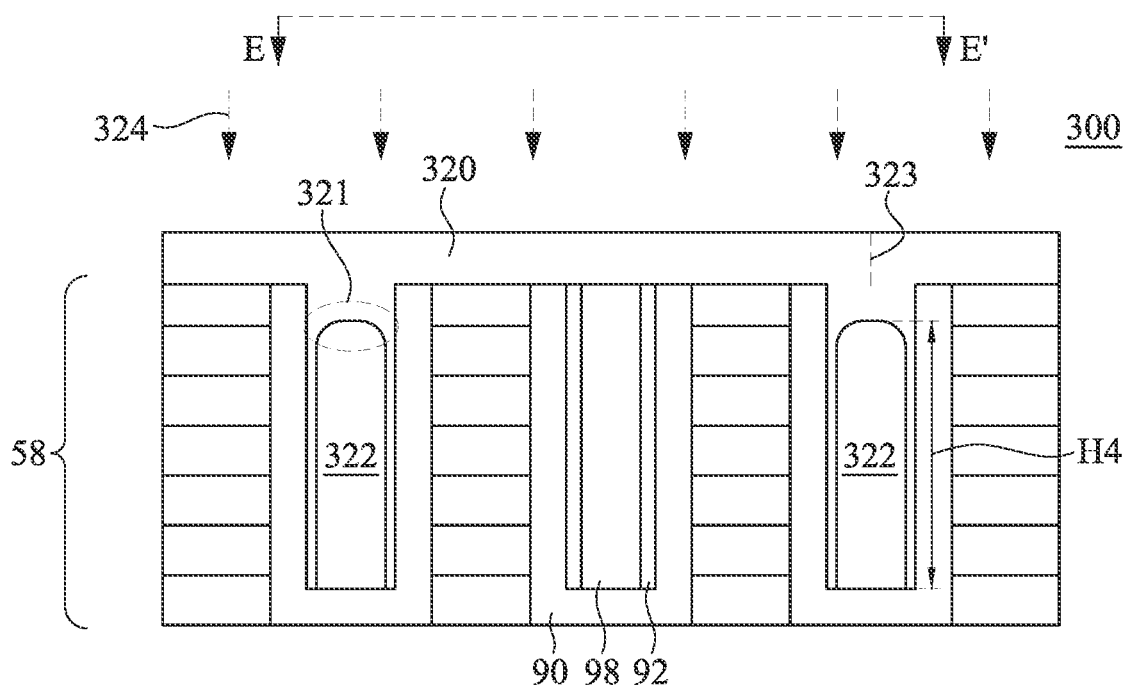

In FIG. 37, an implantation process 324 may be performed to implant the sealing material 320 with dopants to seal the trenches 315 and form the air gaps 322, in accordance with some embodiments. The implantation process 324 may be similar to the implantation process 124 described previously for FIG. 28. In some embodiments, the implantation process implants dopants that cause the sealing material 320 to expand. In some embodiments, the implantation process 324 can be controlled to implant dopants in the sealing material 320 such that the expanded portions of the sealing material 320 extend fully across the width of the trenches 315, sealing the trenches 315 to form the air gaps 322. The expanded portions of the sealing material 320 covering the trenches 315 are referred to herein as seals 321. In some cases, the expanded sealing material 320 may merge over the trenches 315, and in some cases the seals 321 may be formed having a seam 323. By forming seals 321 over the air gaps 322 in this manner, subsequently deposited material may be prevented from entering the air gaps 322. By forming air gaps 322 in this manner, the capacitance between the conductive lines 106 and the conductive lines 108 may be reduced. By reducing capacitance using the air gaps 322, the memory array 300 may have faster response speed and improved performance at higher frequency operation.

In some embodiments, the air gaps 322 may have a height H4 that is in the range of about 1000 nm to about 3000 nm. In some embodiments, the height H4 may be between about 95% and about 99% of the depth D4 of the trenches 315. In some embodiments, the volume of the air gaps 322 may be between about 95% and about 99% of the volume of the trenches 315. In some embodiments, the volume of the air gaps 322 may be between about 80% and about 99% of the volume of a conductive line 106/108. In some cases, forming larger air gaps 322 may provide a greater reduction of the capacitance between the conductive lines 106/108. The bottom surfaces of the seals 321 are shown as concave as shown in FIG. 37, but may be flat, convex, irregular, or have another shape than these examples.

Figure 38A:
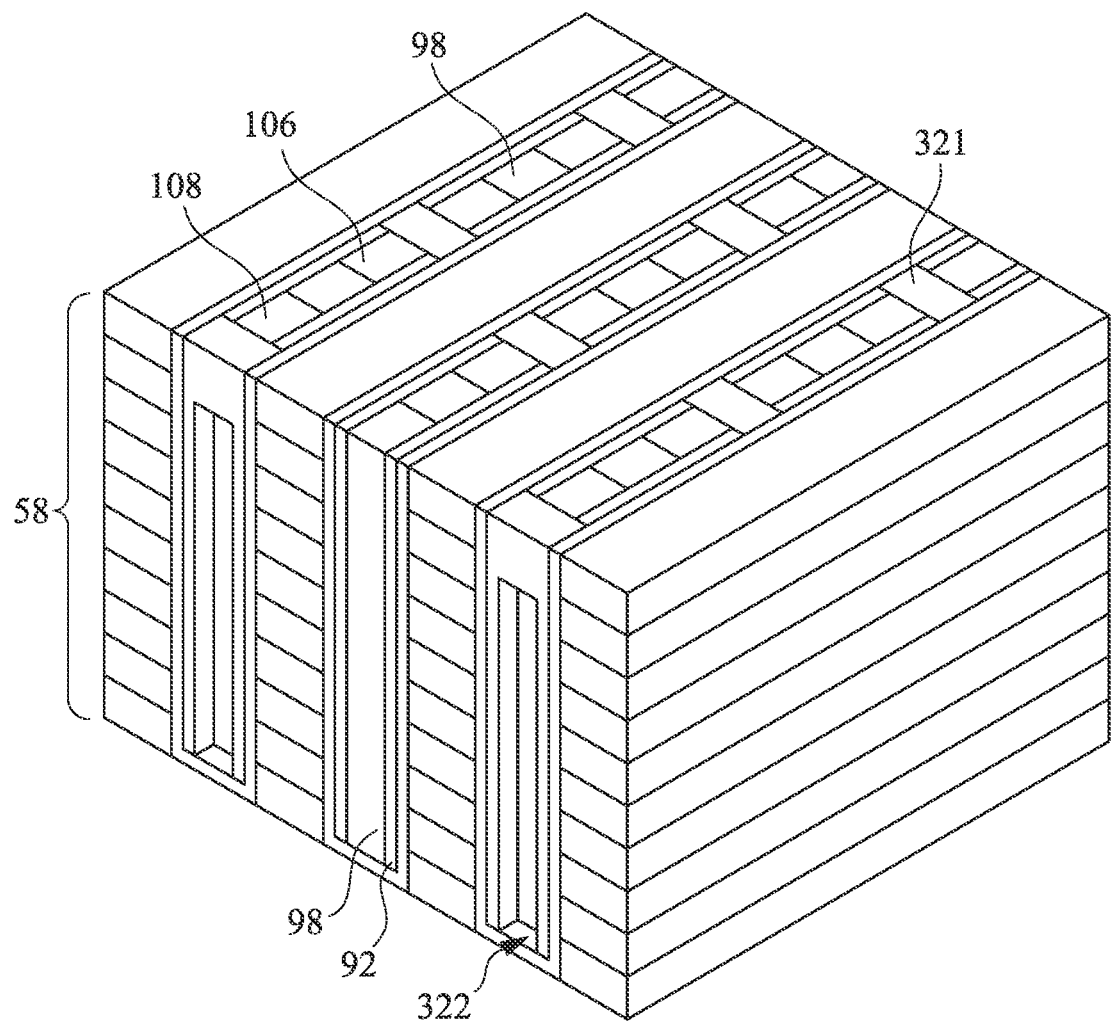
Figure 38B:
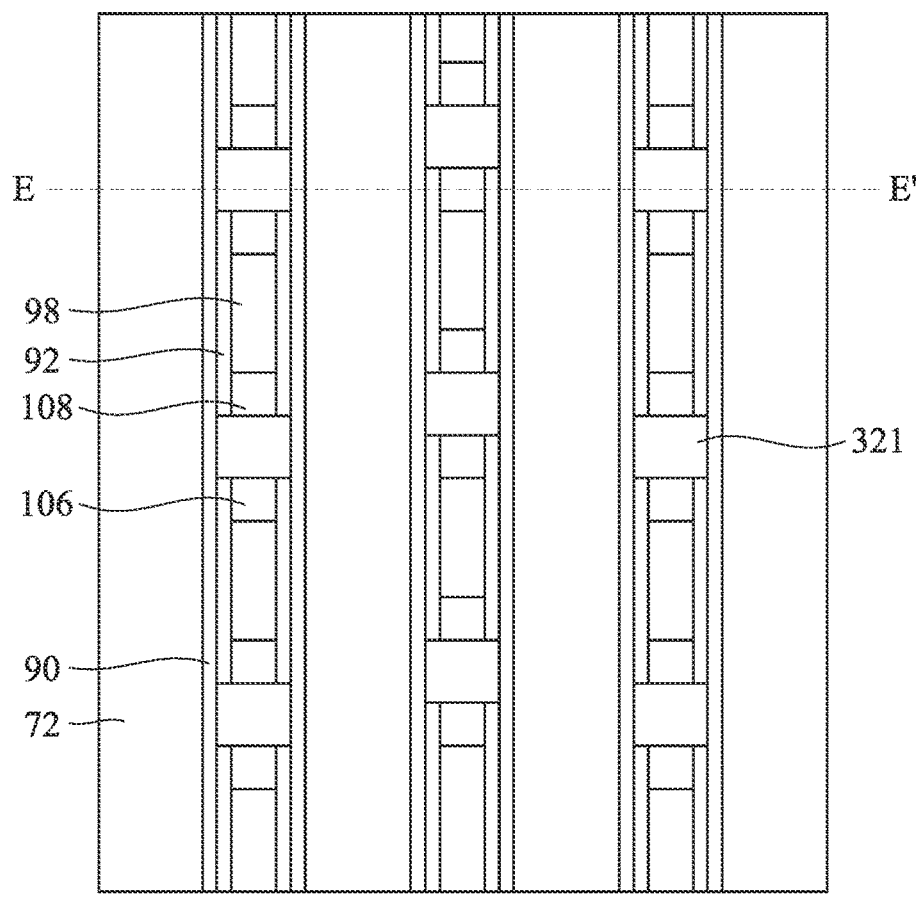
Figure 38C:
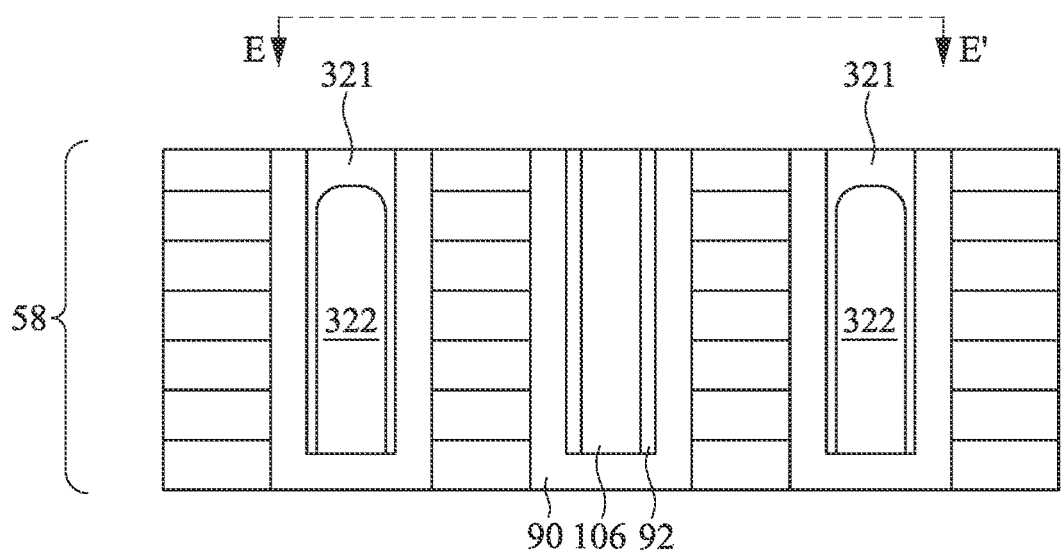

In FIGS. 38A, 38B, and 38C, a planarization process is performed to remove excess sealing material 320, in accordance with some embodiments. After performing the planarization process, the remaining portions of the sealing material 320 form the seals 321. In some embodiments, the planarization process may include a CMP process, a grinding process, an etch-back process, combinations thereof, or the like. After performing the planarization process, top surfaces of the seals 321, the multi-layer stack 58, the dielectric material 98, and the conductive lines 106/108 may be substantially level. In some embodiments, after performing the planarization process, the seals 321 have a height H5 that is in the range of about 50 nm to about 100 nm, though other heights are possible.

Subsequent to forming the seals 321, further processing may be performed to form the memory array 300. The further processing may be similar to that described previously for the memory array 200 in FIGS. 30A, 30B, 30C, and 30D. For example, contacts 110, 112, and 114 may be formed, conductive lines 116 may be formed and/or conductive vias 118 may be formed.

Various embodiments provide a 3D memory array with vertically stacked memory cells. The memory cells each comprise a transistor with a memory film, gate dielectric material and an oxide semiconductor channel region. The transistor comprises source/drain electrodes, which are also source lines and bit lines in the memory array. The transistor further comprises gate electrodes, which are also word lines in the memory array. An air gap is disposed between and isolates adjacent ones of the source/drain electrodes. The air gaps may be formed between source/drain electrodes of the same transistor or source/drain electrodes of adjacent transistors. Because air has a lower dielectric constant than many other dielectric materials (e.g., oxides, nitrides, or the like), separating the source/drain electrodes with air gaps instead of a dielectric material can reduce parasitic capacitance between the source/drain electrodes. By reducing parasitic capacitance in this manner, the speed (e.g., response speed, switching speed, etc.) of the device may be improved and parasitic noise may be reduced. This can improve the operation of the device, particularly when operated at relatively high frequencies.

In accordance with an embodiment, a device includes a semiconductor substrate; a word line extending over the semiconductor substrate; a memory film extending along the word line, wherein the memory film contacts the word line; a channel layer extending along the memory film, wherein the memory film is between the channel layer and the word line; source lines extending along the memory film, wherein the memory film is between the source lines and the word line; bit lines extending along the memory film, wherein the memory film is between the bit lines and the word line; and isolation regions, wherein each isolation region is between a source line and a bit line, wherein each of the isolation regions includes an air gap and a seal extending over the air gap. In an embodiment, the device includes transistors, wherein each transistor includes one source line and one bit line, wherein each isolation region is between the source line and the bit line of each respective transistor. In an embodiment, each transistor includes a first dielectric material extending along the channel layer, wherein the first dielectric material is between the source line and the bit line of each respective transistor, wherein each transistor includes a first isolation region extending between the source line and the first dielectric material of the transistor and a second isolation region extending between the bit line and the first dielectric material of the transistor. In an embodiment, the device includes transistors, wherein each transistor includes a source line and a bit line, wherein each isolation region of the isolation regions is between a source line of one transistor and a bit line of an adjacent transistor. In an embodiment, the seal includes an oxide. In an embodiment, the air gap exposes sidewalls of the channel layer and sidewalls of either a source line or a bit line. In an embodiment, a volume of the air gap is between 80% and 99% of a volume of either a source line or a bit line. In an embodiment, each isolation region includes a second dielectric material extending between the air gap and the memory film, wherein the seal includes the second dielectric material.

In accordance with an embodiment, a device includes a semiconductor substrate; a first memory cell over the semiconductor substrate, the first memory cell including a first transistor, wherein the first transistor includes a gate electrode including a portion of a first word line; a first portion of a ferroelectric material, wherein the first portion of the ferroelectric material is on a sidewall of the first word line; and a first channel region on a sidewall of the first portion of the ferroelectric material; a source line, wherein a first portion of the source line provides a first source/drain electrode for the first transistor; a bit line, wherein a first portion of the bit line provides a second source/drain electrode for the first transistor; a first dielectric material separating the source line and the bit line; a first air gap separating the source line and the first dielectric material; a second air gap separating the bit line and the first dielectric material; and a second memory cell over the first memory cell. In an embodiment, the first air gap extends through the first memory cell and the second memory cell. In an embodiment, the device includes a first seal extending between the source line and the first dielectric material and a second seal extending between the bit line and the first dielectric material, wherein the first seal seals the first air gap and wherein the second seal seals the second air gap. In an embodiment, top surfaces of the first seal, the second seal, and the first dielectric material are level. In an embodiment, the first seal and the second seal include silicon oxide implanted with germanium. In an embodiment, the first seal and the second seal physically contact the first channel region. In an embodiment, the first seal and the second seal each have a seam. In an embodiment, the device includes a first isolation region over a sidewall of the source line and a second isolation region over a sidewall of the bit line.

In accordance with an embodiment, a method includes patterning a first trench extending through a first conductive line; depositing a memory film along sidewalls and a bottom surface of the first trench; depositing an oxide semiconductor (OS) layer over the memory film, wherein the OS layer extends along the sidewalls and the bottom surface of the first trench; depositing a first dielectric material on the OS layer, wherein the first dielectric material fills the remaining portion of the first trench; patterning a second trench in the first dielectric material; depositing a conductive material in the second trench, wherein the conductive material fills the second trench; patterning a third trench in the conductive material; depositing a second dielectric material in the third trench; and implanting the second dielectric material with a dopant, wherein after implanting the second dielectric material, implanted portions of the second dielectric material extend over the third trench and form an air gap within the third trench. In an embodiment, depositing the second dielectric material includes depositing silicon oxide using PECVD. In an embodiment, the dopant includes germanium. In an embodiment, the second dielectric material covers the sidewall surface of the memory film within the third trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
a word line extending over the semiconductor substrate;
a memory film extending along the word line, wherein the memory film contacts the word line;
a channel layer extending along the memory film, wherein the memory film is between the channel layer and the word line;
a plurality of source lines extending along the memory film, wherein the memory film is between the plurality of source lines and the word line;
a plurality of bit lines extending along the memory film, wherein the memory film is between the plurality of bit lines and the word line; and
a plurality of isolation regions, wherein each isolation region of the plurality of isolation regions is between a source line of the plurality of source lines and a bit line of the plurality of the bit lines, wherein each of the isolation regions comprises an air gap and a seal extending over the air gap.

2. The device of claim 1, comprising a plurality of transistors, wherein each transistor of the plurality of transistors comprises one source line of the plurality of source lines and one bit line of the plurality of bit lines, wherein each isolation region of the plurality of isolation regions is between the source line and the bit line of each respective transistor of the plurality of transistors.

3. The device of claim 2, wherein each transistor of the plurality of transistors comprises a first dielectric material extending along the channel layer, wherein the first dielectric material is between the source line and the bit line of each respective transistor of the plurality of transistors, wherein each transistor of the plurality of transistors comprises a first isolation region extending between the source line and the first dielectric material of the transistor and a second isolation region extending between the bit line and the first dielectric material of the transistor.

4. The device of claim 1, wherein the seal comprises an oxide.

5. The device of claim 1, wherein the air gap exposes sidewalls of the channel layer and sidewalls of either a source line of the plurality of source lines or a bit line of the plurality of bit lines.

6. The device of claim 1, wherein a volume of the air gap is between 80% and 99% of a volume of either a source line of the plurality of source lines or a bit line of the plurality of bit lines.

7. The device of claim 1 further comprising a second dielectric material physically contacting a sidewall of a bit line of the plurality of bit lines and a sidewall of a source line of the plurality of source lines.

8. The device of claim 7, wherein the second dielectric material physically contacts the channel layer and the memory film.

9. A device comprising:
a semiconductor substrate;
a first memory cell over the semiconductor substrate, the first memory cell comprising a first transistor, wherein the first transistor comprises:
a gate electrode comprising a portion of a first word line;
a first portion of a ferroelectric material, wherein the first portion of the ferroelectric material is on a sidewall of the first word line; and
a first channel region on a sidewall of the first portion of the ferroelectric material;
a source line, wherein a first portion of the source line provides a first source/drain electrode for the first transistor;
a bit line, wherein a first portion of the bit line provides a second source/drain electrode for the first transistor;
a first dielectric material separating the source line and the bit line;
a first air gap separating the source line and the first dielectric material;
a second air gap separating the bit line and the first dielectric material; and
a second memory cell over the first memory cell.

10. The device of claim 9, wherein the first air gap extends through the first memory cell and the second memory cell.

11. The device of claim 9, further comprising a first seal extending between the source line and the first dielectric material and a second seal extending between the bit line and the first dielectric material, wherein the first seal seals the first air gap and wherein the second seal seals the second air gap.

12. The device of claim 11, wherein top surfaces of the first seal, the second seal, and the first dielectric material are level.

13. The device of claim 11, wherein the first seal and the second seal comprise silicon oxide implanted with germanium.

14. The device of claim 11, wherein the first seal and the second seal physically contact the first channel region.

15. The device of claim 11, wherein the first seal and the second seal each have a seam.

16. The device of claim 9 further comprising a first isolation region over a sidewall of the source line and a second isolation region over a sidewall of the bit line.

17. A device comprising:
a memory film along sidewalls of a multi-layer stack;
an oxide semiconductor (OS) layer over the memory film;
a first dielectric material along a sidewall of the OS layer;
a first conductive region on a first side of the first dielectric material and along the sidewall of the OS layer, wherein the first conductive region is separated from the first side of the first dielectric material by a first air gap; and
a second conductive region on a second side of the first dielectric material and along the sidewall of the OS layer, wherein the second conductive region is separated from the second side of the first dielectric material by a second air gap.

18. The device of claim 17 further comprising a second dielectric material extending over the first air gap and extending over the second air gap.

19. The device of claim 17, wherein the first air gap has a length from the first side of the first dielectric material to the first conductive region that is in the range of 5 nm to 50 nm.

20. The device of claim 17 further comprising a third dielectric material along a sidewall of the first conductive region that is opposite the first air gap.

* * * * *